US009727985B2

(12) United States Patent
Ishiga et al.

(10) Patent No.: US 9,727,985 B2
(45) Date of Patent: Aug. 8, 2017

(54) IMAGE PROCESSING APPARATUS, IMAGE-CAPTURING APPARATUS, AND STORAGE MEDIUM HAVING IMAGE PROCESSING PROGRAM STORED THEREON

(71) Applicant: NIKON CORPORATION, Tokyo (JP)

(72) Inventors: Kenichi Ishiga, Yokohama (JP); Kiyoshige Shibazaki, Higashimurayama (JP); Muneki Hamashima, Fukaya (JP); Susumu Mori, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 322 days.

(21) Appl. No.: 14/485,253

(22) Filed: Sep. 12, 2014

(65) Prior Publication Data
US 2014/0375673 A1 Dec. 25, 2014

Related U.S. Application Data

(63) Continuation of application No. PCT/JP2013/001745, filed on Mar. 14, 2013.

(30) Foreign Application Priority Data

Mar. 16, 2012 (JP) .................................. 2012-060732
Aug. 16, 2012 (JP) .................................. 2012-180648

(51) Int. Cl.
G06T 11/00 (2006.01)
H04N 5/369 (2011.01)
(Continued)

(52) U.S. Cl.
CPC .......... *G06T 11/001* (2013.01); *H04N 5/3696* (2013.01); *H04N 9/045* (2013.01); *H04N 13/0217* (2013.01)

(58) Field of Classification Search
CPC .... G06T 11/001; H04N 5/3696; H04N 9/045; H04N 13/0217
See application file for complete search history.

(56) References Cited

U.S. PATENT DOCUMENTS 4,642,678 A 2/1987 Cok
5,541,653 A 7/1996 Peters et al.
(Continued)

FOREIGN PATENT DOCUMENTS

JP A-8-47001 2/1996
JP A-2003-7994 1/2003
(Continued)

OTHER PUBLICATIONS

International Search Report issued in International Application No. PCT/JP2013/001745 mailed on Apr. 23, 2013 (with translation).
(Continued)

*Primary Examiner* — Tapas Mazumder
(74) *Attorney, Agent, or Firm* — Oliff PLC

(57) ABSTRACT

A technique is disclosed to calculate a new pixel value of a particular color of second-viewpoint color image data in such a manner that a difference between the new pixel value of the particular color of the second viewpoint and the pixel value of the particular color of the first-viewpoint color image data maintains correlation with a sum of a difference between the pixel value of a first color component of the second-viewpoint color image data and the pixel value of the first color component of third-viewpoint color image data and a difference between the pixel value of a second color component of the second-viewpoint color image data and the pixel value of the second color component of the third-viewpoint color image data.

26 Claims, 33 Drawing Sheets

(51) Int. Cl.
  *H04N 9/04*   (2006.01)
  *H04N 13/02*  (2006.01)

(56) References Cited

U.S. PATENT DOCUMENTS

| | | |
|---|---|---|
| 7,236,628 B2 | 6/2007 | Chen et al. |
| 7,957,588 B2 | 6/2011 | Ishiga |
| 2009/0140131 A1* | 6/2009 | Utagawa ............ G02B 3/0056 250/226 |
| 2010/0201853 A1 | 8/2010 | Ishiga |
| 2011/0102423 A1* | 5/2011 | Nam ................ H04N 13/0404 345/419 |
| 2011/0234767 A1* | 9/2011 | Tokiwa ............ H04N 13/0217 348/47 |
| 2012/0105584 A1* | 5/2012 | Gallagher ............ H04N 9/045 348/46 |
| 2012/0140100 A1 | 6/2012 | Shibazaki et al. |
| 2012/0193515 A1 | 8/2012 | Agranov et al. |

FOREIGN PATENT DOCUMENTS

| | | |
|---|---|---|
| JP | B2-4239483 | 3/2009 |
| WO | WO 2012/073491 A1 | 6/2012 |

OTHER PUBLICATIONS

International Preliminary Report on Patentability issued in International Application No. PCT/JP2013/001745 dated Sep. 16, 2014.

* cited by examiner

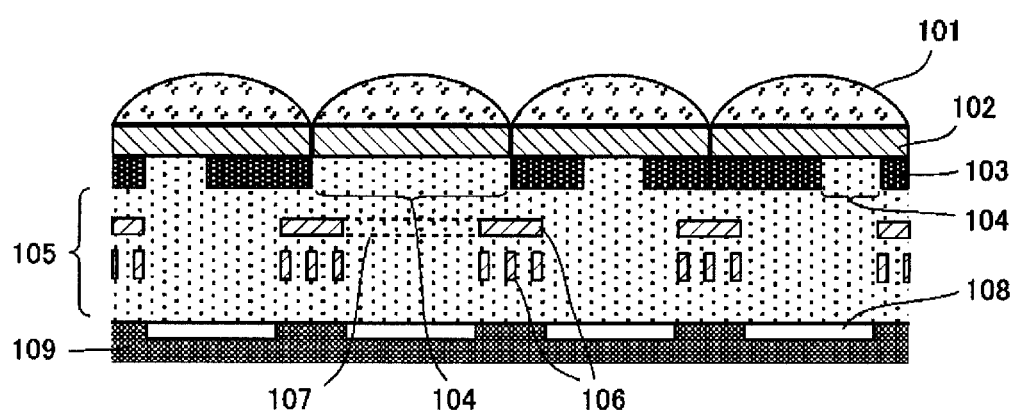
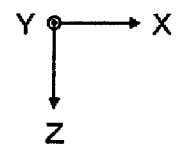
FIG. 2

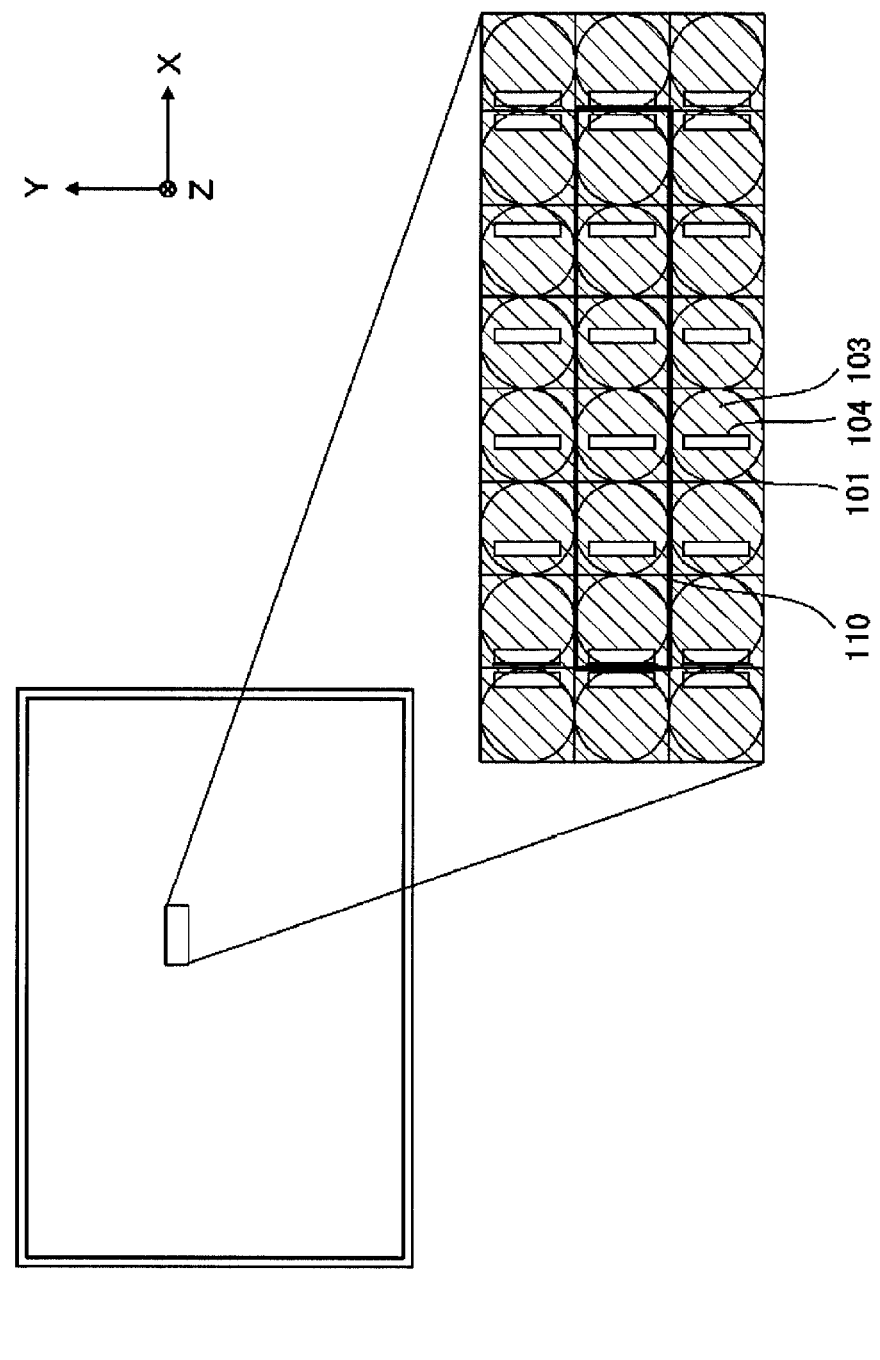

Gb PIXEL IS MARKED PIXEL

R PIXEL IS MARKED PIXEL

B PIXEL IS MARKED PIXEL

Gr PIXEL IS MARKED PIXEL

N:Lt:Rt=14:1:1

$R_N:G_N:B_N=1:2:1$ $R_{Lt}:G_{Lt}:B_{Lt}=1:2:1$ $R_{Rt}:G_{Rt}:B_{Rt}=1:2:1$

IMAGE PROCESSING APPARATUS, IMAGE-CAPTURING APPARATUS, AND STORAGE MEDIUM HAVING IMAGE PROCESSING PROGRAM STORED THEREON

This is a Continuation of Application No. PCT/JP2013/001745 filed Mar. 14, 2013, which claims the benefit of Japanese Application Nos. 2012-060732 and 2012-180648 filed on Mar. 16, 2012 and Aug. 16, 2012, respectively. The disclosure of the prior applications is hereby incorporated by reference herein in its entirety.

BACKGROUND

1. Technical Field

The present invention relates to an image processing apparatus, an image-capturing apparatus, and a storage medium having an image processing program stored thereon.

2. Related Art

A known stereo image-capturing apparatus uses two image-capturing optical systems to capture a stereo image consisting of a left-eye image and a right-eye image. Such a stereo image-capturing apparatus has the two image-capturing optical systems arranged with a predetermined distance provided therebetween so as to generate parallax between the two images obtained by imaging the same subject.

PRIOR ART DOCUMENT

Patent Document 1: Japanese Patent Application Publication No. 8-47001

To obtain the left-eye and right-eye images in color, the output images corresponding to the respective image-capturing optical systems of the stereo image-capturing apparatus need to be captured in color.

SUMMARY

A first aspect of the innovations may include an image processing apparatus including a pixel value extracting unit configured to extract, from color image data having a 1× pixel value corresponding to a first viewpoint for a X component color, the 1× pixel value at a target pixel position, where the X component color is one of a plurality of color components forming a color of a subject image and the first viewpoint is one of a plurality of viewpoints from which the subject image is captured, extract, from color image data having a 2A pixel value corresponding to a second viewpoint and color image data having a 3A pixel value corresponding to a third viewpoint for a A component color, the 2A pixel value and the 3A pixel value at the target pixel position, where the A component color is one of the plurality of color components and the second and third viewpoints are different from the first viewpoint and extract, from color image data having a 2B pixel value corresponding to the second viewpoint and color image data having a 3B pixel value corresponding to the third viewpoint for a B component color, the 2B pixel value and the 3B pixel value at the target pixel position, where the B component color is one of the plurality of color components and different from the A component color, and a calculating unit configured to calculate at least one of a 2X pixel value of the second viewpoint for the X component color and a 3X pixel value of the third viewpoint for the X component color in such a manner that a difference between the 2X pixel value or the 3X pixel value and the 1X pixel value maintains correlation with a value obtained by adding together a difference between the 2A pixel value and the 3A pixel value and a difference between the 2B pixel value and the 3B pixel value.

A second aspect of the innovations may include an image-capturing apparatus including an image sensor configured to capture a subject image, and the above-described image processing apparatus. Here, the pixel value extracting unit extracts the 1X pixel value that is output from the image sensor, from the color image data that has the 1X pixel value corresponding to the first viewpoint, and extracts the 2A pixel value and the 3A pixel value that are output from the image sensor, from the color image data that has the 2A pixel value corresponding to the second viewpoint and the color image data that has the 3A pixel value corresponding to the third viewpoint.

A third aspect of the innovations may include a storage medium having an image processing program stored thereon. The image processing program causes a computer to perform procedures of extracting, from color image data having a 1X pixel value corresponding to a first viewpoint for a X component color, the 1X pixel value at a target pixel position, where the X component color is one of a plurality of color components forming a color of a subject image and the first viewpoint is one of a plurality of viewpoints from which the subject image is captured, extracting, from color image data having a 2A pixel value corresponding to a second viewpoint and color image data having a 3A pixel value corresponding to a third viewpoint for a A component color, the 2A pixel value at the target pixel position and the 3A pixel value at the target pixel position, where the A component color is one of the plurality of color components and the second and third viewpoints are different from the first viewpoint, and extracting, from color image data having a 2B pixel value corresponding to the second viewpoint for a B component color and color image data having a 3B pixel value corresponding to the third viewpoint for the B component color, the 2B pixel value at the target pixel position and the 3B pixel value at the target pixel position, where the B component color is one of the plurality of color components and different from the A component color, and calculating at least one of a 2X pixel value of the second viewpoint for the X component color and a 3X pixel value of the third viewpoint for the X component color in such a manner that a difference between the 2X pixel value or the 3X pixel value and the 1× pixel value maintains correlation with a value obtained by adding together a difference between the 2A pixel value and the 3A pixel value and a difference between the 2B pixel value and the 3B pixel value.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 2 is a cross-sectional view illustrating the structure of an image sensor relating to an embodiment of the present invention.

FIG. 3 schematically illustrates an enlarged portion of the image sensor.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

A digital camera relating to the present embodiment, which is a form of an image processing apparatus and an image-capturing apparatus, is configured to be capable of producing for a single scene a plurality of images from a plurality of viewpoints with a single image-capturing operation. Here, the images from different viewpoints are referred to as parallax images.

First Embodiment

Figure 1:
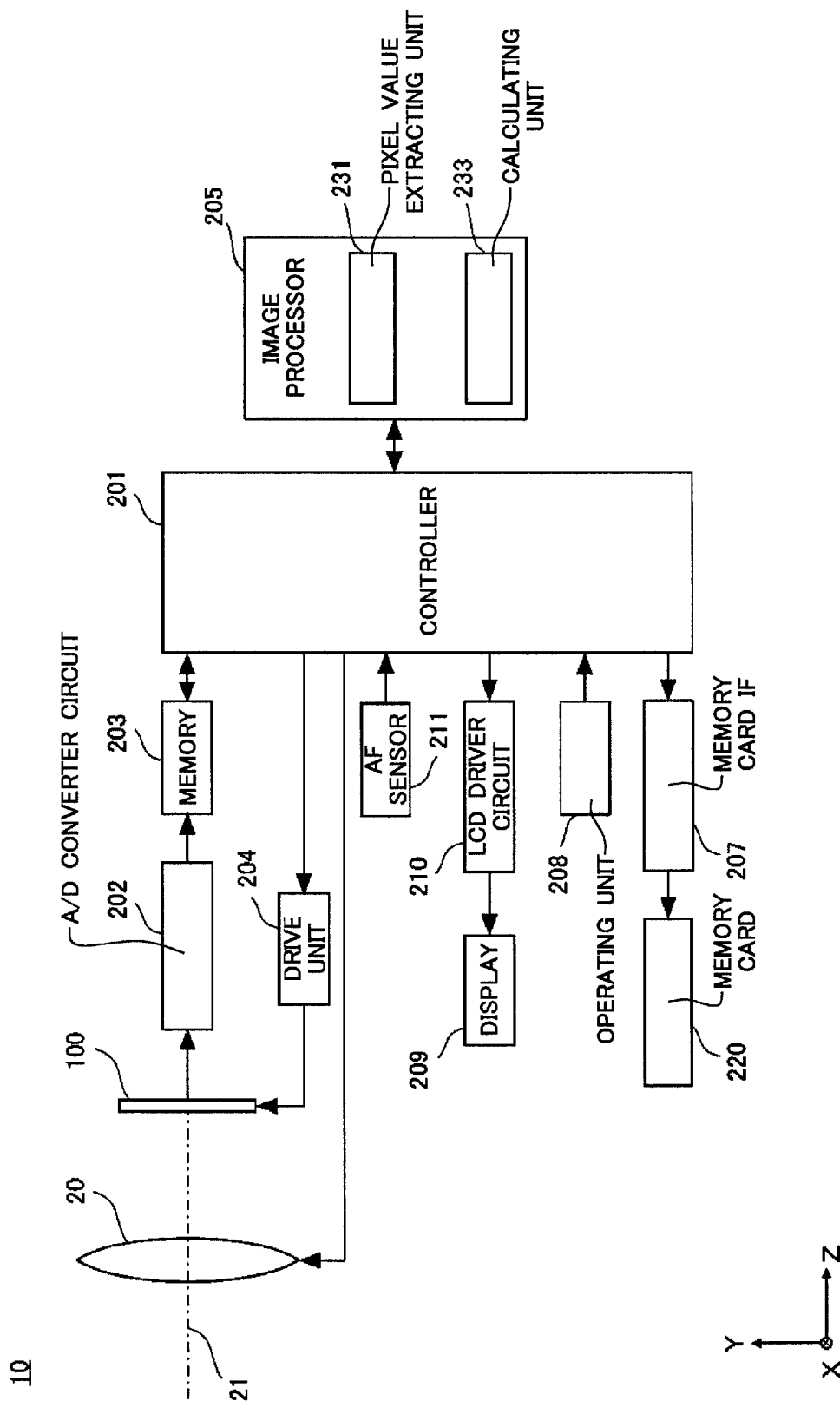
FIG. 1 illustrates the structure of a digital camera relating to an embodiment of the present invention.

FIG. 1 illustrates the structure of a digital camera 10. The digital camera 10 includes an image-capturing lens 20, which is an image-capturing optical system, and guides incoming subject luminous flux along an optical axis 21 to an image sensor 100. The image-capturing lens 20 may be a replaceable lens that is attachable and detachable to/from the digital camera 10. The digital camera 10 includes the image sensor 100, a controller 201, an A/D converter circuit 202, a memory 203, a drive unit 204, an image processor 205, a memory card IF 207, an operating unit 208, a display 209, an LCD driver circuit 210, and an AF sensor 211.

As shown in FIG. 1, a Z-axis positive direction is defined as the direction parallel to the optical axis 21 toward the image sensor 100, an X-axis positive direction is defined as the direction toward the viewer of the sheet of FIG. 1 in the plane orthogonal to the Z axis, and a Y-axis positive direction is defined as the upward direction in the sheet of FIG. 1. In some of the following drawings, their coordinate axes are shown how the respective drawings are arranged relative to the coordinate axes of FIG. 1.

The image-capturing lens 20 is constituted by a group of optical lenses and configured to form an image from the subject luminous flux from a scene in the vicinity of its focal plane. For the convenience of description, the image-capturing lens 20 is hypothetically represented by a single lens positioned in the vicinity of the pupil in FIG. 1. The image sensor 100 is positioned in the vicinity of the focal plane of the image-capturing lens 20. The image sensor 100 is an image sensor having a two-dimensionally arranged photoelectric converter elements, for example, a CCD or CMOS sensor. The timing of the image sensor 100 is controlled by the driver unit 204 so that the image sensor 100 can convert a subject image formed on the light receiving surface into an image signal and outputs the image signal to the A/D converter circuit 202.

The A/D converter circuit 202 converts the image signal output from the image sensor 100 into a digital image signal and outputs the digital image signal to the memory 203. The image processor 205 uses the memory 203 as its workspace to perform a various image processing operations and thus generates image data. To be specific, the image processor 205 includes a pixel value extracting unit 231 that is configured to extract a pixel value from a target pixel position in 2D color image data and low-resolution parallax color image data and a calculating unit 233 that is configured to use the extracted pixel value to calculate a pixel value as high-definition parallax color image data for the target pixel position. The respective image processing operations are described in detail later.

The image processor 205 additionally performs general image processing operations such as adjusting image data in accordance with a selected image format. The produced image data is converted by the LCD drive circuit 210 into a display signal and displayed on the display 209. In addition, the produced image data is stored in the memory card 220 attached to the memory card IF 207.

The AF sensor 211 is a phase detection sensor having a plurality of ranging points set in a subject space and configured to detect a defocus amount of a subject image for each ranging point. A series of image-capturing sequences is initiated when the operating unit 208 receives a user operation and outputs an operating signal to the controller 201. The various operations such as AF and AE associated with the image-capturing sequences are performed under the control of the controller 201. For example, the controller 201 analyzes the detection signal from the AF sensor 211 to perform focus control to move a focus lens that constitutes a part of the image-capturing lens 20.

The following describes the structure of the image sensor 100 in detail. FIG. 2 schematically illustrates the cross-section of the image sensor 100 relating to an embodiment of the present invention.

The image sensor 100 is structured in such a manner that microlenses 101, color filters 102, aperture masks 103, an interconnection layer 105 and photoelectric converter elements 108 are arranged in the stated order when seen from the side facing a subject. The photoelectric converter elements 108 are formed by photodiodes that may convert incoming light into an electrical signal. The photoelectric converter elements 108 are arranged two-dimensionally on the surface of a substrate 109.

The image signals produced by the conversion performed by the photoelectric converter elements 108, control signals to control the photoelectric converter elements 108 and the like are transmitted and received via interconnections 106 provided in the interconnection layer 105. The aperture masks 103 having openings 104, which are provided in a one-to-one correspondence with the photoelectric converter elements 108, are provided in contact with the interconnection layer 105. Each of the openings 104 is shifted in accordance with a corresponding one of the photoelectric converter elements 108 and strictly positioned relative to the corresponding photoelectric converter element 108 as described later. As described later in more details, the aperture masks 103 having the openings 104 effectively cause parallax in the subject luminous flux received by the photoelectric converter elements 108.

On the other hand, no aperture masks 103 are provided on some of the photoelectric converter elements 108 that do not cause parallax. In other words, such photoelectric converter elements 108 are provided with the aperture masks 103 having such openings 104 that do not limit the subject luminous flux incident on the corresponding photoelectric converter elements 108 or allow the entire incident luminous flux to transmit through the aperture masks 103. Although these photoelectric converter elements 108 do not cause parallax, the incoming subject luminous flux is substantially defined by an opening 107 formed by the interconnections 106. Therefore, the interconnections 106 can be viewed as an aperture mask that does not cause parallax and allows the entire incoming luminous flux to pass. The aperture masks 103 may be arranged independently and separately from the photoelectric converter elements 108 and in correspondence with the photoelectric converter elements 108, or may be formed jointly with the photoelectric converter elements 108, like the way how the color filters 102 are manufactured.

The color filters 102 are provided on the aperture masks 103. Each of the color filters 102 is colored so as to transmit a particular wavelength range to a corresponding one of the photoelectric converter elements 108, and the color filters 102 are arranged in a one-to-one correspondence with the photoelectric converter elements 108. To output a color image, at least two different types of color filters that are different from each other need to be arranged. However, three or more different types of color filters may need to be arranged to produce a color image with higher quality. For example, red filters (R filters) to transmit the red wavelength range, green filters (G filters) to transmit the green wavelength range, and blue filters (B filters) to transmit the blue wavelength range may be arranged in a lattice pattern. The way how the filters are specifically arranged will be described later.

The microlenses 101 are provided on the color filters 102. The microlenses 101 are each a light collecting lens to guide more of the incident subject luminous flux to the corresponding photoelectric converter element 108. The microlenses 101 are provided in a one-to-one correspondence with the photoelectric converter elements 108. The optical axis of each microlens 101 is preferably shifted so that more of the subject luminous flux is guided to the corresponding photoelectric converter element 108 taking into consideration the relative positions between the pupil center of the image-capturing lens 20 and the corresponding photoelectric converter element 108. Furthermore, the position of each of the microlenses 101 as well as the position of the opening 104 of the corresponding aperture mask 103 may be adjusted to allow more of the particular subject luminous flux to be incident, which will be described later.

Here, a pixel is defined as a single set constituted by one of the aperture masks 103, one of the color filters 102, and one of the microlenses 101, which are provided in a one-to-one correspondence with the photoelectric converter elements 108 as described above. To be more specific, a pixel with an aperture mask 103 that causes parallax is referred to as a parallax pixel, and a pixel without an aperture mask 103 that causes parallax is referred to as a no-parallax pixel. For example, when the image sensor 100 has an effective pixel region of approximately 24 mm×16 mm, the number of pixels reaches as many as approximately 12 million.

When image sensors have high light collection efficiency and photoelectric conversion efficiency, the microlenses 101 may be omitted. Furthermore, in the case of back side illumination image sensors, the interconnection layer 105 is provided on the opposite side of the photoelectric converter elements 108. In addition, the color filters 102 and the aperture masks 103 can be integrally formed by allowing the openings 104 of the aperture masks 103 to have color components.

In the present embodiment, the aperture masks 103 are separately formed from the interconnections 106, but the function of the aperture masks 103 in the parallax pixels may be alternatively performed by the interconnections 106. In other words, defined opening shapes are formed by the interconnections 106 and limit the incident luminous flux to allow only particular partial luminous flux to pass to reach the photoelectric converter elements 108. In this case, the interconnections 106 forming the opening shapes are preferably positioned closest to the photoelectric converter elements 108 in the interconnection layer 105.

The aperture masks 103 may be formed by a transmission preventing film that is overlaid on the photoelectric converter elements 108. In this case, the aperture masks 103 are formed in such a manner that, for example, a SiN film and a $SiO_2$ film are sequentially stacked to form a transmission preventing film and regions corresponding to the openings 104 are removed by etching.

The following describes the relation between the openings 104 of the aperture masks 103 and parallax caused. FIG. 3 schematically illustrates an enlarged portion of the image sensor 100. To simplify the description, the arrangement of the colors of the color filters 102 is not considered here, which will be mentioned later. In the following description where the arrangement of the colors of the color filters 102 is ignored, the image sensor 100 may be viewed as an image sensor that is constituted only by parallax pixels having the color filters 102 of the same color. Accordingly, the repeating pattern described in the following may be viewed as applied to the adjacent pixels among the color filters 102 of the same color.

As shown in FIG. 3, the openings 104 of the aperture masks 103 are shifted relative to the corresponding pixels.

Furthermore, the openings 104 of the adjacent pixels are positioned differently from each other.

In the example shown in FIG. 3, six different types of aperture masks 103 are provided, in which the openings 104 are shifted in the left and right directions relative to the corresponding pixels. When the image sensor 100 as a whole is considered, photoelectric converter element groups, each of which has six parallax pixels having the aperture masks 103, are two-dimensionally and periodically arranged such that the openings 104 are shifted from left to right on the sheet of FIG. 3.

Figure 4A:
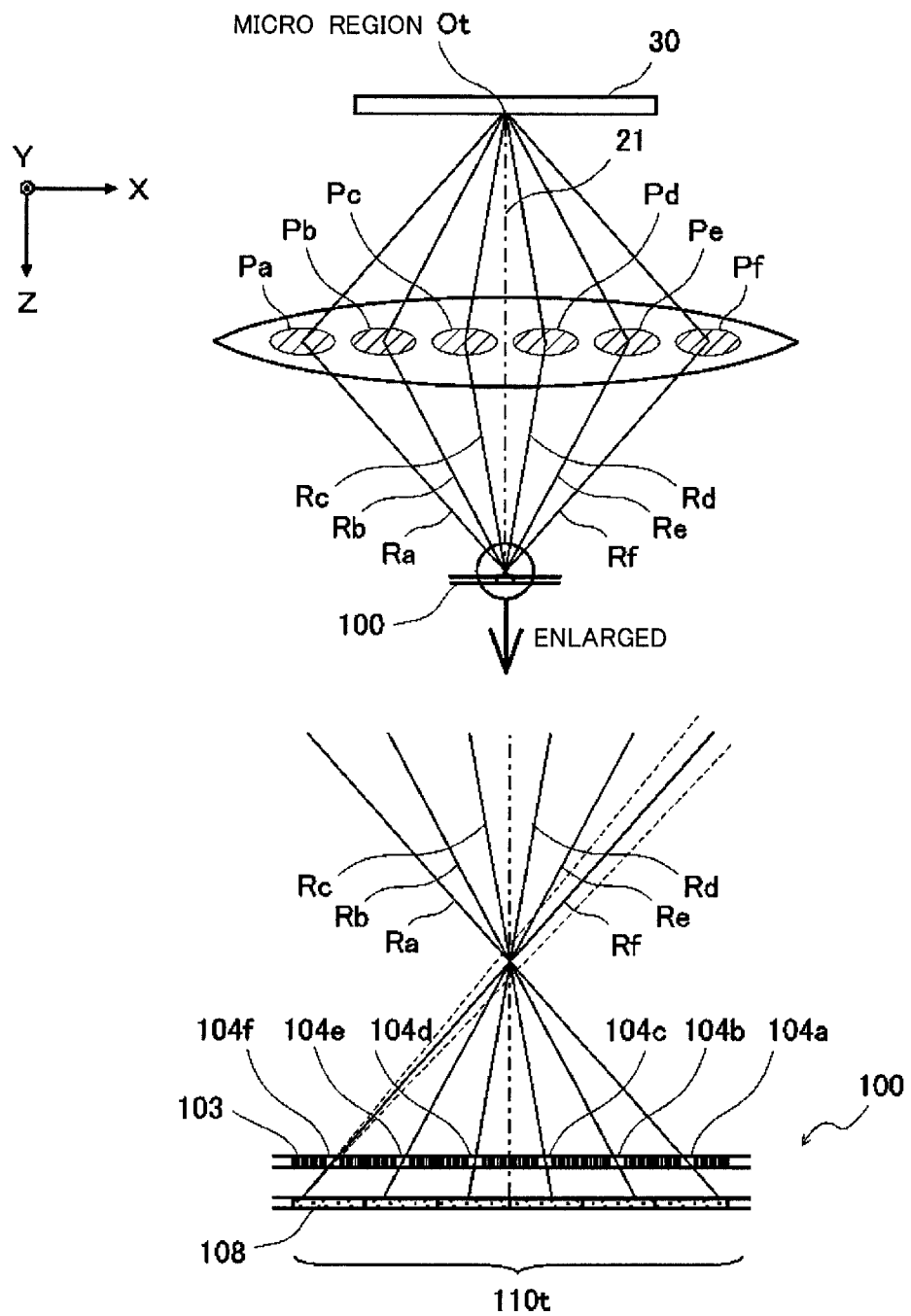
FIGS. 4A, 4B and 4C are conceptual views to illustrate the relation between a parallax pixel and a subject.
Figure 4B:
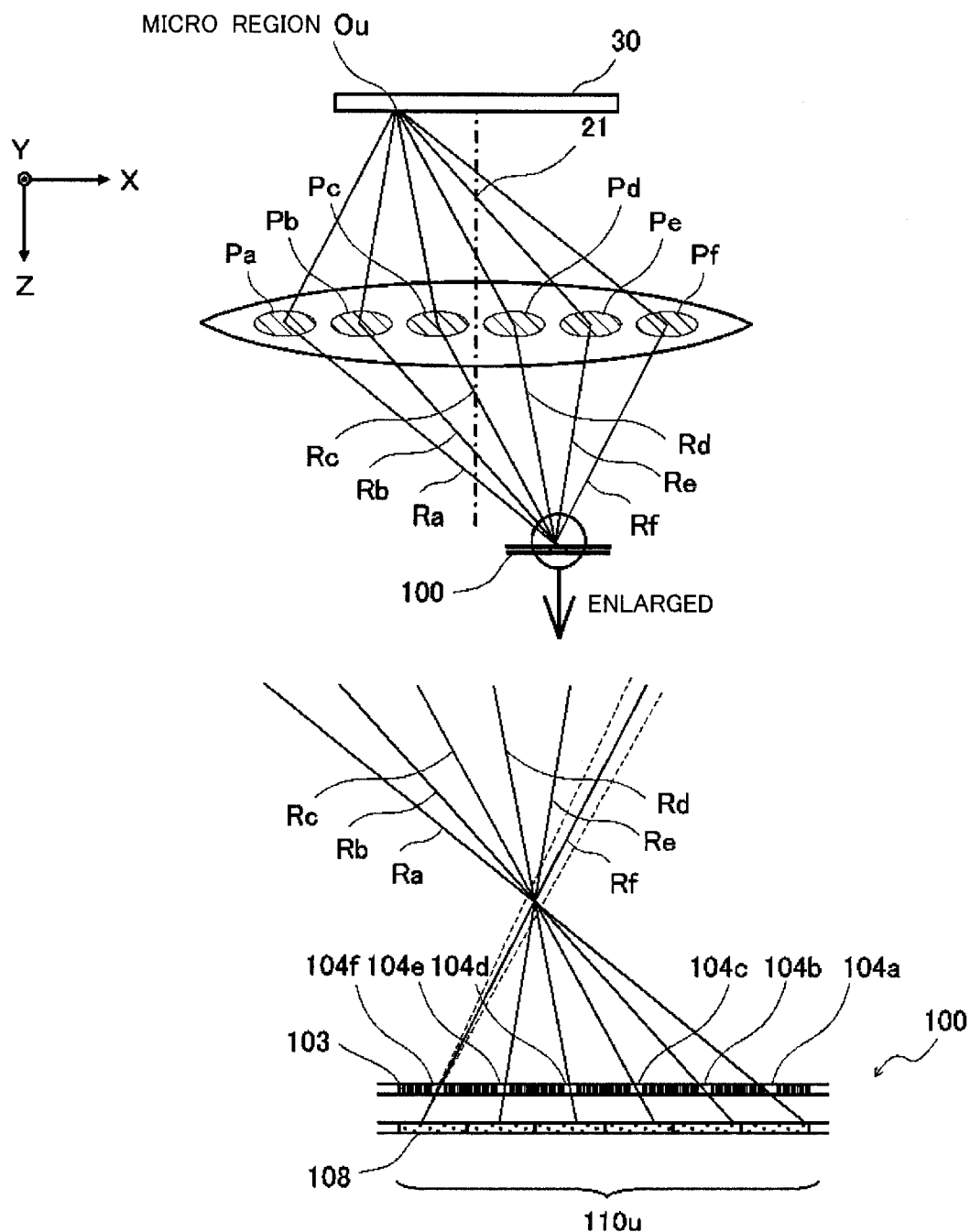
Figure 4C:
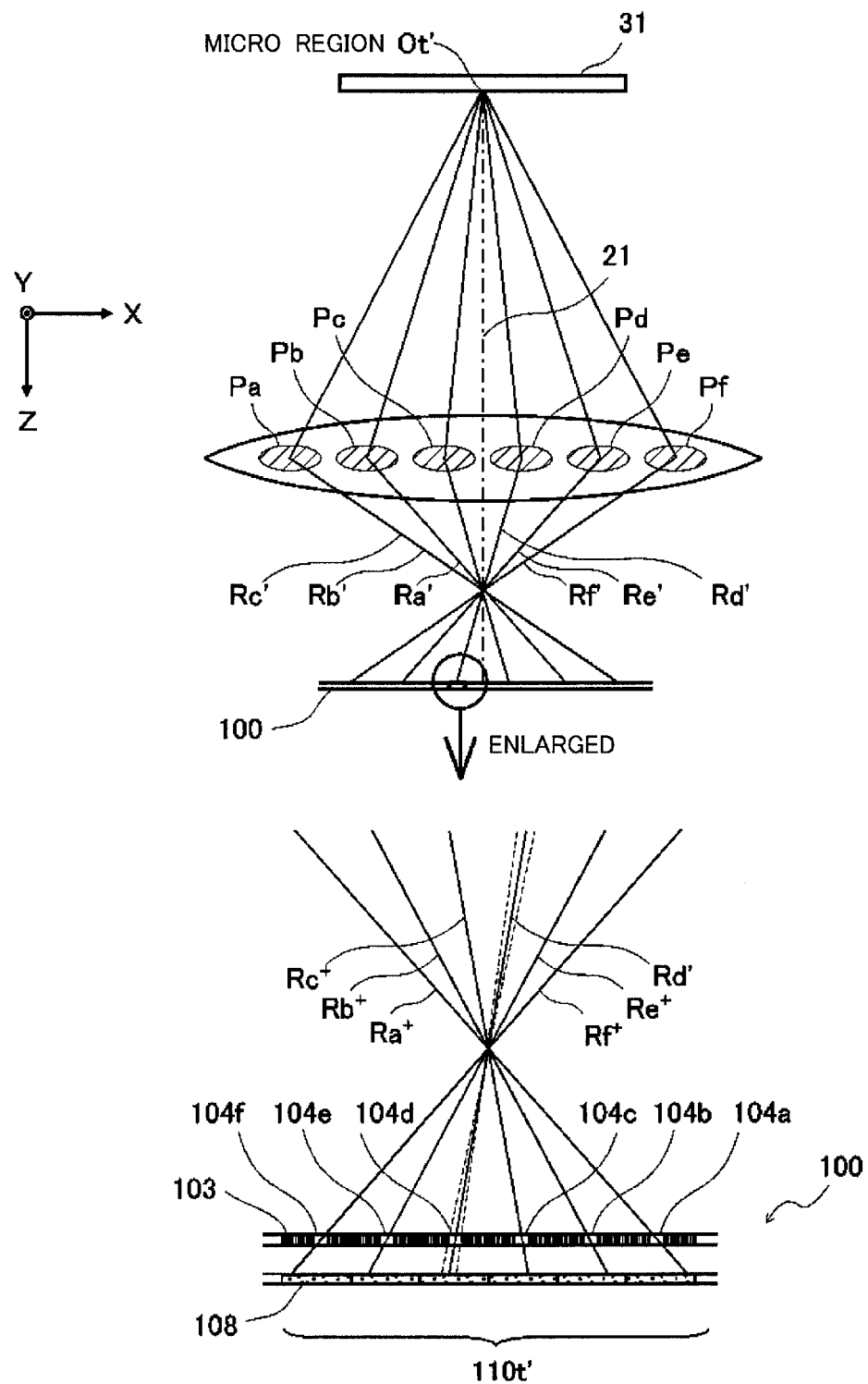

FIGS. 4A, 4B and 4C are each a conceptual diagram illustrating the relation between parallax pixels and a subject. To be specific, FIG. 4A illustrates a photoelectric converter element group having a repeating pattern 110t arranged at the center of the image sensor 100 through which the image-capturing optical axis 21 extends. FIG. 4B schematically illustrates a photoelectric converter element group having a repeating pattern 110u of the parallax pixels arranged in the peripheral portion of the image sensor 100. In FIGS. 4A and 4B, a subject 30 is positioned at a focus position relative to the image-capturing lens 20. FIG. 4C schematically illustrates the relation between the parallax pixels and the subject when a subject 31 at a non-focus position relative to the image-capturing lens 20 is captured, correspondingly to the relation shown in FIG. 4A.

The following first describes the relation between the parallax pixels and the subject when the image-capturing lens 20 captures the subject 30 at the focus position. The subject luminous flux is guided through the pupil of the image-capturing lens 20 to the image sensor 100. Here, six partial regions Pa to Pf are defined in the entire cross-sectional region through which the subject luminous flux transmits. For example, see the pixel, on the extreme left in the sheet of FIGS. 4A to 4C, of the photoelectric converter element groups having the repeating patterns 110t and 110u. The position of the opening 104f of the aperture mask 103 is defined so that only the subject luminous flux emitted from the partial region Pf reaches the photoelectric converter element 108 as seen from the enlarged view. Likewise, towards the pixel on the far right, the position of the opening 104e is defined so as to correspond to the partial region Pe, the position of the opening 104d is defined so as to correspond to the partial region Pd, the position of the openings 104c is defined so as to correspond to the partial region Pc, the position of the opening s104b is defined so as to correspond to the partial region Pb, and the position of the opening 104a is defined so as to correspond to the partial region Pa.

Stated differently, for example, the gradient of the main light ray Rf of the subject luminous flux (partial luminous flux) emitted from the partial region Pf, which is defined by the relative positions of the partial region Pf and the leftmost pixel, may determine the position of the opening 104f. When the photoelectric converter element 108 receives the subject luminous flux through the opening 104f from the subject 30 at the focus position, the subject luminous flux forms an image on the photoelectric converter element 108 as indicated by the dotted line. Likewise, toward the rightmost pixel, the gradient of the main light ray Re determines the position of the opening 104e, the gradient of the main light ray Rd determines the position of the opening 104d, the gradient of the main light ray Rc determines the position of the opening 104c, the gradient of the main light ray Rb determines the position of the opening 104b, and the gradient of the main light ray Ra determines the position of the opening 104a.

As shown in FIG. 4A, the luminous flux emitted from a micro region Ot of the subject 30 at the focus position, which coincides with the optical axis 21 on the subject 30, passes through the pupil of the image-capturing lens 20 and reaches the respective pixels of the photoelectric converter element group having the repeating pattern 110t. In other words, the pixels of the photoelectric converter element group having the repeating pattern 110t respectively receive the luminous flux emitted from the single micro region Ot through the six partial regions Pa to Pf. The micro region Ot has a certain spread that can accommodate the different positions of the respective pixels of the photoelectric converter element group having the repeating pattern 110t, but can be substantially approximated by substantially the same object point. Likewise, as shown in FIG. 4B, the luminous flux emitted from a micro region Ou of the subject 30 at the focus position, which is spaced away from the optical axis 21 on the subject 30, passes through the pupil of the image-capturing lens 20 to reach the respective pixels of the photoelectric converter element group having the repeating pattern 110u. In other words, the respective pixels of the photoelectric converter element group having the repeating pattern 110u respectively receive the luminous flux emitted from the single micro region Ou through the six partial regions Pa to Pf. Like the micro region Ot, the micro region Ou has a certain spread that can accommodate the different positions of the respective pixels of the photoelectric converter element group having the repeating pattern 110u, but can be substantially approximated by substantially the same object point.

That is to say, as long as the subject 30 is at the focus position, the photoelectric converter element groups capture different micro regions depending on the positions of the repeating patterns 110 on the image sensor 100, and the respective pixels of each photoelectric converter element group capture the same micro region through the different partial regions. In the respective repeating patterns 110, the corresponding pixels receive subject luminous flux from the same partial region. To be specific, in FIGS. 4A and 4B, for example, the leftmost pixels of the repeating patterns 110t and 110u receive the partial luminous flux from the same partial region Pf.

Strictly speaking, the position of the opening 104f of the leftmost pixel that receives the subject luminous flux from the partial region Pf in the repeating pattern 110t at the center through which the image-capturing optical axis 21 extends is different from the position of the opening 104f of the leftmost pixel that receives the subject luminous flux from the partial region Pf in the repeating pattern 110u at the peripheral portion. From the perspective of the functions, however, these openings can be treated as the same type of aperture masks in that they are both aperture masks to receive the subject luminous flux from the partial region Pf. Accordingly, in the example shown in FIGS. 4A to 4C, it can be said that each of the parallax pixels arranged on the image sensor 100 has one of the six types of aperture masks.

The following describes the relation between the parallax pixels and the subject when the image-capturing lens 20 captures the subject 31 at the non-focus position. In this case, the subject luminous flux from the subject 31 at the non-focus position also passes through the six partial regions Pa to Pf of the pupil of the image-capturing lens 20 to reach the image sensor 100. However, the subject luminous flux from the subject 31 at the non-focus position forms an image not on the photoelectric converter elements 108 but at a different position. For example, as shown in FIG. 4C, when the subject 31 is at a more distant position from the image sensor 100 than the subject 30 is, the subject luminous flux forms an image at a position closer to the subject 31 with respect to the photoelectric converter elements 108. On the other hand, when the subject 31 is at a position closer to the image sensor 100 than the subject 30 is, the subject luminous flux forms an image at a position on the opposite side of the subject 31 with respect to the photoelectric converter elements 108.

Accordingly, the subject luminous flux emitted from a micro region Ot' of the subject 31 at the non-focus position reaches the corresponding pixels of different repeating patterns 110 depending on which of the six partial regions Pa to Pf the subject luminous flux passes through. For example, the subject luminous flux that has passed through the partial region Pd enters the photoelectric converter element 108 having the opening 104d included in the repeating pattern 110t' as a main light ray Rd' as shown in the enlarged view of FIG. 4C. The subject luminous flux that has passed through the other partial regions may be emitted from the micro region Ot', but does not enter the photoelectric converter elements 108 included in the repeating pattern 110t' and enters the photoelectric converter elements 108 having the corresponding openings in different repeating patterns. In other words, the subject luminous fluxes that reach the respective photoelectric converter elements 108 constituting the repeating pattern 110t' are subject luminous fluxes emitted from different micro regions of the subject 31. To be specific, the subject luminous flux having the main light ray Rd' enters the photoelectric converter element 108 corresponding to the opening 104d, and the subject luminous fluxes having the main light rays Ra$^+$, Rb$^+$, Rc$^+$, Re$^+$, Rf$^+$, which are emitted from different micro regions of the subject 31, enter the photoelectric converter elements 108 corresponding to the other openings 104. The same relation is also seen in the repeating pattern 110u arranged in the peripheral portion shown in FIG. 4B.

Here, when the image sensor 100 is seen as a whole, for example, a subject image A captured by the photoelectric converter element 108 corresponding to the opening 104a and a subject image D captured by the photoelectric converter element 108 corresponding to the opening 104d match with each other if they are images of the subject at the focus position, and do not match with each other if they are images of the subject at the non-focus position. The direction and amount of the non-match are determined by on which side the subject at the non-focus position is positioned with respect to the focus position, how much the subject at the non-focus position is shifted from the focus position, and the distance between the partial region Pa and the partial region Pd. Stated differently, the subject images A and D are parallax images causing parallax therebetween. This relation also applies to the other openings, and six parallax images are formed corresponding to the openings 104a to 104f.

Accordingly, a collection of outputs from the corresponding pixels in different ones of the repeating patterns 110 configured as described above produces a parallax image. To be more specific, the outputs from the pixels that have received the subject luminous flux emitted from a particular partial region of the six partial regions Pa to Pf form a parallax image.

Figure 5:
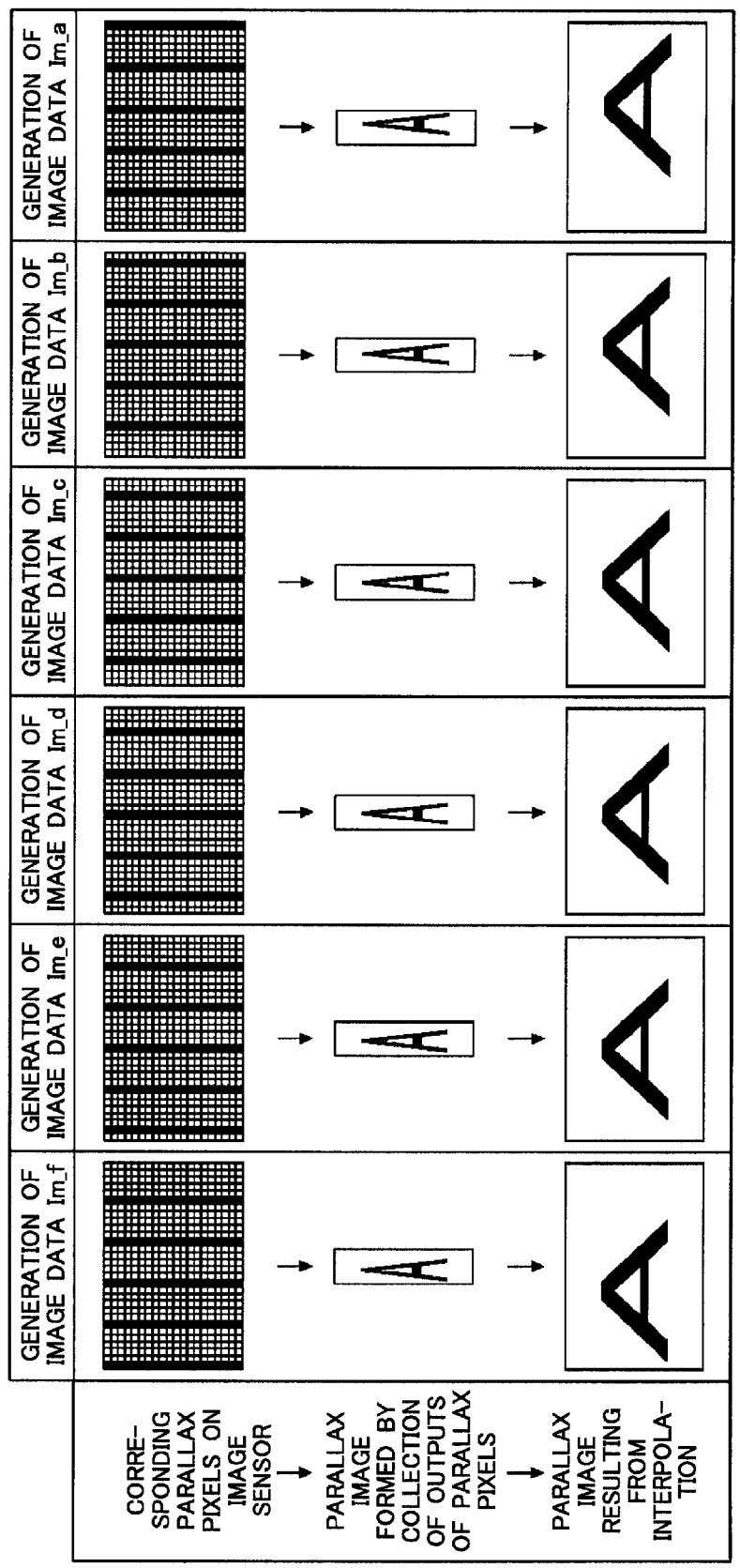
FIG. 5 is a conceptual view to illustrate how to produce a parallax image.

FIG. 5 is a conceptual diagram to illustrate an operation to produce a parallax image. FIG. 5 shows, from left to right, how parallax image data Im_f is produced by collecting the outputs from the parallax pixels corresponding to the openings 104f, how parallax image data Im_e is produced from the outputs of the parallax pixels corresponding to the openings 104e, how parallax image data Im_d is produced from the outputs of the parallax pixels corresponding to the openings 104d, how parallax image data Im_c is produced from the outputs of the parallax pixels corresponding to the openings 104c, how parallax image data Im_b is produced from the outputs of the parallax pixels corresponding to the openings 104b, and how parallax pixel data Im_a is produced from the outputs from the parallax pixels corresponding to the openings 104a. The following first describes how parallax image data Im_f is produced by collecting the outputs from the parallax pixels corresponding to the openings 104f.

The repeating patterns 110 each of which has a photoelectric converter element group constituted by a group of six parallax pixels are arranged side-by-side. Accordingly, on the hypothetical image sensor 100 excluding no-parallax pixels, the parallax pixels having the openings 104f are found every six pixels in the horizontal direction and consecutively arranged in the vertical direction. These pixels receive subject luminous fluxes from different micro regions as described above. Therefore, parallax images can be obtained by collecting and arranging the outputs from theses parallax pixels.

However, the pixels of the image sensor 100 of the present embodiment are square pixels. Therefore, if the outputs are simply collected, the number of pixels in the horizontal direction is reduced to one-sixth and vertically long image data is produced. To address this issue, interpolation is performed to increase the number of pixels in the horizontal direction six times. In this manner, the parallax image data Im_f is produced as an image having the original aspect ratio. Note that, however, the horizontal resolution is lower than the vertical resolution since the parallax image data before the interpolation represents an image whose number of pixels in the horizontal direction is reduced to one-sixth. In other words, the number of pieces of parallax image data produced is inversely related to the improvement of the resolution. The interpolation applied in the present embodiment will be specifically described later.

In the similar manner, parallax image data Im_e to parallax image data Im_a are obtained. Stated differently, the digital camera 10 can produce parallax images from six different viewpoints with horizontal parallax.

The above has described an exemplary case where the openings of the parallax pixels have six different types of position shifts with respect to the center of the pixels and the different types of parallax pixels function as a pupil-division optical system to provide for parallax pixels of six viewpoints. The above mainly describes that the respective types of parallax pixels form subject images of different viewpoints and the different types of parallax pixels cause parallax between images taken from different viewpoints.

A pupil-division optical system using parallax pixels not only causes parallax but also, more importantly, causes parallax only between blur images of a subject at a non-focus position that is off the focus position according to the degree of the non-focus.

This fact is described for a normal no-parallax pixel and two parallax pixels (left and right parallax pixels) with reference to FIGS. 20A and 20B and FIGS. 21A and 21B (corresponding to FIGS. 12A to 14B). Light, which has passed through a single optical system, forms an optical image as if the hypothetical pupil is provided on the left side of the optical system in the case of a right parallax pixel and forms an optical image as if the hypothetical pupil is provided on the right-hand side of the optical system in the case of a left parallax pixel. Accordingly, the point spread function of the image of a subject at the focus position is sharp, and the light from the subject at the focus position forms a no-parallax subject image having a sharp point spread irrespective of whether the light passes through either of the hypothetical pupils. On the other hand, the point spread function of a subject at a position that is off the focus position toward or away from the optical system is broad. Furthermore, as the subject is moved away from the focus position, the blur width of the subject image increases and the centers of the respective formed images are further spaced away from each other in the left-and-right direction, which causes parallax. When these two separate point spread functions are added and combined together, the resulting single point spread function matches with the point spread function of the image formed by the no-parallax pixel, and the peak of the resulting single point spread function is positioned between and equally distant from the point spread functions of the two separate optical images formed by the hypothetical pupils.

The present embodiment takes advantage of the important fact that parallax only exists in the blur and the disparity increases as the blur increases. An exemplary case is described where a particular color and parallax arrangement is employed to simultaneously obtain high-definition 2D and 3D images.

1. A Color-and-Parallax Multiplexed Mosaic Image Data is Input.

Figure 6:
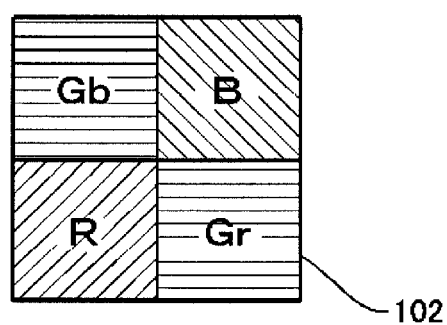
FIG. 6 illustrates a Bayer arrangement.

The following describes the color filters 102 and the parallax images. FIG. 6 illustrates a Bayer arrangement. As shown in FIG. 6, G filters are assigned to the two pixels, i.e., the upper-left (Gb) and lower right (Gr) pixels, an R filter is assigned to one pixel, i.e., the lower left pixel, and a B filter is assigned to one pixel, i.e., an upper right pixel in the Bayer arrangement.

Based on such an arrangement of the color filters 102, an enormous number of different repeating patterns 110 can be defined depending on to what colors the parallax and no-parallax pixels are allocated and how frequently parallax and no-parallax pixels are allocated. Collecting the outputs of the no-parallax pixels can produce no-parallax captured image data like an ordinary captured image. Accordingly, a high-resolution 2D image can be output by increasing the ratio of the no-parallax pixels relative to the parallax pixels. In this case, the ratio of the parallax pixels decreases relative to the no-parallax pixels and a 3D image formed by a plurality of parallax images exhibits lower image quality. On the other hand, if the ratio of the parallax pixels increases, the 3D image exhibits improved image quality. However, since the ratio of the no-parallax pixels decreases relative to the parallax pixels, a low-resolution 2D image is output. If the parallax pixels are allocated to all of the R, G and B pixels, the resulting color image data represents a 3D image having excellent color reproducibility and high quality.

Irrespective of whether the color image data represents a 2D or 3D image, the color image data ideally has high resolution and quality. Here, the region of a 3D image for which an observer senses parallax when observing the 3D image is the non-focus region in which the identical subject images do not match, as understood from the cause of the parallax, which is described with reference to FIGS. 4A to 4C, 12A to 12C, 13A to 13C, and 14A and 14B. This means that, in the region of the image in which the observer senses parallax, fewer high-frequency components are present than in the focused image of the main subject. Considering this, the image data required to produce a 3D image does not need to have very high resolution in the region in which parallax is generated.

Regarding the focused region of the image, the corresponding image data is extracted from 2D image data. Regarding the non-focused region of the image, the corresponding image data is extracted from 3D image data. In this way, parallax image data can be produced by combining these pieces of image data for the focused and non-focused regions. Alternatively, as will be described in detail later, high-resolution 2D image data is used as basic data and the relative differences of the 3D image data are added to the 2D image data on the pixel-by-pixel basis. In this way, high-resolution parallax image data can be produced. When such image processing is employed, the number of the parallax pixels may be allowed to be smaller than the number of the no-parallax pixels in the image sensor 100. In other words, a 3D image having a relatively high resolution can be produced even if the number of the parallax pixels is relatively small.

In this case, to produce the 3D image in color, at least two different types of color filters may need to be arranged. In the present embodiment, however, three types of, i.e., R, G and B color filters are employed as in the Bayer arrangement described with reference to FIG. 6 in order to further improve the image quality. To be specific, in the present embodiment where the number of parallax pixels is relatively small, the parallax pixels have all of the combinations of the different types of openings 104 and the three types of, i.e., R, G and B color filters. Parallax Lt pixels having an opening 104 shifted to the left from the center and parallax Rt pixels having an opening 104 shifted to the right from the center are taken as an example. The parallax Lt pixels include a pixel having an R filter, a pixel having a G filter, and a pixel having a B filter, and the parallax Rt pixels include a pixel having an R filter, a pixel having a G filter, and a pixel having a B filter. Thus, the image sensor 100 has six different types of parallax pixels. Such an image sensor 100 outputs image data, which is used to form clear color parallax image data to realize a stereoscopic view. Note that, when two types of openings are combined with two types of color filters, the image sensor 100 has four types of parallax pixels.

Figure 7:
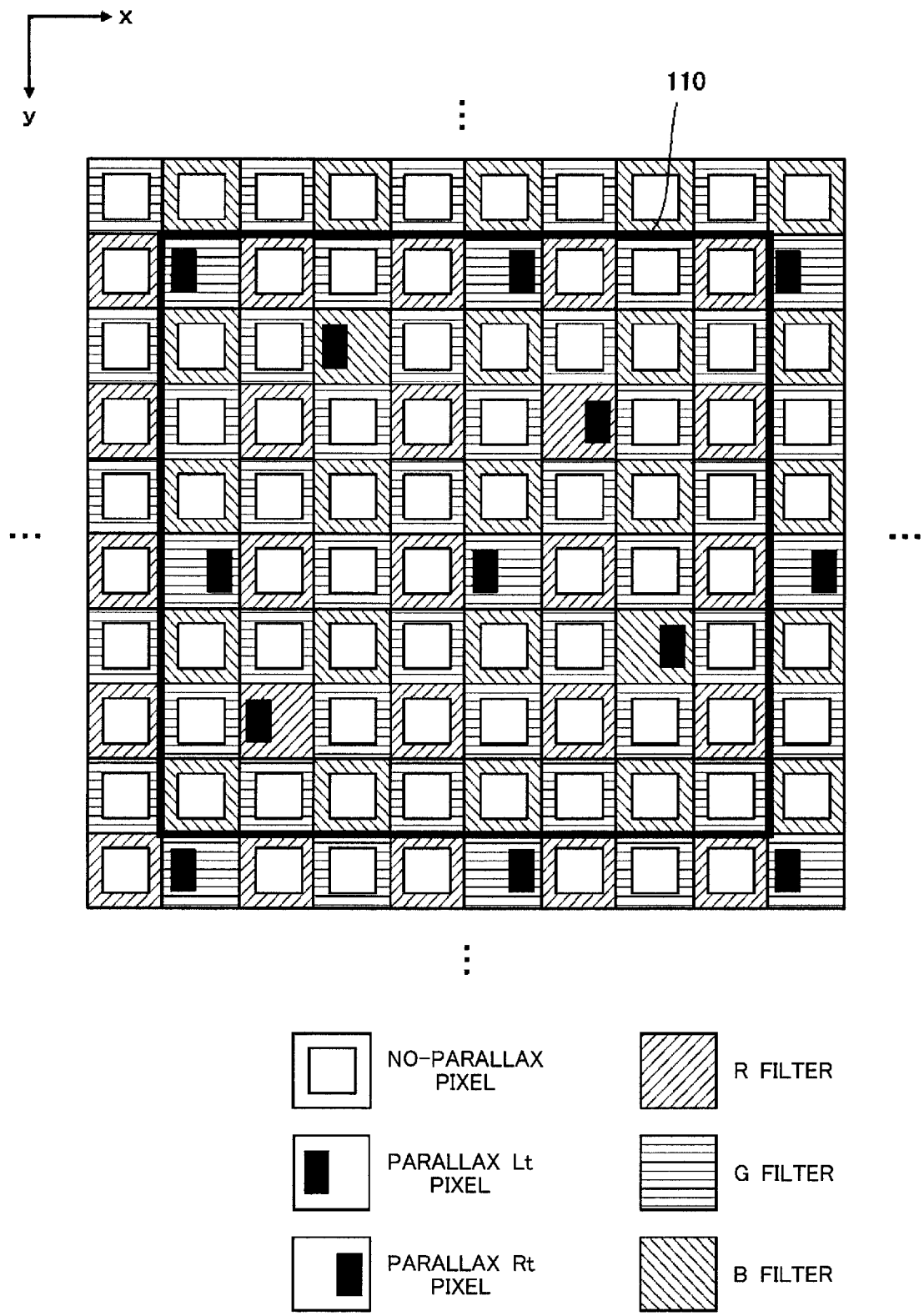
FIG. 7 illustrates how pixels are arranged in a repeating pattern 110 in a first implementation.

FIG. 7 illustrates the arrangement of pixels in a repeating pattern 110 relating to a first implementation. The coordinate system of the digital camera 10 is defined by the X, Y and Z axes. In the repeating pattern 110, however, the leftmost and uppermost pixel is used as a reference, and the right direction is defined as an x axis and the downward direction is defined as a y axis. The repeating pattern 110 relating to the first implementation includes four Bayer arrangements, each of which is formed by four pixels, arranged both in the y-axis and x-axis directions, and is thus constituted by sixty-four pixels. This repeating pattern 110 has a group of 64 pixels as a single unit, and a plurality of repeating patterns 110 are periodically arranged horizontally and vertically within the effective pixel region of the image sensor 100. Thus, the repeating pattern 110 bounded by the thick bold line in FIG. 7 is the primitive lattice in the image sensor 100. Here, the pixels within the repeating pattern 110 are represented as $P_{xy}$. For example, the leftmost and uppermost pixel is represented as $P_{11}$ and the rightmost and uppermost pixel is represented as $P_{81}$.

Each of the parallax pixels relating to the first implementation has one of the two types of aperture masks 103, so that the parallax pixels are divided into the parallax Lt pixels having the openings 104 shifted to the left from the center of the pixels and the parallax Rt pixels having the openings 104 shifted to the right from the center of the pixels. As shown in FIG. 7, the parallax pixels are arranged in the following manner.

$P_{11}$ ... parallax Lt pixel+G filter(=$G_{Lt}$)

$P_{51}$ ... parallax Rt pixel+G filter(=$G_{Rt}$)

$P_{32}$ ... parallax Lt pixel+B filter(=$B_{Lt}$)

$P_{63}$ ... parallax Rt pixel+R filter(=$R_{Rt}$)

$P_{15}$ ... parallax Rt pixel+G filter(=$G_{Rt}$)

$P_{55}$ ... parallax Lt pixel+G filter(=$G_{Lt}$)

$P_{76}$ ... parallax Rt pixel+B filter(=$B_{Rt}$)

$P_{27}$ ... parallax Lt pixel+R filter(=$R_{Lt}$)

The other pixels are no-parallax pixels and include no-parallax pixels+R filter (=$R_N$), no-parallax pixels+G filter (=$G_N$), and no-parallax pixels+B filter (=$B_N$).

As described above, the pixel arrangement preferably includes the parallax pixels having all of the combinations of the different types of openings and the different types of color filters within the primitive lattice of the pixel arrangement and has the parallax pixels randomly arranged together with the no-parallax pixels that are more than the parallax pixels. To be more specific, it is preferable, when the parallax and no-parallax pixels are counted according to each type of color filters, that the no-parallax pixels are still more than the parallax pixels. In the case of the first implementation, while $G_N$=28, $G_{Lt}$+$G_{Rt}$=2+2=4, while $R_N$=14, $R_{Lt}$+$R_{Rt}$=2, and while $B_N$=14, $B_{Lt}$+$B_{Rt}$=2. In addition, as described above, considering the human spectral sensitivity characteristics, more parallax and no-parallax pixels having the G filter are arranged than the parallax and no-parallax pixels having the other types of color filters.

Stated differently, it is attempted to obtain a higher-level and more accurate color distribution structure for a stereoscopic view by acquiring information of all of the R, G and B colors also for the parallax pixels.

For the right parallax pixels, the left parallax pixels and the no-parallax pixels, the RGB ratio is commonly R:G: B=1:2:1, which is the same as in the Bayer arrangement. The parallax pixels have a low density and arranged away from each other as much as possible in order to allow the no-parallax pixels can keep the spatial resolution at the same level as the normal Bayer arrangement. In other words, the right parallax pixels of a particular color component are isotropically arranged at equal intervals and the left parallax pixels of a particular color component are also isotropically arranged at equal intervals, and, at the same time, the right parallax pixels of a particular color component are arranged as distant as possible from the left parallax pixels of the particular color component and the parallax pixels of the same color component are arranged at equal intervals whether they are right or left parallax pixels. In this way, when their color components are ignored, the right parallax pixels are arranged as distant as possible from each other and the left parallax pixels are arranged as distant as possible from each other, so that parallax information can be uniformly obtained.

In the first implementation, the ratio between the number of no-parallax pixels, the number of left parallax pixels and the number of right parallax pixels is N:Lt:Rt=14:1:1 and the spatial resolution of the no-parallax pixels is kept at a very similar level to the spatial resolution of the Bayer arrangement. Furthermore, since the parallax pixels are arranged as distant as possible, every parallax pixel is adjacent to a no-parallax pixel and there is no such risk that the resolutions achieved by adjacent pixels drop together. Accordingly, the first implementation maintains a high resolving power equivalent to high frequency components including the Nyquist frequency components.

Figure 8:
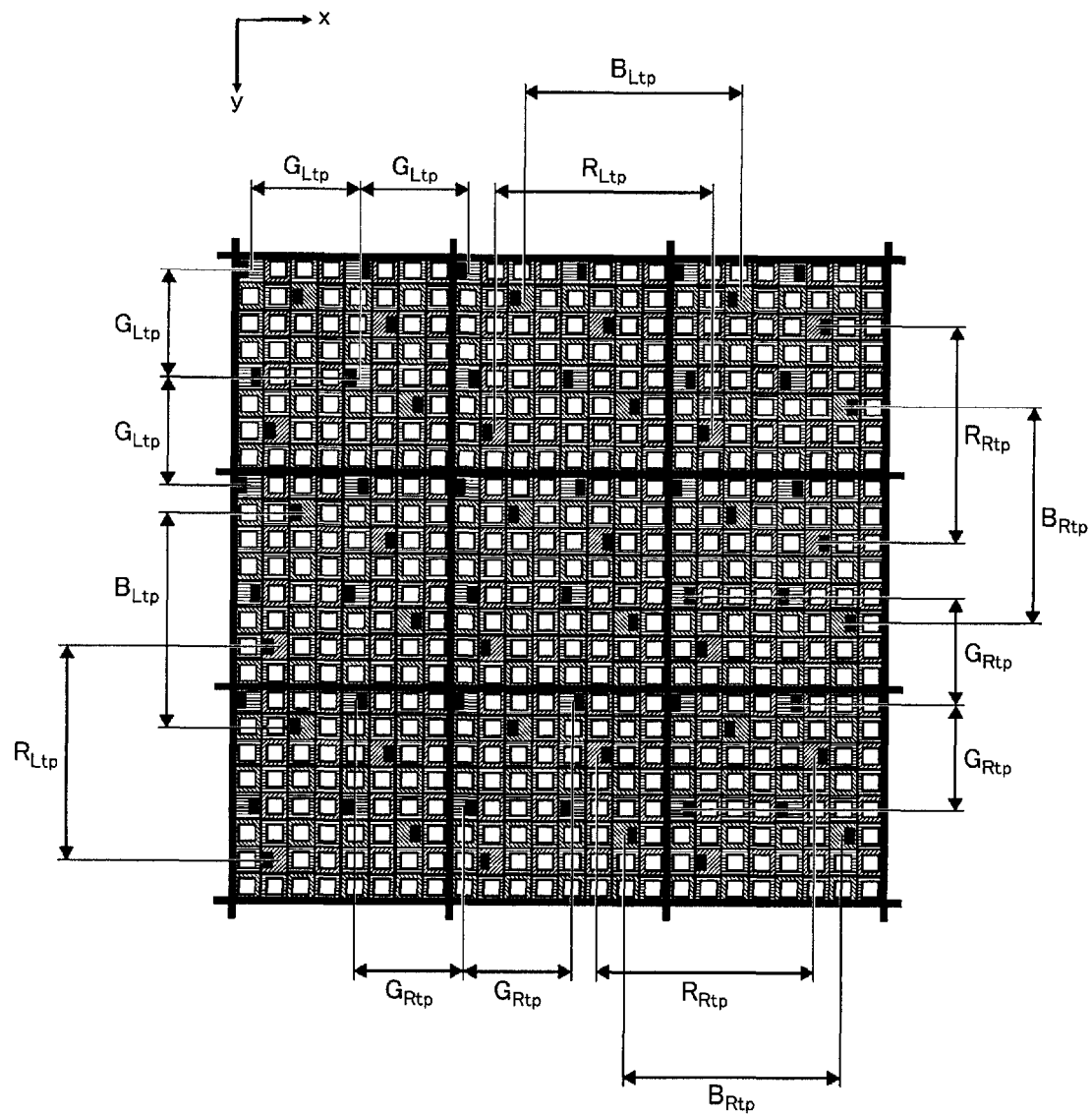
FIG. 8 illustrates how the pixel pitches of the various types of parallax pixels are related to each other in the first implementation.

FIG. 8 illustrates how the pixel pitches of the various types of parallax pixels are related to each other in the first implementation. In FIG. 8, nine repeating patterns 110, shown in FIG. 7, are arranged in 3×3.

As seen from FIG. 8, the intervals between the $G_{Lt}$ pixels, which is represented as $G_{Ltp}$, are equal in the x-axis direction and also equal in the y-axis direction. Likewise, the intervals between the corresponding $G_{Rt}$ pixels, which is represented as $G_{Rtp}$, are equal in the x-axis direction and also equal in the y-axis direction. In addition, $G_{Rtp}$ is equal to $G_{Ltp}$. Furthermore, each $G_{Rt}$ pixel is positioned at a distance of $G_{Ltp}$ away from a $G_{Lt}$ pixel only in one of the x and y directions.

Likewise, the intervals between the $R_{Lt}$ pixels, which is represented as $R_{Ltp}$, are equal in the x-axis direction and also equal in the y-axis direction. Likewise, the intervals between the corresponding $R_{Rt}$ pixels, which is represented as $R_{Rtp}$, are equal in the x-axis direction and also equal in the y-axis direction. In addition, $R_{Rtp}$ is equal to $R_{Ltp}$. Furthermore, each $R_{Rt}$ pixel is positioned at a distance of half of $R_{Ltp}$ away from a $R_{Lt}$ pixel in both of the x and y directions.

Furthermore, the intervals between the $B_{Lt}$ pixels, which is represented as $B_{Ltp}$, are equal in the x-axis direction and also equal in the y-axis direction. Likewise, the intervals between the corresponding $B_{Rt}$ pixels, which is represented as $B_{Rtp}$, are equal in the x-axis direction and also equal in the y-axis direction. In addition, $B_{Rtp}$ is equal to $B_{Ltp}$. Furthermore, each $B_{Rt}$ pixel is positioned at a distance of half of $B_{Rtp}$ away from a $B_{Lt}$ pixel in both of the x and y directions.

Thus, when the pixels are grouped according to each type of the color filters, the pixels having one of the types of aperture masks are arranged at equal intervals in both of the two-dimensional directions and sandwiched between the parallax and no-parallax pixels associated with the other types of aperture masks. Stated differently, the pixels associated with each of the types of the color filters are arranged isotropically and equally in the two-dimensional directions. By arranging the parallax pixels in the above-described manner, parallax images have the same resolution in both of the vertical and horizontal directions when output and the adverse effects made by the parallax pixels on the resolution of 2D images can be also reduced.

Figure 22A:
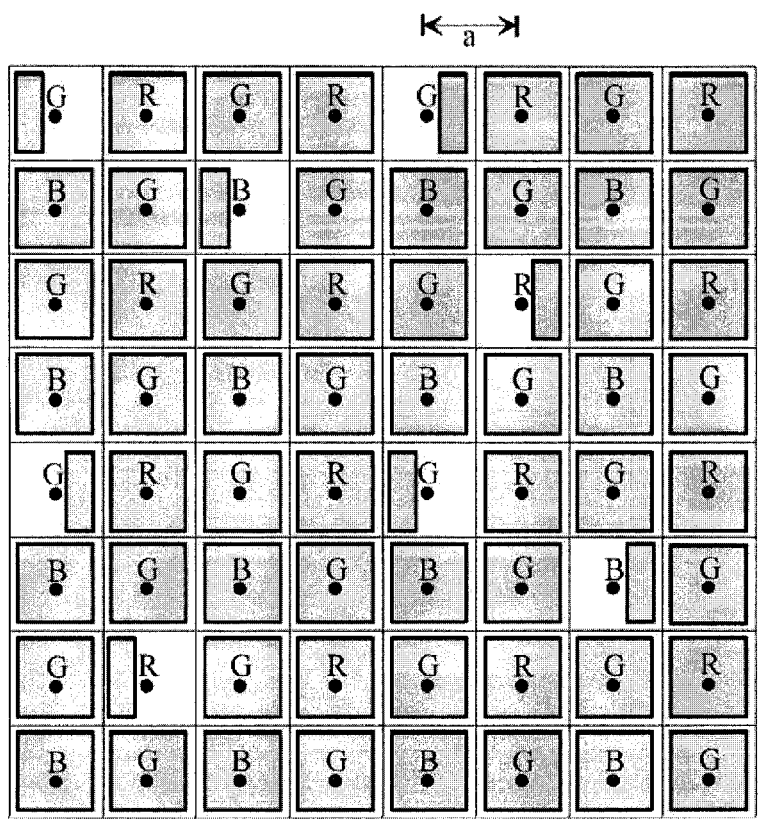
FIGS. 22A and 22B illustrate, as an example, an arrangement of pixels in the real space and the corresponding k-space.
Figure 22B:
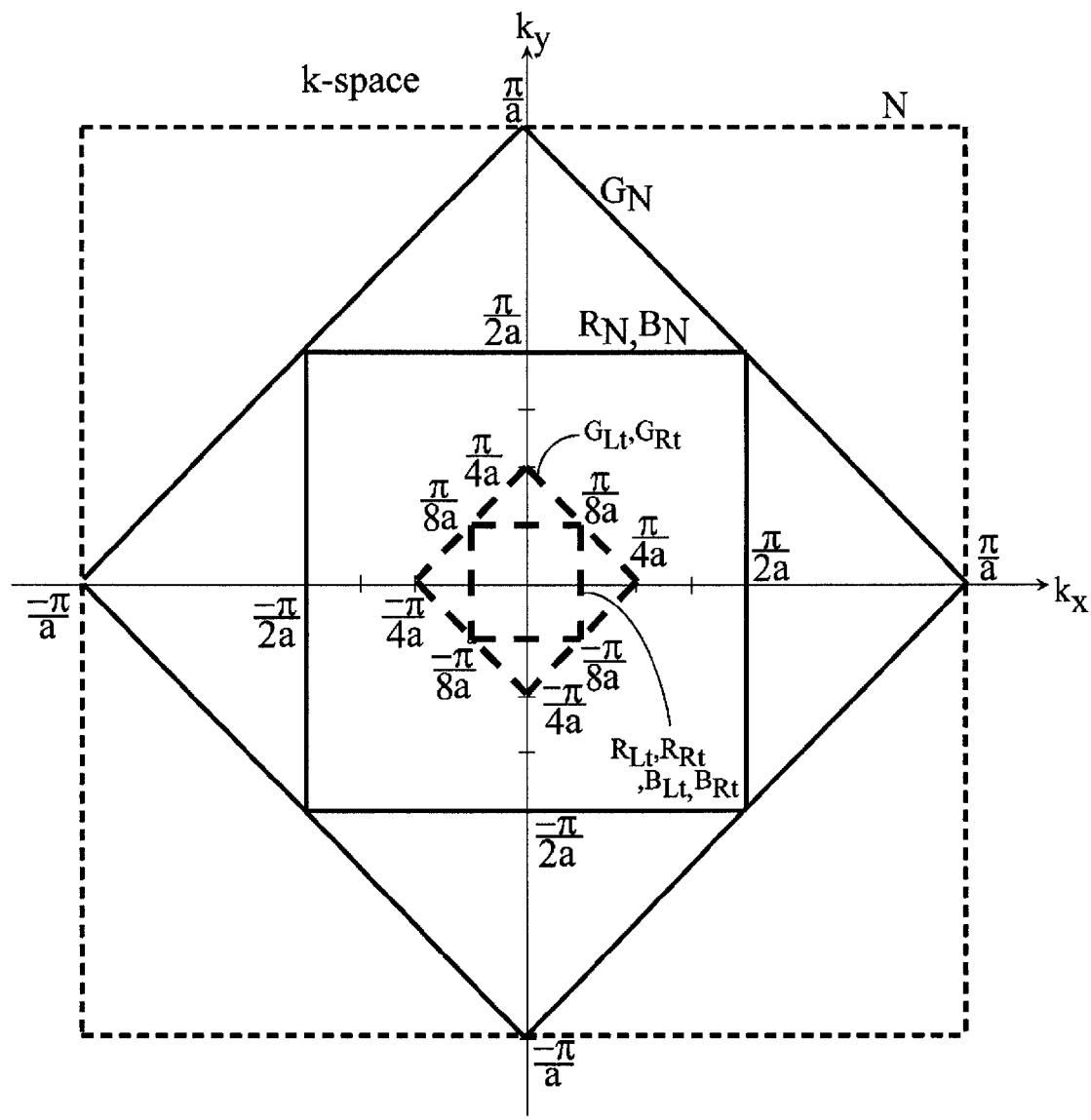

The above-described color-and-parallax multiplexed pixel arrangement is shown in FIG. 22A, and FIG. 22B shows a k-space to illustrate the resolving region or resolution in the frequency space corresponding to the pixel arrangement in the real space. When k denotes the wave number and f denotes the frequency, k=2πf. The lattice pitch in the actual space is denoted by a, and the reciprocal lattice space of the actual space is represented as a k-space, and the resolving region is represented by a first Brillouin zone of the reciprocal lattice space (see, for example, US 2010/0201853 and Japanese Patent No. 4239483 invented by the same inventor as the present application).

FIGS. 22A and 22B show that, when it comes to the images as captured, the resolving power of the left and right parallax pixels having a low density is lower than the resolving power of the no-parallax pixels having a high density. To offset this disadvantage, the no-parallax pixels having a high density provide for a resolving power comparable to the resolving power of the Bayer arrangement.

Accordingly, as described later, the no-parallax pixels are first subject to interpolation to produce 2D color images $R_N$, $G_N$ and $B_N$, and low-density left parallax images $R_{Lt}$, $G_{Lt}$ and $B_{Lt}$ and low-density right parallax images $R_{Rt}$, $G_{Rt}$ and $B_{Rt}$ are produced in advance. The no-parallax images are used as intermediate images, so that high-density left parallax images $R'_{Lt}$, $G'_{Lt}$ and $B'_{Lt}$ and high-density right parallax images $R'_{Rt}$, $G'_{Rt}$ and $B'_{Rt}$ can be finally obtained by applying parallax modulation using the low-density parallax images as follows.

$$R'_{Lt}(x, y) = R_N(x, y) + \frac{R_{Lt}(x, y) - R_{Rt}(x, y)}{2} +$$
$$\frac{G_{Lt}(x, y) - G_{Rt}(x, y)}{2} + \frac{B_{Lt}(x, y) - B_{Rt}(x, y)}{2}$$

$$G'_{Lt}(x, y) = G_N(x, y) + \frac{R_{Lt}(x, y) - R_{Rt}(x, y)}{2} +$$
$$\frac{G_{Lt}(x, y) - G_{Rt}(x, y)}{2} + \frac{B_{Lt}(x, y) - B_{Rt}(x, y)}{2}$$

$$B'_{Lt}(x, y) = B_N(x, y) + \frac{R_{Lt}(x, y) - R_{Rt}(x, y)}{2} +$$
$$\frac{G_{Lt}(x, y) - G_{Rt}(x, y)}{2} + \frac{B_{Lt}(x, y) - B_{Rt}(x, y)}{2}$$

$$R'_{Rt}(x, y) = R_N(x, y) + \frac{R_{Rt}(x, y) - R_{Lt}(x, y)}{2} +$$
$$\frac{G_{Rt}(x, y) - G_{Lt}(x, y)}{2} + \frac{B_{Rt}(x, y) - B_{Lt}(x, y)}{2}$$

$$G'_{Rt}(x, y) = G_N(x, y) + \frac{R_{Rt}(x, y) - R_{Lt}(x, y)}{2} +$$
$$\frac{G_{Rt}(x, y) - G_{Lt}(x, y)}{2} + \frac{B_{Rt}(x, y) - B_{Lt}(x, y)}{2}$$

$$B'_{Rt}(x, y) = B_N(x, y) + \frac{R_{Rt}(x, y) - R_{Lt}(x, y)}{2} +$$
$$\frac{G_{Rt}(x, y) - G_{Lt}(x, y)}{2} + \frac{B_{Rt}(x, y) - B_{Lt}(x, y)}{2}$$

In this way, the high-frequency components of the no-parallax pixels are superimposed to produce new parallax images, so that parallax images or 3D images can achieve as high resolution as 2D images. In other words, in a slightly defocused image region in the vicinity of the focused region, in which slight parallax is caused, the parallax modulation performs position shifting to slightly shift in the left and right directions the high-resolution no-parallax images with reference to the gradual changes in the parallax images.

Furthermore, a subject image in a significantly defocused region or in the non-focus region is significantly shifted horizontally while the resolving power of the no-parallax images is maintained as much as possible and by making the most use of the horizontal spatial resolution of the gradually changing parallax images.

Stated differently, the pixel arrangement is required to produce parallax images having a high horizontal spatial resolution in order to maximize the parallax modulation effects.

From this point of view, the pixel arrangement shown at the beginning in relation to the 6-viewpoint example in which the left and right parallax pixels are arranged in the horizontal direction is not desirable due to a lowered horizontal resolution. Alternatively, a parallax pixel arrangement is required that achieves high resolution in the horizontal direction. An isotropic parallax pixel arrangement satisfies this requirement. FIG. 22B shows a k-space representing the resolution achieved by the isotropic parallax pixel arrangement.

As described above, the pixels constituting the image sensor 100 are characterized by various combinations of whether they are parallax or no-parallax pixels, which is determined by the openings 104, and whether they are R, G or B pixels, which is determined by the color filters 102. Accordingly, simply arranging the outputs of the image sensor 100 in accordance with its pixel arrangement does not provide image data representing a particular image. In other words, grouping and collecting the outputs from the pixels of the image sensor 100 for each group of pixels with the same characteristic can provide image data representing an image having the characteristic. For example, as has been described with reference to FIG. 5, grouping and collecting the outputs from the parallax pixels according to the types of their openings can provide a plurality of pieces of parallax image data that have parallax therebetween. Here, the image data obtained by grouping and collecting the outputs from the pixels for each group of the pixels having the same characteristic is referred to as plane data.

The image processor 205 receives raw original image data in which the output values of the pixels of the image sensor 100 are arranged in the order of the pixel arrangement of the image sensor 100. The image processor 205 then separates the raw original image data into a plurality of pieces of plane data. At this stage, each plane data has output values only at the pixel positions at which the raw original image data has output values. Thus, the image processor 205 performs interpolation based on each plane data and produces plane data in which the empty pixel positions have been filled with output values. The following describes how to produce plane data in which empty pixel positions have been filled with output values by the interpolation, with reference to the outputs from the image sensor 100 of the first implementation described with reference to FIG. 7, for example.

2. A No-Parallax Image is Produced.

Figure 9:
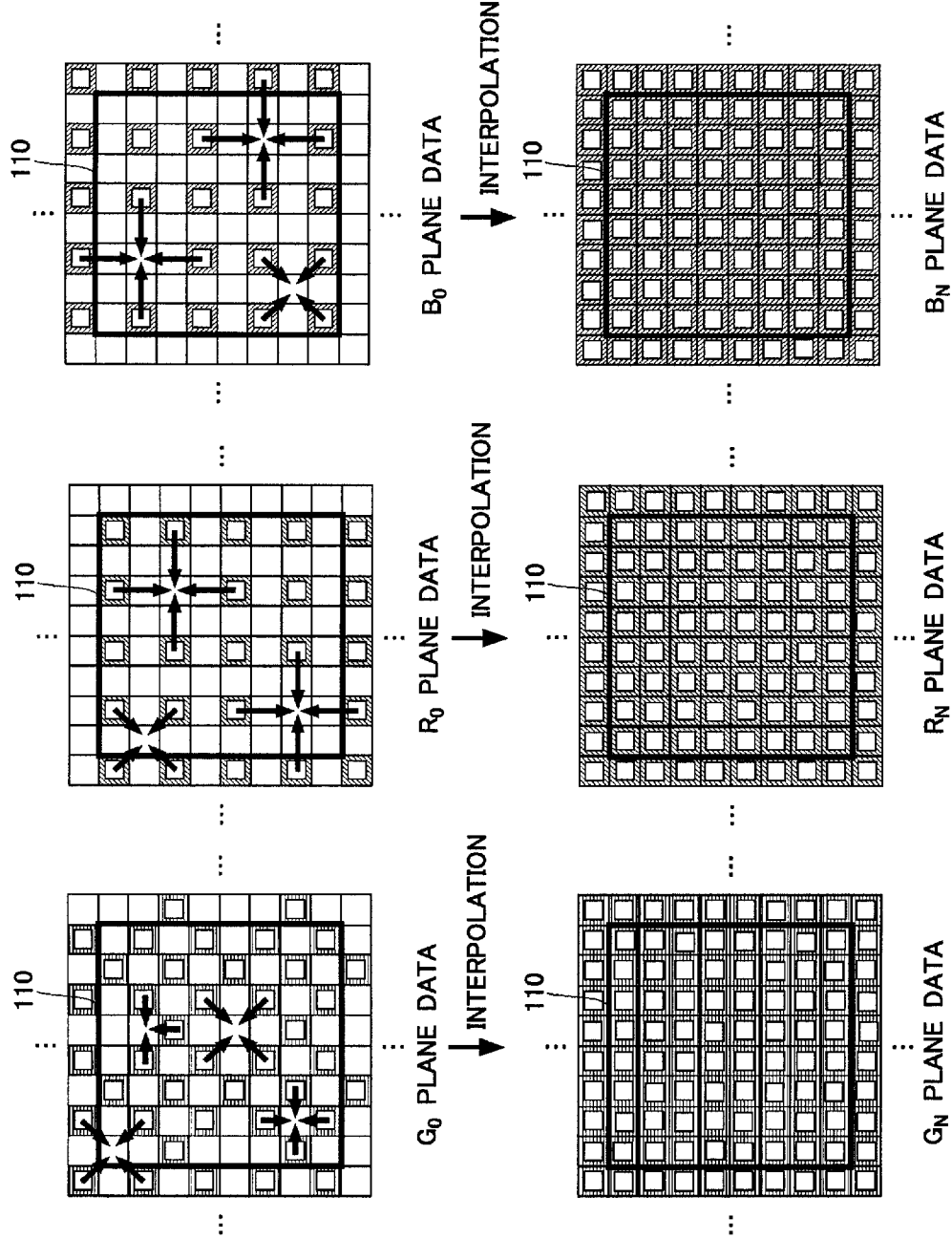
FIG. 9 illustrates, as an example, how to produce $G_N$ plane data, $R_N$ plane data, and $B_N$ plane data, which are 2D image data.

FIG. 9 illustrates, as an example, how to produce $G_N$ plane data, $R_N$ plane data, and $B_N$ plane data, which are 2D image data. The drawings on the upper side each show a single repeating pattern 110 and some of the surrounding outputs in the image sensor 100 in accordance with the pixel arrangement of the image sensor 100. Specifically speaking, the drawings on the upper side respectively show, from left to right, $G_0$ plane data formed by extracting only G pixels, $R_0$ plane data formed by extracting only R pixels and $B_0$ plane data formed by extracting only B pixels. Note that, in FIG. 9, the pixels are shown in accordance with the example of FIG. 7 so that the different types of pixels can be understood, but it is actually the output values corresponding to the pixels that are arranged.

To produce the $G_N$ plane data, the image processor 205 first produces the $G_0$ plane data by removing the pixel values, except for the pixel values of the no-parallax pixels $G_N$, from all of the output values of the image sensor 100 and creating empty pixel positions. The image processor 205 then calculates the pixel values for the empty pixel positions by means of interpolation based on the pixel values of the surrounding no-parallax pixels $G_N$. For example, the pixel value for an empty pixel position $P_{11}$ is calculated by averaging the pixel values of the obliquely adjacent no-parallax pixels $G_N$ $P_{-1-1}$, $P_{2-1}$, $P_{-12}$, $P_{22}$. Here, the pixel positions outside the primitive lattice of 64×64 pixels are represented using a negative index. In a similar manner, the pixel value for an empty pixel position $P_{55}$ is calculated by averaging the pixel values of the obliquely adjacent no-parallax pixels $G_N$ $P_{44}$, $P_{64}$, $P_{46}$ and $P_{66}$. On the other hand, for example, the pixel value for an empty pixel position $P_{27}$ is calculated by averaging the pixel values of horizontally and vertically adjacent no-parallax pixels $G_N$ $P_{17}$, $P_{26}$, $P_{37}$ and $P_{28}$. The pixel value for an empty pixel position $P_{52}$ is calculated by averaging the pixel values of horizontally and downwardly adjacent no-parallax pixels $G_N$ $P_{42}$, $P_{62}$, and $P_{53}$.

The image processor 205 performs interpolation on all of the empty pixel positions by averaging the pixel values of adjacent no-parallax pixels $G_N$ to produce $G_N$ plane data as shown in the bottom left drawing in FIG. 9. Note that the image processor 205 may perform another interpolation using the pixel values calculated by the interpolation, or may perform interpolation using only the output values present in the raw original image data.

To produce the $R_N$ plane data, the image processor 205 first produces the $R_0$ plane data by removing the pixel values, except for the pixel values of the no-parallax pixels $R_N$, from all of the output values of the image sensor 100 and creating empty pixel positions. The image processor 205 then calculates the pixel values for the empty pixel positions by means of interpolation based on the pixel values of the surrounding no-parallax pixels $R_N$. For example, the pixel value for an empty pixel position $P_{63}$ is calculated by averaging the pixel values of the no-parallax pixels $R_N$ $P_{43}$, $P_{61}$, $P_{83}$, $P_{65}$ that are vertically and horizontally adjacent to the empty pixel position $P_{63}$ with one pixel position placed therebetween. In a similar manner, the pixel value for an empty pixel position $P_{27}$ is calculated by averaging the pixel values of the no-parallax pixels $R_N R_{-17} P_{25}$, $P_{47}$, $P_{29}$ that are vertically and horizontally adjacent to the empty pixel position $P_{27}$ with one pixel position placed therebetween. On the other hand, for example, the pixel value for an empty pixel position $P_{12}$ is calculated by averaging the pixel values of obliquely adjacent no-parallax pixels $R_N$ $P_{-11}$, $P_{21}$, $P_{-13}$ and $P_{23}$. The image processor 205 performs interpolation on all of the empty pixel positions by averaging the pixel values of adjacent no-parallax pixels $R_N$ to produce $R_N$ plane data as shown in the bottom middle drawing in FIG. 9.

To produce the $B_N$ plane data, the image processor 205 first produces the $B_0$ plane data by removing the pixel values, except for the pixel values of the no-parallax pixels $B_N$, from all of the output values of the image sensor 100 and creating empty pixel positions. The image processor 205 then calculates the pixel values for the empty pixel positions by means of interpolation based on the pixel values of the surrounding no-parallax pixels $B_N$. For example, the pixel value for an empty pixel position $P_{32}$ is calculated by averaging the pixel values of the no-parallax pixels $B_N$ $P_{12}$, $P_{3\text{-}1}$, $P_{52}$, $P_{34}$ that are vertically and horizontally adjacent to the empty pixel position $P_{32}$ with one pixel position placed therebetween. In a similar manner, the pixel value for an empty pixel position $P_{76}$ is calculated by averaging the pixel values of the no-parallax pixels $B_N$ $P_{56}$ $P_{74}$, $P_{96}$, $P_{78}$ that are vertically and horizontally adjacent to the empty pixel position $P_{76}$ with one pixel position placed therebetween. On the other hand, for example, the pixel value for an empty pixel position $P_{27}$ is calculated by averaging the pixel values of obliquely adjacent no-parallax pixels $B_N P_{16}$, $P_{36}$, $P_{18}$ and $P_{38}$. The image processor 205 performs interpolation on all of the empty pixel positions by averaging the pixel values of adjacent no-parallax pixels $B_N$ to produce $B_N$ plane data as shown in the bottom right drawing in FIG. 9.

3. A Provisional Parallax Image is Produced.

Figure 10:
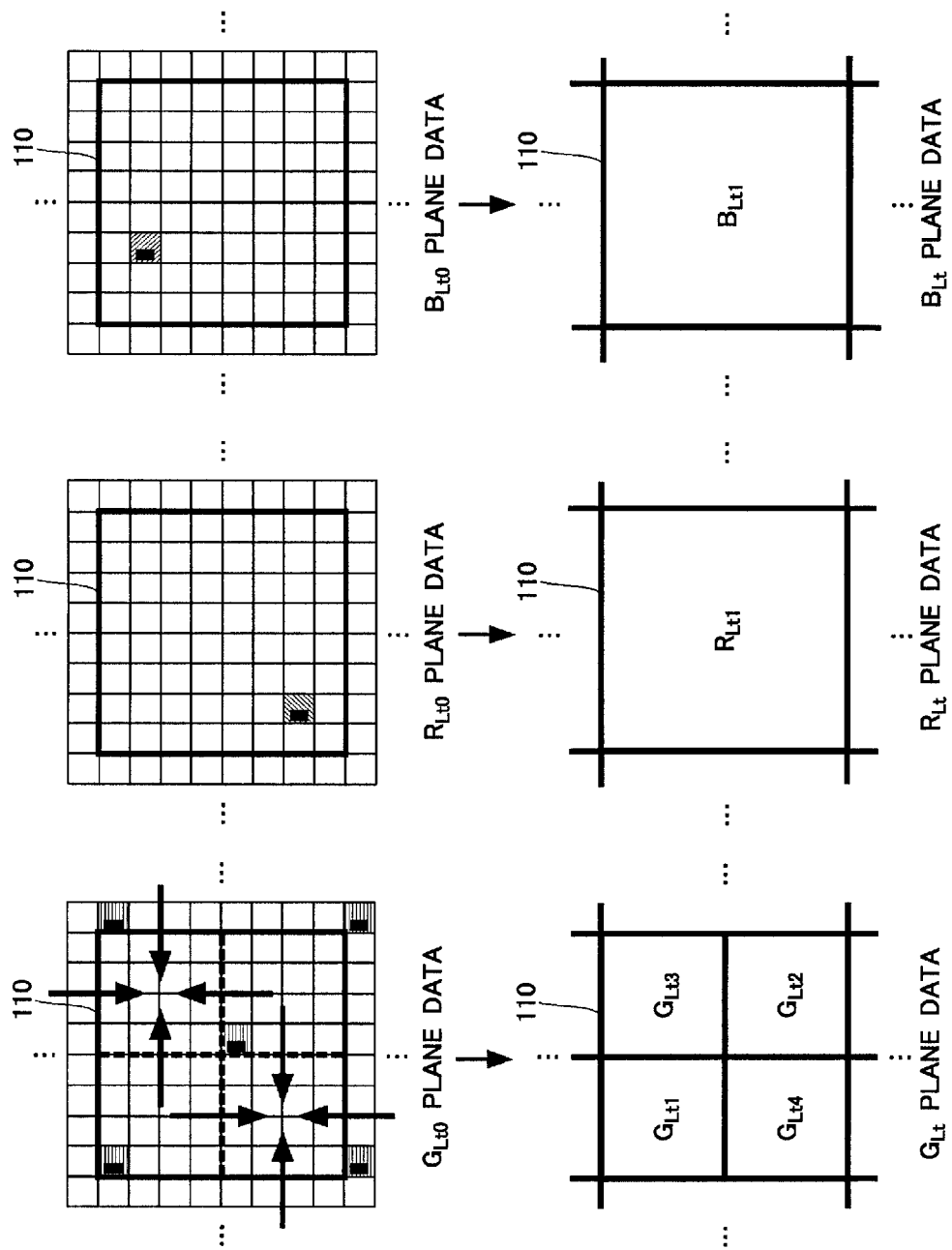
FIG. 10 illustrates, as an example, how to produce $G_{Lt}$ plane data, $B_{Lt}$ plane data, and $R_{Lt}$ plane data, which are left parallax image data.

FIG. 10 illustrates, as an example, how to produce $G_{Lt}$ plane data, $R_{Lt}$ plane data, and $B_{Lt}$ plane data, which are left parallax image data.

To produce the $G_{Lt}$ plane data, the image processor 205 produces the $G_{Lt0}$ plane data by removing the pixel values, except for the pixel values of the $G_{Lt}$ pixels, from all of the output values of the image sensor 100 and creating empty pixel positions. As a result, two pixel values $P_{11}$ and $P_{55}$ are left in the repeating pattern 110. The repeating pattern 110 is vertically and horizontally divided into four portions. The pixel values of the 16 pixels in the upper left portion are represented by the output value $G_{Lt1}$ at $P_{11}$, and the pixel values of the 16 pixels in the lower right portion are represented by the output value $G_{Lt2}$ at $P_{55}$. The pixel value $G_{Lt3}$ for the 16 pixels in the upper right portion and the pixel value $G_{Lt4}$ for the 16 pixels in the lower left portion are interpolated by averaging the surrounding or vertically and horizontally adjacent representative values. In other words, the $G_{Lt0}$ plane data has one value per 16 pixels. This is a method combining, generally speaking, the nearest neighbor interpolation and the bilinear interpolation. More preferably, the bilinear interpolation may be used alone, where the pixel value for an empty pixel position is interpolated by averaging neighboring pixel values in accordance with their distances. In the above-described manner, the image processor 205 produces the $G_{Lt}$ plane data.

To produce the $R_{Lt}$ plane data, the image processor 205 produces the $R_{Lt0}$ plane data by removing the pixel values, except for the pixel value of the $R_{Lt}$ pixel, from all of the output values of the image sensor 100 and creating empty pixel positions. As a result, a pixel value $R_{Lt1}$ at $P_{27}$ is left in the repeating pattern 110. The image processor 205 produces the $R_{Lt}$ plane data by using the pixel value $R_{Lt1}$ as the representative value of the 64 pixels of the repeating pattern 110. This is the nearest neighbor interpolation, but the bilinear interpolation is more preferable.

Likewise, to produce the $B_{Lt}$ plane data, the image processor 205 produces the $B_{Lt0}$ plane data by removing the pixel values, except for the pixel value of the $B_{Lt}$ pixel, from all of the output values of the image sensor 100 and creating empty pixel positions. As a result, a pixel value $B_{Lt1}$ at $P_{32}$ is left in the repeating pattern 110. The image processor 205 produces the $B_{Lt}$ plane data by using the pixel value $B_{Lt1}$ as the representative value of the 64 pixels of the repeating pattern 110. This is the nearest neighbor interpolation, but the bilinear interpolation is more preferable.

In the above-described manner, the image processor 205 can produce the $G_{Lt}$ plane data, $R_{Lt}$ plane data, and $B_{Lt}$ plane data, which have a lower resolution than the $G_N$ plane data, $R_N$ plane data and $B_N$ plane data, which are 2D image data.

Figure 11:
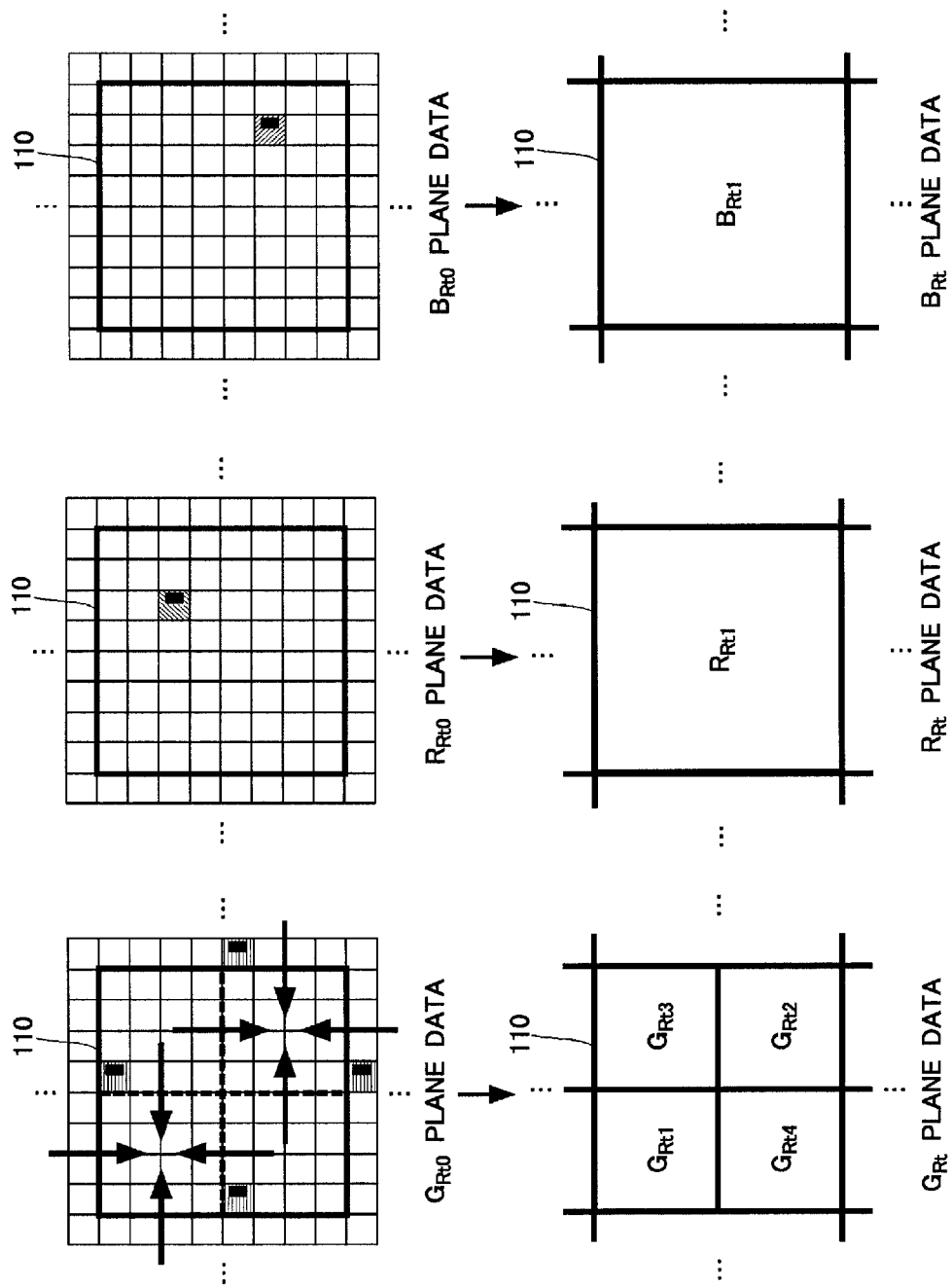
FIG. 11 illustrates, as an example, how to produce $G_{Rt}$ plane data, $B_{Rt}$ plane data, and $R_{Rt}$ plane data, which are right parallax image data.

FIG. 11 illustrates, as an example, how to produce $G_{Rt}$ plane data, $R_{Rt}$ plane data, and $B_{Rt}$ plane data, which are right parallax image data.

To produce the $G_{Rt}$ plane data, the image processor 205 produces the $G_{Rt0}$ plane data by removing the pixel values, except for the pixel values of the $G_{Rt}$ pixels, from all of the output values of the image sensor 100 and creating empty pixel positions. As a result, two pixel values $P_{51}$ and $P_{15}$ are left in the repeating pattern 110. The repeating pattern 110 is vertically and horizontally divided into four portions. The pixel values of the 16 pixels in the upper right portion are represented by the output value $G_{Rt3}$ at $P_{51}$, and the pixel values of the 16 pixels in the lower left portion are represented by the output value $G_{Rt4}$ at $P_{15}$. The pixel value $G_{Rt1}$ for the 16 pixels in the upper left portion and the pixel value $G_{Rt2}$ for the 16 pixels in the lower right portion are calculated by interpolation by averaging the surrounding or vertically and horizontally adjacent representative values. In other words, the $G_{Rt}$ plane data has one value per 16 pixels. This is a method combining, generally speaking, the nearest neighbor interpolation and the bilinear interpolation. More preferably, the bilinear interpolation may be used alone, where the pixel value for an empty pixel position is interpolated by averaging neighboring pixel values in accordance with their distances. In the above-described manner, the image processor 205 produces the $G_{Rt}$ plane data.

To produce the $R_{Rt}$ plane data, the image processor 205 produces the $R_{Rt0}$ plane data by removing the pixel values, except for the pixel value of the $R_{Rt}$ pixel, from all of the output values of the image sensor 100 and creating empty pixel positions. As a result, a pixel value $R_{Rt1}$ at $P_{63}$ is left in the repeating pattern 110. The image processor 205 produces the $R_{Rt}$ plane data by using the pixel value $R_{Rt1}$ as the representative value of the 64 pixels of the repeating pattern 110. This is the nearest neighbor interpolation, but the bilinear interpolation is more preferable.

Likewise, to produce the $B_{Rt}$ plane data, the image processor 205 produces the $B_{Rt0}$ plane data by removing the pixel values, except for the pixel value of the $B_{Rt}$ pixel, from all of the output values of the image sensor 100 and creating empty pixel positions. As a result, a pixel value $B_{Rt1}$ at $P_{76}$ is left in the repeating pattern 110. The image processor 205 produces the $B_{Rt}$ plane data by using the pixel value $B_{Rt1}$ as the representative value of the 64 pixels of the repeating pattern 110. This is the nearest neighbor interpolation, but the bilinear interpolation is more preferable.

In the above-described manner, the image processor 205 can produce the $G_{Rt}$ plane data, $R_{Rt}$ plane data, and $B_{Rt}$ plane data, which have a lower resolution than the $G_N$ plane data, $R_N$ plane data and $B_N$ plane data, which are 2D image data. The nearest neighbor interpolation and bilinear interpolation described above may be replaced with the bicubic interpolation.

In the present embodiment the image processor 205 uses nine pieces of plane data shown on the bottom side in FIGS. 9 to 11 to produce left-viewpoint color image data and right-viewpoint color image data. The following first describes the basis on which such color image data are produced before describing the specific operations.

Figure 12A:
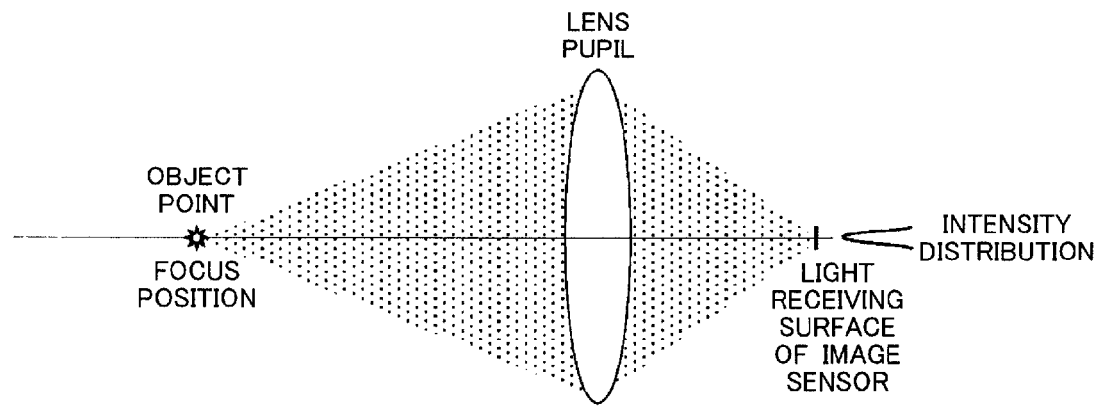
FIGS. 12A, 12B and 12C illustrate the concept of defocusing.
Figure 12B:
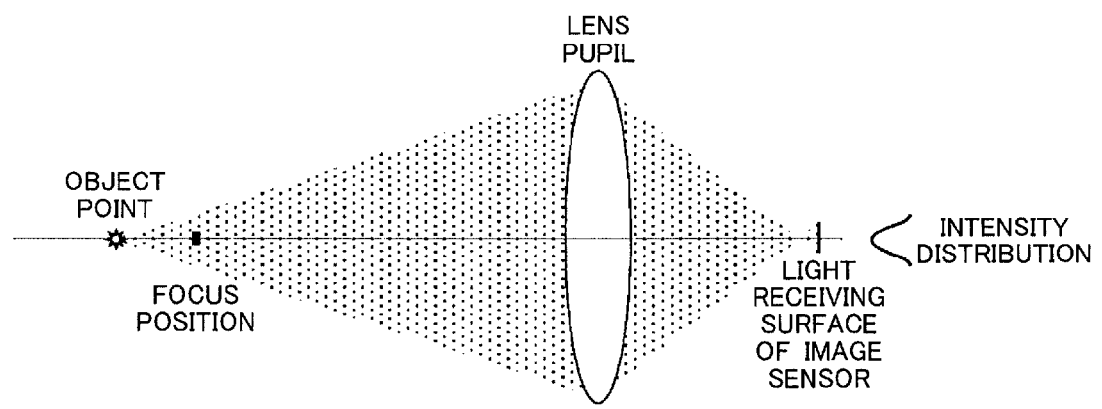
Figure 12C:
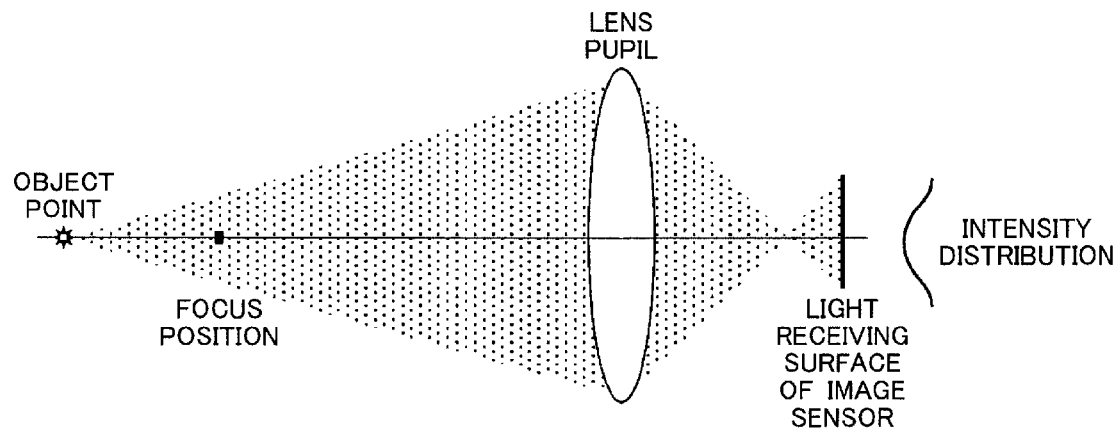

FIGS. 12A to 12C illustrate the concept of defocusing. As shown in FIG. 12A, when an object point, which is a subject, is at a focus position, the subject luminous flux that passes through a lens pupil and reaches the light receiving surface of an image sensor exhibits a steep optical intensity distribution the center of which coincides with the pixel of the corresponding image point. In other words, if a no-parallax pixel that receives the entire effective luminous flux passing through the lens pupil is arranged in the vicinity of the image point, the pixel corresponding to the image point has the highest output value and the surrounding pixels have radically lowered output values.

On the other hand, as shown in FIG. 12B, when the object point is off the focus position, the subject luminous flux exhibits a less steep optical intensity distribution at the light receiving surface of the image sensor, when compared with the case where the object point is at the focus position. Stated differently, such a distribution is observed that the pixel of the corresponding image point has a lowered output value, and more surrounding pixels have output values.

When the object point is further off the focus position as shown in FIG. 12C, the subject luminous flux exhibits a further less steep optical intensity distribution at the light receiving surface of the image sensor. Stated differently, such a distribution is observed that the pixel of the corresponding image point has a further lowered output value, and further more surrounding pixels have output values.

Figure 13A:
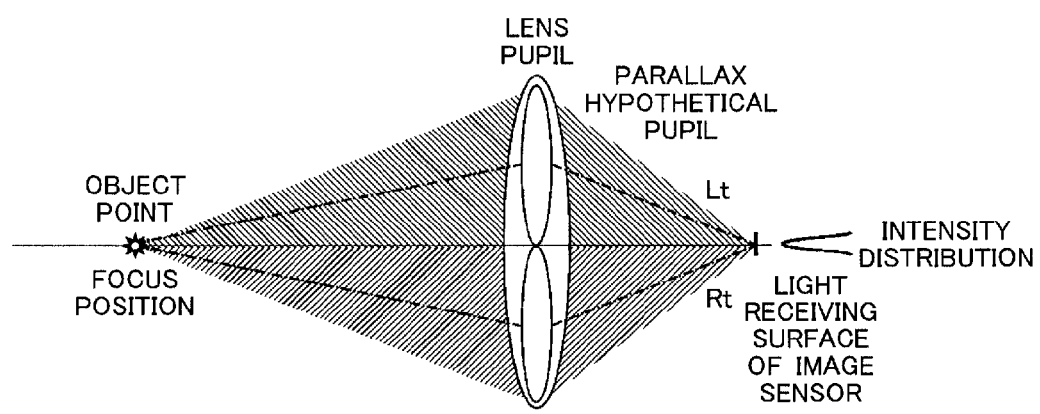
FIGS. 13A, 13B and 13C illustrate the concept of defocusing for a parallax pixel.
Figure 13B:
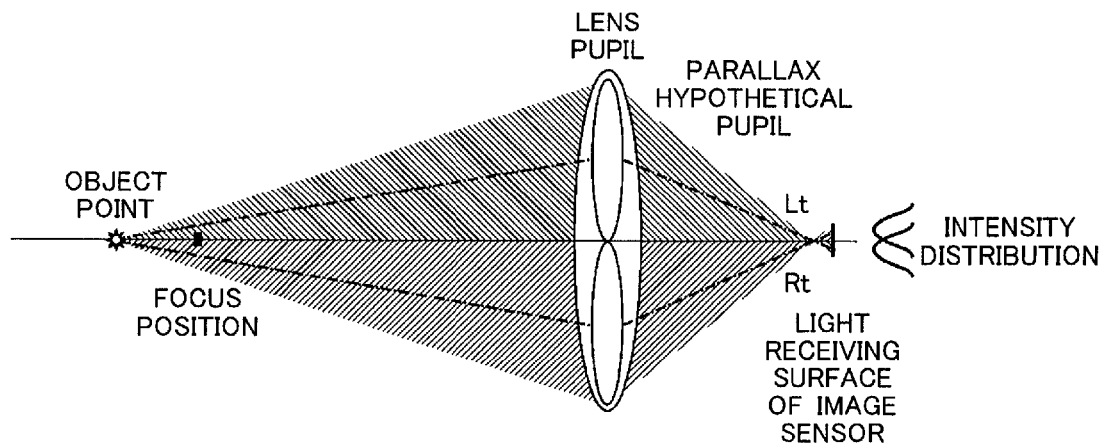
Figure 13C:
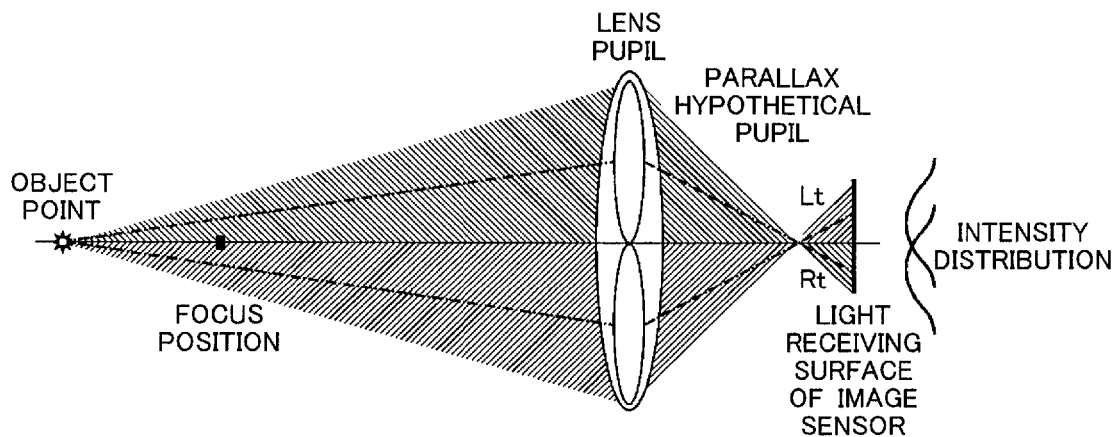

The following illustrates the concept of defocusing when parallax Lt and Rt pixels receive light. FIGS. 13A to 13C illustrate the concept of defocusing for parallax pixels. A parallax Lt pixel and a parallax Rt pixel receive subject luminous fluxes from two parallax hypothetical pupils that are set symmetrically with respect to the optical axis as the partial regions of a lens pupil.

When an object point, which is a subject, is at a focus position as shown in FIG. 13A, both of the subject luminous flux passing through the respective parallax hypothetical pupils exhibit a steep optical intensity distribution the center of which coincides with the pixel of the corresponding image point. If the parallax Lt pixel is arranged in the vicinity of the image point, the pixel corresponding to the image point has the highest output value and the surrounding pixels have radically lowered output values. If the parallax Rt pixel is arranged in the vicinity of the image point, the pixel corresponding to the image point also has the highest output value and the surrounding pixels also have radically lowered output values. Thus, irrespective of which of the parallax hypothetical pupils the subject luminous flux passes through, such a distribution is observed that the pixel corresponding to the image point has the highest output value and the surrounding pixels have radically lowered output values, and the respective distributions match with each other.

On the other hand, if the object point is off the focus position as shown in FIG. 13B, the peak of the optical intensity distribution exhibited by the parallax Lt pixel appears at a position shifted in one direction from the pixel corresponding to the image point and has a lowered output value, when compared with the case where the object point is at the focus position. Furthermore, more pixels have output values. The peak of the optical intensity distribution exhibited by the parallax Rt pixel appears at a position shifted, from the pixel corresponding to the image point, in the opposite direction by the same distance to the peak of the optical intensity distribution exhibited by the parallax Lt pixel and has a lowered output value in a similar manner. Likewise, more pixels have output values. Thus, the identical optical intensity distributions that are less steep than the case where the object point is at the focus position are spaced away by the same distance from the pixel corresponding to the image point. When the object point is further off the focus position as shown in FIG. 13C, the identical optical intensity distributions that are further less steep are further spaced away from the pixel corresponding to the image point when compared with the case shown in FIG. 13B. To sum up, as the object point is shifted away from the focus position, the amount of blur and the disparity increase.

Figure 14A:
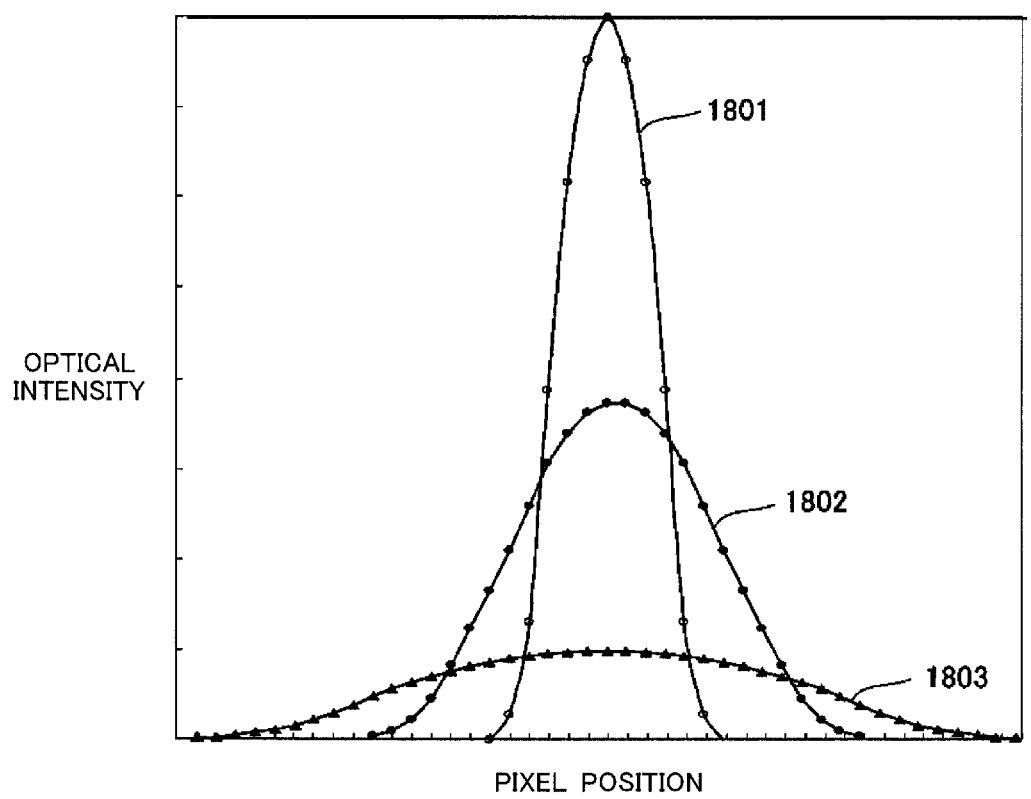
FIGS. 14A and 14B illustrate the optical intensity distributions for a no-parallax pixel and a parallax pixel.
Figure 14B:
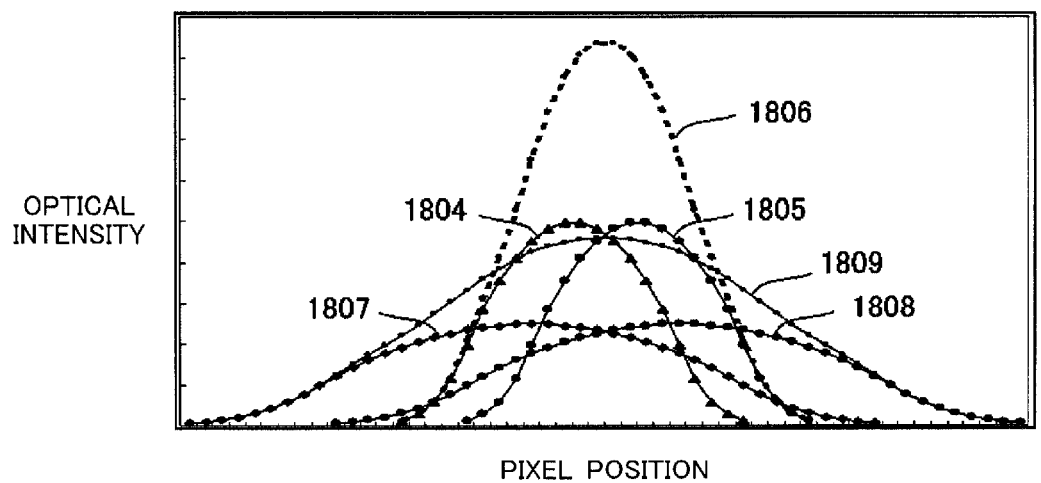

The change in optical intensity distribution illustrated in FIGS. 12A to 12C and the change in optical intensity distribution illustrated in FIGS. 13A to 13C are respectively represented by graphs in FIGS. 14A and 14B. In FIGS. 14A and 14B, the horizontal axis represents the pixel position and the center position represents the pixel position corresponding to the image point. In addition, the vertical axis represents the output value of each pixel, which is substantially in proportion to the optical intensity and thus represented as the optical intensity in FIGS. 14A and 14B.

FIG. 14A is a graph showing the change in optical intensity distribution illustrated in FIGS. 12A to 12C. A distribution curve 1801 represents the optical intensity distribution corresponding to FIG. 12A and the most steep case. A distribution curve 1802 represents the optical intensity distribution corresponding to FIG. 12B, and a distribution curve 1803 represents the optical intensity distribution corresponding to FIG. 12C. When the distribution curves 1802 and 1803 are compared with the distribution curve 1801, it can be seen that the peak value gradually drops and the distribution broadens.

FIG. 14B is a graph showing the change in optical intensity distribution illustrated in FIGS. 13A to 13C. Distribution curves 1804 and 1805 respectively represent the optical intensity distributions of the parallax Lt and Rt pixels shown in FIG. 13B. As seen from FIG. 14B, these distributions are line-symmetrically shaped with respect to the center position. A composite distribution curve 1806 resulting from adding these distributions together is similarly shaped to the distribution curve 1802 corresponding to the case of FIG. 12B, which shows a similar defocused state to FIG. 13B.

Distribution curves 1807 and 1808 respectively represent the optical intensity distributions of the parallax Lt and Rt pixels shown in FIG. 13C. As seen from FIG. 14B, these distributions are also line-symmetrically shaped with respect to the center position. A composite distribution curve 1809 resulting from adding these distributions together is similarly shaped to the distribution curve 1803 corresponding to the case of FIG. 12C, which shows a similar defocused state to FIG. 13C.

4. An Actual Parallax Image is Produced.

The present embodiment exploits such properties of the optical intensity distributions to produce high-definition left-viewpoint color image data and high-definition right-viewpoint color image data from the nine pieces of plane data shown in FIGS. 9 to 11. To be specific, the image processor 205 superimposes the parallax components of the parallax images shown in FIGS. 10 and 11 onto the no-parallax images shown in FIG. 9 to produce high-definition left and right color image data. This production process is referred to as parallax modulation.

The parallax modulation can produce high-definition left-viewpoint color image data ($R'_{Lt}$ plane data, $G'_{Lt}$ plane data and $B'_{Lt}$ plane data) and high-definition right-viewpoint color image data ($R'_{Rt}$ plane data, $G'_{Rt}$ plane data and $B'_{Rt}$ plane data) from the left-viewpoint color image data ($G_{Lt}$ plane data, $R_{Lt}$ plane data and $B_{Lt}$ plane data) and the right-viewpoint color image data ($G_{Rt}$ plane data, $R_{Rt}$ plane data and $B_{Rt}$ plane data) shown in FIGS. 10 and 11.

Figure 15:
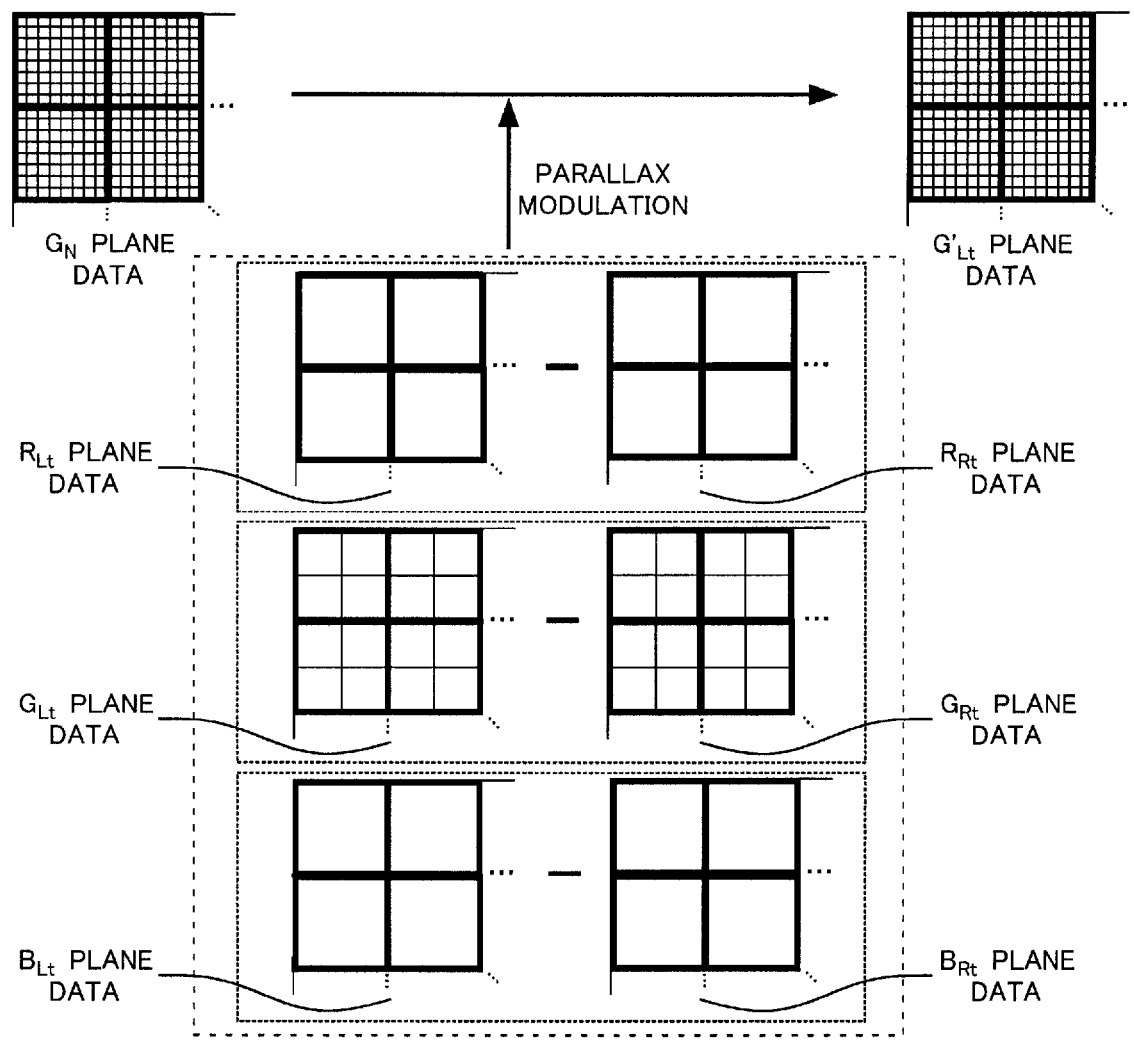
FIG. 15 is a conceptual view to illustrate how to produce high-definition color parallax plane data from high-definition 2D image data.

FIG. 15 is a conceptual view to illustrate how to produce high-definition color parallax plane data from high-definition 2D image data. To be specific, FIG. 15 shows how to produce $G'_{Lt}$ plane data, which is a green parallax plane of color parallax planes.

The $G'_{Lt}$ plane data is produced based on, in addition to the $G_N$ plane data, which is 2D image data, the $R_{Lt}$ plane data, $G_{Lt}$ plane data and $B_{Lt}$ plane data, which are left parallax pixel data, and $R_{Rt}$ plane data, $G_{Rt}$ plane data and $B_{Rt}$ plane data, which are right parallax pixel data. For example, to calculate a pixel value $G'L_{Lt}(x_m, y_n)$ at a target pixel position $(x_m, y_n)$ of the $U_{Lt}$ plane data, the pixel value extracting unit 231 of the image processor 205 first extracts the pixel value $G_N(x_m, y_n)$ from the same pixel position $(x_m, y_n)$ in the $G_N$ plane data.

Here, the pixel value extracting unit 231 also extracts the pixel value $R_{Lt}(x_m, y_n)$ from the same pixel position $(x_m, y_n)$ of the $R_{Lt}$ plane data. Likewise, the pixel value extracting unit 231 also extracts the pixel value $R_{Rt}(x_m, y_n)$ from the same pixel position $(x_m, y_n)$ of the $R_{Rt}$ plane data. Then, the calculating unit 233 of the image processor 205 calculates the difference between the pixel value $R_{Lt}(x_m, y_n)$ and the pixel value $R_{Rt}(x_m, y_n)$.

In addition, the pixel value extracting unit 231 also extracts the pixel value $G_{Lt}(x_m, y_n)$ corresponding to the same pixel position $(x_m, y_n)$ of the $G_{Lt}$ plane data. Likewise, the pixel value extracting unit 231 also extracts the pixel value $G_{Rt}(x_m, y_n)$ corresponding to the same pixel position $(x_m, y_n)$ of the $G_{Rt}$ plane data. Then, the calculating unit 233 of the image processor 205 calculates the difference between the pixel value $G_{Lt}(x_m, y_n)$ and the pixel value $G_{Rt}(x_m, y_n)$.

Furthermore, the pixel value extracting unit 231 also extracts the pixel value $B_{Lt}(x_m, y_n)$ of the same pixel position $(x_m, y_n)$ of the $B_{Lt}$ plane data, as in the $R_{Lt}$ plane data. Likewise, the pixel value extracting unit 231 also extracts the pixel value $B_{Rt}(x_m, Y_n)$ of the same pixel position $(x_m, y_n)$ of the $B_{Rt}$ plane data. Then, the calculating unit 233 of the image processor 205 calculates the difference between the pixel value $B_{Lt}(x_m, y_n)$ and the pixel value $B_{Rt}(x_m, y_n)$.

The calculating unit 233 of the image processor 205 calculates $G'_{Lt}(x_m, y_n)$ from $G_{Lt}(x_m, y_n)$ using the difference between the pixel value $R_{Lt}(x_m, y_n)$ and the pixel value $R_{Rt}(x_m, y_n)$, the difference between the pixel value $G_{Rt}(x_m, y_n)$ and the pixel value $G_{Rt}(x_m, y_n)$ and the difference between the pixel value $B_{Lt}(x_m, y_n)$ and the pixel value $B_{Rt}(x_m, y_n)$. To be specific, the calculating unit 233 of the image processor 205 multiplies, with a proportionality factor, the difference between the pixel value $R_{Rt}(x_m, y_n)$ and the pixel value $R_{Rt}(x_m, y_n)$, the difference between the pixel value $G_{Rt}(x_m, y_n)$ and the pixel value $G_{Rt}(x_m, y_n)$ and the difference between the pixel value $B_{Lt}(x_m, y_n)$ and the pixel value $B_{Rt}(x_m, y_n)$ and then adds together the results of the multiplications. Subsequently, the calculating unit 233 adds the resulting value to $G_N(x_m, y_n)$, in other words, performs parallax modulation, to calculate the pixel value $G'_{Lt}(x_m, y_n)$. Stated differently, the calculating unit 233 of the image processor 205 calculates the pixel value $G'_{Lt}(x_m, y_n)$ in such a manner that the difference between the to-be-calculated pixel value $G'_{Lt}(x_m, y_n)$ and the extracted pixel value $G_N(x_m, y_n)$ maintains correlation with a value obtained by multiplying with a proportionality factor the differences in pixel value between the left and right parallax images for the R, G and B color components and adding together the results of the multiplications. Specifically speaking, the calculating unit 233 calculates the pixel value $G'_{Lt}(x_m, y_n)$ using the following Expression 1. Referring to the relation between the G plane and the R plane, the following relation is true.

$$G'_{Lt}(x,y) - R_{Lt}(x,y) = G_N(x,y) - [R_{Lt}(x,y) + R_{Rt}(x,y)]/2 \approx G_N(x,y) - R_N(x,y)$$

Thus, the difference in variation between the no-parallax images of the G plane and the R plane is reflected in the to-be-calculated $G'_{Lt}(x,y)$ as if this difference is present between the left parallax images of the G plane and the R plane. The same is true for the G and B components, and their variations or high frequency components are reflected in $G'_{Lt}(x,y)$.

$$G'_{Lt}(x,y) = G_N(x,y) + \frac{R_{Lt}(x,y) - R_{Rt}(x,y)}{2} + \frac{G_{Lt}(x,y) - G_{Rt}(x,y)}{2} + \frac{B_{Lt}(x,y) - B_{Rt}(x,y)}{2} \quad \text{Expression 1}$$

In the above-described manner, parallax modulation can be applied to the pixel value $G_N$ using the difference between the left and right parallax images. The image processor 205 sequentially performs the above-described calculation on the pixels from the leftmost and uppermost pixel (1,1) to the rightmost and lowermost coordinate point $(x_0, y_0)$. In this way, $G'_{Lt}$ plane data can be produced.

In the case of the repeating pattern shown in FIG. 7, the opening 104 is decentered to the left in the parallax Lt pixel with respect to the no-parallax pixel, and the opening 104 is decentered to the right in the parallax Rt pixel with respect to the no-parallax pixel by the same amount as in the parallax Lt pixel. Thus, when the proportionality factor is set to ½ as shown in Expression 1 above, the difference between the to-be-calculated pixel value $G'_{Lt}(x_m, y_n)$ and the extracted pixel value $G_N(x_m, y_n)$ maintains correlation with the sum of the differences in pixel value between the parallax images for the R, G and B color components. In other words, the correlation between (i) the difference between the to-be-calculated pixel value $G'_{Lt}(x_m, y_n)$ and the extracted pixel value $G_N(x_m, y_n)$ and (ii) the result of adding together the differences in pixel value between the parallax images for the R, G and B color components is defined mainly by how much the openings are decentered in the parallax Lt and Rt pixels. In addition, other parameters such as the sizes of the openings and the relation between the openings of the parallax pixels and the opening of the no-parallax pixels may be taken into consideration. In any case, an expression is formulated so as to maintain the defined correlation to calculate the pixel value $G'_{Lt}(x_m, y_n)$. According to the example represented by Expression 1 above, the proportionality factor, which is representative of the correlation, is defined as ½, but the correlation may be appropriately adjusted by, for example, adding a constant as a correction term, in addition to changing the proportionality factor. The above-described relation remains the same whether the to-be-calculated pixel value is any of the pixel values $R'_{Lt}(x_m, y_n)$, $B'_{Lt}(x_m, y_n)$, $R'_{Rt}(x_m, y_n)$, $G'_{Rt}(x_m, y_n)$, and $B'_{Rt}(x_m, y_n)$.

The image processor 205 can use the pixel value extracting unit 231 and the calculating unit 233 to produce the $B'L_{Lt}$ plane data and the $R'L_{Lt}$ plane data, in the same manner as the $G'L_{Lt}$ plane data. To be specific, the image processor 205 extracts the pixel value $B_N(x_m, y_n)$ from the $B_N$ plane data at the same pixel position $(x_m, y_n)$, instead of extracting the pixel value $G_N(x_m, y_n)$ from the $G_N$ plane data at the same pixel position $(x_m, y_n)$ as described above and performs the similar operations. Furthermore, the image processor 205 extracts the pixel value $R_N(x_m, y_n)$ from the $R_N$ plane data at the same pixel position $(x_m, y_n)$, instead of extracting the pixel value $G_N(x_m, y_n)$ from the $G_N$ plane data at the same pixel position $(x_m, y_n)$ as described above and performs the similar operations.

More specifically, the image processor 205 uses the following Expressions 2 and 3 to calculate the $B'_{Lt}$ plane data and the $R'_{Lt}$ plane data.

$$B'_{Lt}(x, y) = B_N(x, y) + \frac{R_{Lt}(x, y) - R_{Rt}(x, y)}{2} + \frac{G_{Lt}(x, y) - G_{Rt}(x, y)}{2} + \frac{B_{Lt}(x, y) - B_{Rt}(x, y)}{2} \quad \text{Expression 2}$$

$$R'_{Lt}(x, y) = R_N(x, y) + \frac{R_{Lt}(x, y) - R_{Rt}(x, y)}{2} + \frac{G_{Lt}(x, y) - G_{Rt}(x, y)}{2} + \frac{B_{Lt}(x, y) - B_{Rt}(x, y)}{2} \quad \text{Expression 3}$$

The image processor 205 can produce the $G'_{Rt}$ plane data, $B'_{Rt}$ plane data and $R'_{Rt}$ plane data, which are right-viewpoint color image data, in the same manner as the left-viewpoint color image data. Specifically speaking, the image processor 205 uses the following Expressions 4, 5 and 6 to calculate the $G'_{Rt}$ plane data, $B'_{Rt}$ plane data and $R'_{Rt}$ plane data.

$$G'_{Rt}(x, y) = G_N(x, y) + \frac{R_{Rt}(x, y) - R_{Lt}(x, y)}{2} + \frac{G_{Rt}(x, y) - G_{Lt}(x, y)}{2} + \frac{B_{Rt}(x, y) - B_{Lt}(x, y)}{2} \quad \text{Expression 4}$$

$$B'_{Rt}(x, y) = B_N(x, y) + \frac{R_{Rt}(x, y) - R_{Lt}(x, y)}{2} + \frac{G_{Rt}(x, y) - G_{Lt}(x, y)}{2} + \frac{B_{Rt}(x, y) - B_{Li}(x, y)}{2} \quad \text{Expression 5}$$

$$R'_{Rt}(x, y) = R_N(x, y) + \frac{R_{Rt}(x, y) - R_{Lt}(x, y)}{2} + \frac{G_{Rt}(x, y) - G_{Lt}(x, y)}{2} + \frac{B_{Rt}(x, y) - B_{Lt}(x, y)}{2} \quad \text{Expression 6}$$

In the above-described manner, the image processor 205 can produce left and right parallax color images from a no-parallax color image by applying the parallax modulation to the no-parallax color image based on the differences between the left and right parallax images. To be specific, the image processor 205 uses the above-described operations to produce left-viewpoint color image data ($G'_{Lt}$ plane data, $B'_{Lt}$ plane data, $R'_{Lt}$ plane data) and right-viewpoint color image data ($G'_{Rt}$ plane data, $B'_{Rt}$ plane data, $R'_{Rt}$ plane data).

As shown in FIGS. 10 and 11, the plane data of the R, G and B color components have been prepared for both of the left and right parallax image data. However, these pieces of plane data only have a low resolution since one pixel value is provided per 16 or 64 pixels. By using 2D image data having a higher resolution than these pieces of plane data, the left and right parallax image data can achieve a similar spatial resolution to the spatial resolution of the 2D image data. In other words, in Expressions 1 to 6, the second to fourth terms on the right-hand side have a "low-density" resolution. Since the first term on the right-hand side has a "high-density" resolution, however, the left side can be image data having "high-density" resolution.

When the left and right parallax image data are produced based on one of the R, G and B plane data, a problem of color dependence arises. To be specific, when a subject is formed by a particular primary color, no parallax information is obtained from parallax pixels having color filters that do not correspond to the particular primary color. In the present embodiment, as shown in Expressions 1 to 6 described above, the image processor 205 uses all of the R, G and B color components to perform the parallax modulation. Accordingly, when compared with the case where only a single color component is used to perform the parallax modulation, the present embodiment can more accurately reflect the color changes across the color boundaries in the parallax images as parallax information. Thus, the present embodiment can be expected to prevent the occurrence of false colors at the color boundaries in blur regions in which parallax is generated. Here, the pixel values of the R, G and B color components in the parallax images are provided by parallax information of pixels at different pixel positions in the raw data. Accordingly, by using all of the R, G and B color components for the parallax modulation, they complement each other. To be specific, the information regarding the difference in spatial parallax structure between the left and right images, which cannot be provided by a single color component, can be reflected in finally produced parallax images. Thus, the digital camera relating to the present embodiment can produce high-definition left-viewpoint color image data and high-definition right-viewpoint color image data.

Figure 16A:
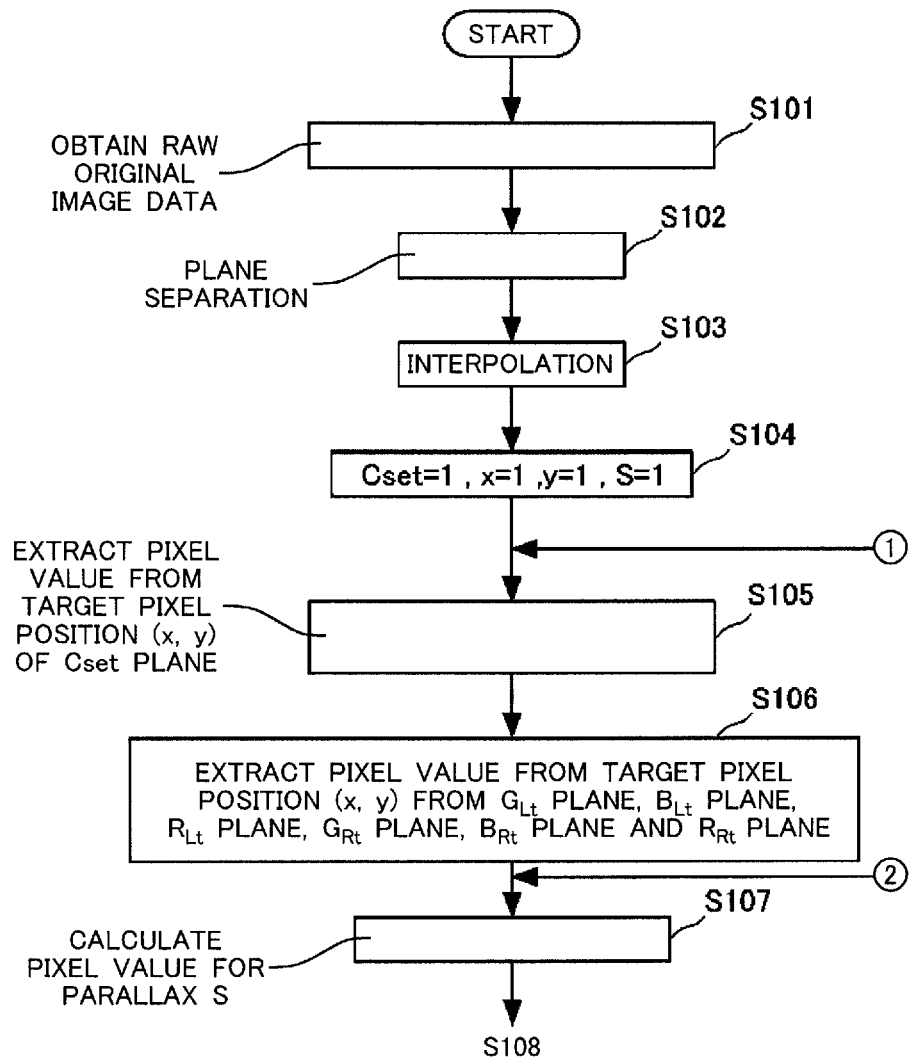
FIGS. 16A and 16B show a flow chart to illustrate how to produce parallax color image data.
Figure 16B:
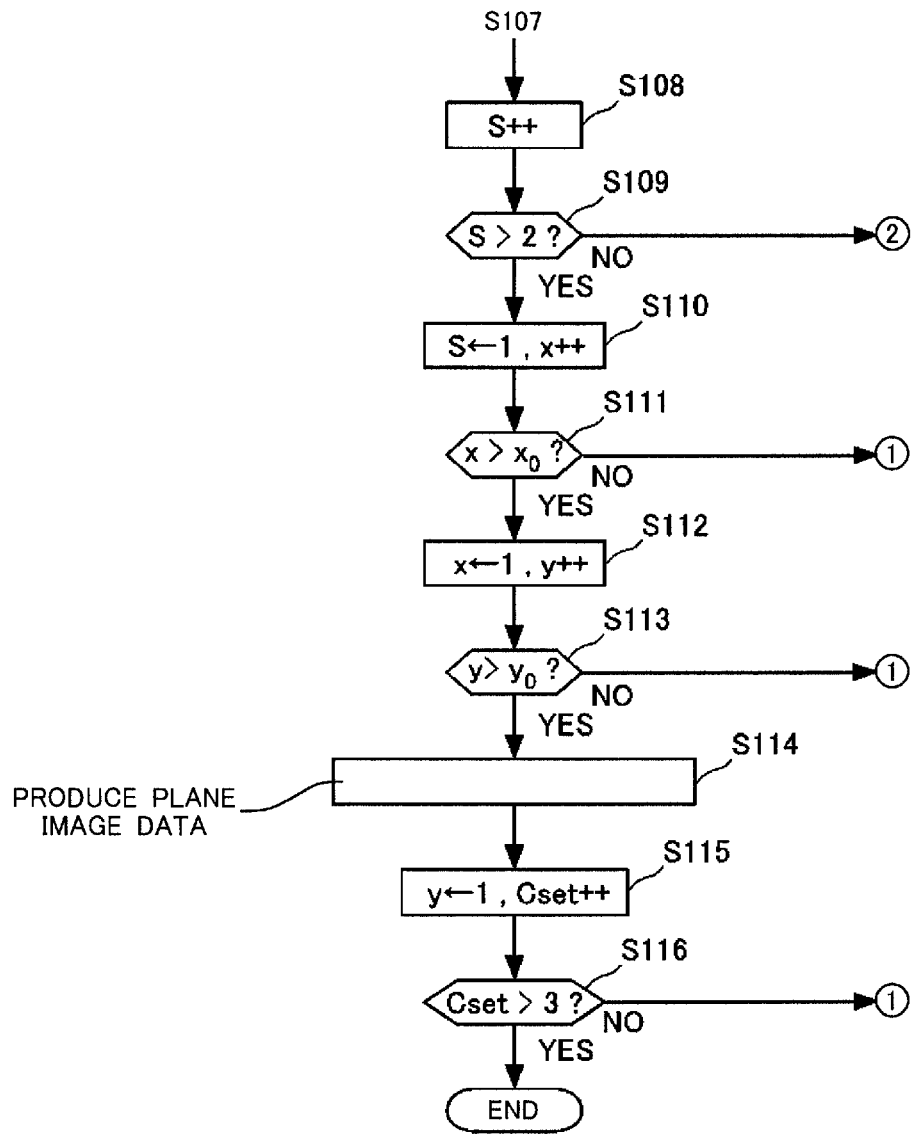

The following describes how to produce parallax color image data from the perspective of the flow of operations. FIGS. 16A and 16B illustrate a flow of operations to produce parallax color image data. The flow may start responsive to an image-capturing operation or to reading of target image data from the memory card 220.

In the step S101, the image processor 205 obtains the raw original image data. In the step S102, the image processor 205 separates the raw original image data into the $G_0$ plane data, $R_0$ plane data and $B_0$ plane data, which are 2D image data, as descried with reference to FIGS. 9 to 11. Likewise, the image processor 205 separates the raw original image data into $G_{Lt0}$ plane data, $R_{Lt0}$ plane data and $B_{Lt0}$ plane data, which are left parallax image data, and into $G_{Rt0}$ plane data, $R_{Rt0}$ plane data and $B_{Rt0}$ plane data, which are right parallax image data. In the step S103, the image processor 205 performs interpolation to interpolate the pixel values at the empty pixel positions in the respective pieces of plane data obtained by the separation. To be specific, the image processor 205 calculates the output values for the empty pixel positions by averaging or the like based on the output values of adjacent pixels, as described with reference to FIGS. 9 to 11.

In the step S104, the image processor 205 initializes variables. To be specific, the value of 1 is assigned to a 2D color variable Cset. The 2D color variable Cset indicates red when the value of 1 is assigned, green when the value of 2 is assigned, and blue when the value of 3 is assigned. In addition, the value of 1 is assigned to x and y, which are coordinate variables. In addition, the value of 1 is assigned to a parallax variable S. The parallax variable S indicates left when the value of 1 is assigned and right when the value of 2 is assigned.

In the step S105, the pixel value extracting unit 231 of the image processor 205 extracts a pixel value from a target pixel position (x, y) in the Cset plane. Furthermore, in the step S106, the pixel value extracting unit 231 extracts pixel values at the target pixel position (x, y) from the $G_{Lt}$ plane data, $R_{Lt}$ plane data and $B_{Lt}$ plane data. Likewise, the pixel value extracting unit 231 extracts pixel values at the target pixel position (x, y) from the $G_{Rt}$ plane data, $R_{Rt}$ plane data and $B_{Rt}$ plane data.

In the step S107, the calculating unit 233 of the image processor 205 calculates the pixel value of the target pixel position (x, y) in accordance with the parallax variable S. For example, in the case of Cset=1, S=1 and the target pixel position of (1, 1), the calculating unit 233 calculates the pixel value for R'$_{Lt}$ (1, 1). To be specific, the calculating unit 233 uses the above-described Expression 3 for the calculation, for example.

In the step S108, the image processor 205 increments the parallax variable S. In the step S109, the image processor 205 judges whether the parallax variable S exceeds 2. If the judgment is negative, the flow goes back to the step S107. If judgment is affirmative, the flow proceeds to the step S110.

In the step S110, the image processor 205 assigns the value of 1 to the parallax variable S and increments the coordinate variable x. In the step S111, the image processor 205 judges whether the coordinate variable x exceeds $x_0$. If the judgment is negative, the flow goes back to the step S105. If the judgment is affirmative, the flow proceeds to the step S112.

In the step S112, the image processor 205 assigns the value of 1 to the coordinate variable x and increments the coordinate variable y. In the step S113, the image processor 205 judges whether the coordinate variable y exceeds y0. If the judgment is negative, the flow goes back to the step S105. If the judgment is affirmative, the flow proceeds to the step S114.

Once the flow has proceeded to the step S114, the image processor 205 has obtained the pixel values of all the pixels for the left and right images for the Cset. Thus, the image processor 205 arranges the obtained pixel values to produce plane image data. For example, when Cset=1, the image processor 205 produces R'$_{Lt}$ plane data and R'$_{Rt}$ plane data.

The flow proceeds to the step S115, and the image processor 205 assigns the value of 1 to the coordinate variable y and increments the color variable Cset. In the step S116, the image processor 205 judges whether the color variable Cset exceeds 3. If the judgment is negative, the flow goes back to the step S105. If the judgment is affirmative, the image processor 205 judges that the left-viewpoint color image data (R'$_{Lt}$ plane data, G'$_{Lt}$ plane data and B'$_{Lt}$ plane data) and the right-viewpoint color image data (the R'$_{Rt}$ plane data, G'$_{Rt}$ plane data and B'$_{Rt}$ plane data) have been completed, and terminates the series of operations.

Figure 17A:
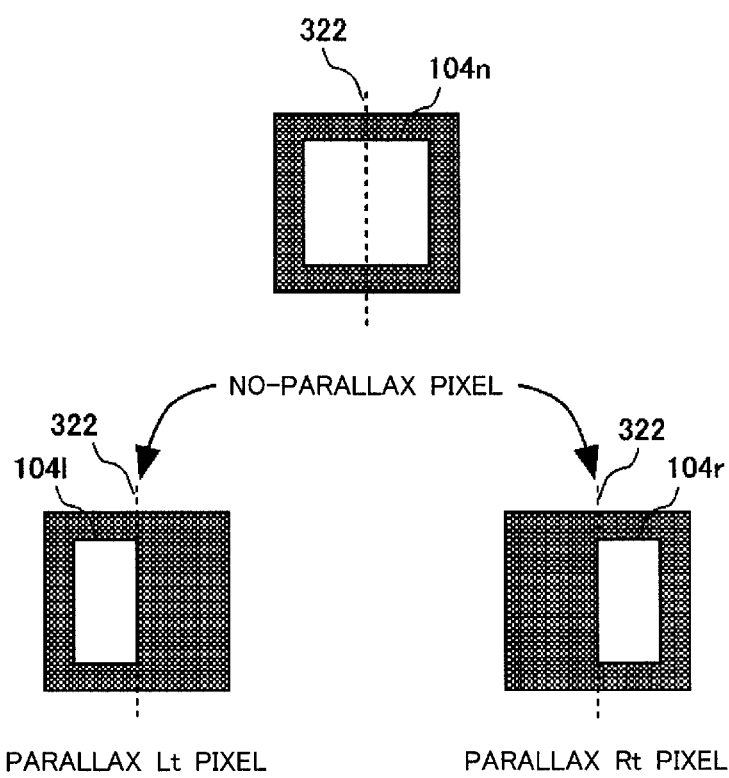
FIGS. 17A and 17B illustrate the shapes of openings.
Figure 17B:
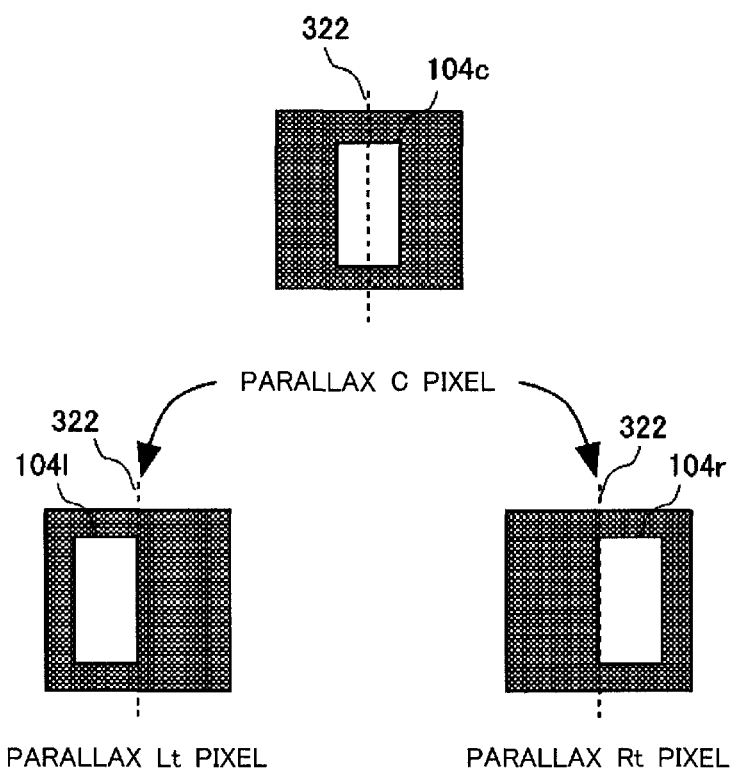

The following describes the shapes of the openings 104. FIGS. 17A and 17B illustrate the opening shapes. FIG. 17A illustrates an example where the shape of the opening 104*l* of the parallax Lt pixel and the shape of the opening 104*r* of the parallax Rt pixel are the same as the shapes obtained by dividing the shape of an opening 104*n* of a no-parallax pixel along a center line 322. In other words, in the example shown in FIG. 17A, the area of the opening 104*n* of the no-parallax pixel is equal to the sum of the area of the opening 104*l* of the parallax Lt pixel and the area of the opening 104*r* of the parallax Rt pixel. The opening 104*l* of the parallax Lt pixel and the opening 104*r* of the parallax Rt pixel are displaced in opposite directions to each other with respect to the hypothetical center line 322 coinciding with the center (pixel center) of the corresponding photoelectric converter elements 108. The openings 104*n*, 104*l* and 104*r* serve as an aperture stop. Thus, the amount of the blur of the no-parallax pixel having the opening 104*n* whose area is twice as large as the opening 104*l* (opening 104*r*) is approximately the same as the sum of the amount of blur of the parallax Lt pixel and the amount of blur of the parallax Rt pixel.

FIG. 17B shows an example where the shape of the opening 104*l* of the parallax Lt pixel, the shape of the opening 104*r* of the parallax Rt pixel and the shape of the opening 104*c* of the parallax C pixel are all the same. Here, the parallax C pixel means a pixel without eccentricity. Strictly speaking, the parallax C pixel is a parallax pixel that outputs a parallax image, considering the fact that the parallax C pixel guides to the photoelectric converter element 108 only the subject luminous flux whose corresponding partial region is the center portion of the pupil. However, a no-parallax pixel is defined herein as a pixel having an opening corresponding to the reference direction. Thus, the parallax C pixel shown in FIG. 17B that has an opening at the center of a photoelectric converter element in the reference direction like the no-parallax pixel shown in FIG. 17A is referred to as a no-parallax pixel. The openings 104*l*, 104*r* and 104*c* have half the area of the opening 104*n* shown in FIG. 17A. Like the case shown in FIG. 17A, the openings 104*l* and 104*r* are in contact with the hypothetical center line 322 coinciding with the center (pixel center) of the photoelectric converter element 108. The openings 104*c*, 104*l* and 104r serve as an aperture stop. Accordingly, the amount of the blur of the parallax C pixel that has the opening 104c having the same shape and area as the opening 104l or 104r is approximately the same as the amount of the blur of the parallax Lt or Rt pixel.

Second Embodiment

The following describes another embodiment employing a different parallax modulation scheme. In a second embodiment, the pixel arrangement is formed by arranging the parallax C pixels, parallax Lt pixels and parallax Rt pixels, and the openings of the parallax C pixels have the same shape as the openings of the parallax Lt pixels and the openings of the parallax Rt pixels as shown in FIGS. 17A and 17B. In this way, the amount of the blur of the parallax C pixels is substantially the same as the amount of the blur of the parallax Lt or Rt pixels. By using the geometric average approach for the parallax modulation, the amount of the blur of the left and right color images after the parallax modulation can be the same as the amount of the blur of the parallax pixels.

The pixel value extracting unit 231 of the image processor 205 extracts a pixel value at a target pixel position from each of the pieces of plane data shown in FIGS. 9 to 11, as described in the first embodiment. For example, when calculating $G'_{Lt}(x_m, y_n)$ from $G_N(x_m, y_n)$, the calculating unit 233 of the image processor 205 calculates $G'_{Lt}(x_m, y_n)$ from $G_N(x_m, y_n)$ using a geometric average between the pixel value $R_{Rt}(x_m, y_n)$ and the pixel value $R_{Rt}(x_m, y_n)$, a geometric average between the pixel value $G_{Lt}(x_m, y_n)$ and the pixel value $G_{Rt}(x_m, y_n)$, and a geometric average between the pixel value $B_{Rt}(x_m, y_n)$ and the pixel value $B_{Rt}(x_m, y_n)$.

To be specific, the calculating unit 233 divides the pixel value $R_{Rt}(x_m, y_n)$ by the geometric average between the pixel value $R_{Rt}(x_m, y_n)$ and the pixel value $R_{Rt}(x_m, y_n)$. Likewise, the calculating unit 233 divides the pixel value $G_{Lt}(x_m, y_n)$ by the geometric average between the pixel value $G_{Lt}(x_m, y_n)$ and the pixel value $G_{Rt}(x_m, y_n)$. Likewise, the calculating unit 233 divides the pixel value $B_{Rt}(x_m, y_n)$ by the geometric average between the pixel value $B_{Rt}(x_m, y_n)$ and the pixel value $B_{Rt}(x_m, y_n)$. The calculating unit 233 then calculates the pixel value $G'_{Lt}(x_m, y_n)$ by multiplying the results of the divisions and multiplying $G_N(x_m, y_n)$ with the result of the multiplication. In other words, the calculating unit 233 calculates the pixel value $G'_{Lt}(x, y)$ in such a manner that the ratio between the pixel value $G'_{Lt}(x, y)$ and the extracted pixel value $G_N(x, y)$ maintains correlation with the value obtained by multiplying together the value obtained by dividing the pixel value $R_{Rt}(x_m, y_n)$ by the geometric average between the pixel value $R_{Rt}(x_m, y_n)$ and the pixel value $R_{Rt}(x_m, y_n)$, the value obtained by dividing the pixel value $G_{Lt}(x_m, y_n)$ by the geometric average between the pixel value $G_{Lt}(x_m, y_n)$ and the pixel value $G_{Rt}(x_m, y_n)$, and the value obtained by dividing the pixel value $B_{Rt}(x_m, y_n)$ by the geometric average between the pixel value $B_{Rt}(x_m, y_n)$ and the pixel value $B_{Rt}(x_m, y_n)$.

To be specific, the calculating unit 233 calculates the pixel value $G'_{Lt}(x, y)$ using the following Expression 7.

$$G'_{Lt}(x, y) = G_N(x, y) \frac{R_{Lt}(x, y)}{\sqrt{R_{Lt}(x, y) \cdot R_{Rt}(x, y)}} \quad \text{Expression 7}$$

$$\frac{G_{Lt}(x, y)}{\sqrt{G_{Lt}(x, y) \cdot G_{Rt}(x, y)}} \frac{B_{Lt}(x, y)}{\sqrt{B_{Lt}(x, y) \cdot B_{Rt}(x, y)}}$$

Expression 7 can be rewritten into the following Expression 8.

$$G'_{Lt}(x, y) = G_N(x, y) \sqrt{\frac{R_{Lt}(x, y)}{R_{Rt}(x, y)}} \sqrt{\frac{G_{Lt}(x, y)}{G_{Rt}(x, y)}} \sqrt{\frac{B_{Lt}(x, y)}{B_{Rt}(x, y)}} \quad \text{Expression 8}$$

As seen from Expression 8, it can be said that the ratio between the pixel value $G'_{Lt}(x, y)$ and the extracted pixel value $G_N(x, y)$ maintains correlation with the value obtained by multiplying together the square roots of the ratios in pixel value between the left and right parallax images for the R, G and B color components. The image processor 205 can produce $B'_{Lt}(x, y)$ and $R'_{Lt}(x, y)$ in a similar manner to $G'_{Lt}(x, y)$. To be specific, the image processor 205 calculates $B'_{Lt}(x, y)$ and $R'_{Lt}(x, y)$ using the following Expressions 9 and 10.

$$B'_{Lt}(x, y) = B_N(x, y) \frac{R_{Lt}(x, y)}{\sqrt{R_{Lt}(x, y) \cdot R_{Rt}(x, y)}} \quad \text{Expression 9}$$

$$\frac{G_{Lt}(x, y)}{\sqrt{G_{Lt}(x, y) \cdot G_{Rt}(x, y)}} \frac{B_{Lt}(x, y)}{\sqrt{B_{Lt}(x, y) \cdot B_{Rt}(x, y)}}$$

$$R'_{Lt}(x, y) = R_N(x, y) \frac{R_{Lt}(x, y)}{\sqrt{R_{Lt}(x, y) \cdot R_{Rt}(x, y)}} \quad \text{Expression 10}$$

$$\frac{G_{Lt}(x, y)}{\sqrt{G_{Lt}(x, y) \cdot G_{Rt}(x, y)}} \frac{B_{Lt}(x, y)}{\sqrt{B_{Lt}(x, y) \cdot B_{Rt}(x, y)}}$$

Expressions 9 and 10 are rewritten into the following Expressions 11 and 12.

$$B'_{Lt}(x, y) = B_N(x, y) \sqrt{\frac{R_{Lt}(x, y)}{R_{Rt}(x, y)}} \sqrt{\frac{G_{Lt}(x, y)}{G_{Rt}(x, y)}} \sqrt{\frac{B_{Lt}(x, y)}{B_{Rt}(x, y)}} \quad \text{Expression 11}$$

$$R'_{Lt}(x, y) = R_N(x, y) \sqrt{\frac{R_{Lt}(x, y)}{R_{Rt}(x, y)}} \sqrt{\frac{G_{Lt}(x, y)}{G_{Rt}(x, y)}} \sqrt{\frac{B_{Lt}(x, y)}{B_{Rt}(x, y)}} \quad \text{Expression 12}$$

The image processor 205 can produce $G'_{Rt}(x, y)$, $B'_{Rt}(x, y)$ and $R'_{Rt}(x, y)$ in a similar manner. To be specific, the image processor 205 calculates $G'_{Rt}(x, y)$, $B'_{Rt}(x, y)$ and $R'_{Rt}(x, y)$ using the following Expressions 13, 14 and 15.

$$G'_{Rt}(x, y) = G_N(x, y) \frac{R_{Rt}(x, y)}{\sqrt{R_{Lt(x,y)} \cdot R_{Rt}(x, y)}} \quad \text{Expression 13}$$

$$\frac{G_{Rt}(x, y)}{\sqrt{G_{Lt}(x, y) \cdot G_{Rt}(x, y)}} \frac{B_{Rt}(x, y)}{\sqrt{B_{Lt}(x, y) \cdot B_{Rt}(x, y)}}$$

$$B'_{Rt}(x, y) = B_N(x, y) \frac{R_{Rt}(x, y)}{\sqrt{R_{Lt}(x, y) \cdot R_{Rt}(x, y)}} \quad \text{Expression 14}$$

$$\frac{G_{Rt}(x, y)}{\sqrt{G_{Lt}(x, y) \cdot G_{Rt}(x, y)}} \frac{B_{Rt}(x, y)}{\sqrt{B_{Lt}(x, y) \cdot B_{Rt}(x, y)}}$$

-continued $$R'_{Rt}(x, y) = R_N(x, y) \frac{R_{Rt}(x, y)}{\sqrt{R_{Lt}(x, y) \cdot R_{Rt}(x, y)}}$$
$$\frac{G_{Rt}(x, y)}{\sqrt{G_{Lt}(x, y) \cdot G_{Rt}(x, y)}} \frac{B_{Rt}(x, y)}{\sqrt{B_{Lt}(x, y) \cdot B_{Rt}(x, y)}}$$

Expression 15

Expressions 13, 14 and 15 are rewritten into the following Expressions 16, 17 and 18.

$$G'_{Rt}(x, y) =$$
$$G_N(x, y) \sqrt{\frac{R_{Rt}(x, y)}{R_{Lt}(x, y)}} \sqrt{\frac{G_{Rt}(x, y)}{G_{Lt}(x, y)}} \sqrt{\frac{B_{Rt}(x, y)}{B_{Lt}(x, y)}}$$

Expression 16

$$B'_{Rt}(x, y) =$$
$$B_N(x, y) \sqrt{\frac{R_{Rt}(x, y)}{R_{Lt}(x, y)}} \sqrt{\frac{G_{Rt}(x, y)}{G_{Lt}(x, y)}} \sqrt{\frac{B_{Rt}(x, y)}{B_{Lt}(x, y)}}$$

Expression 17

$$R'_{Rt}(x, y) =$$
$$R_N(x, y) \sqrt{\frac{R_{Rt}(x, y)}{R_{Lt}(x, y)}} \sqrt{\frac{G_{Rt}(x, y)}{G_{Lt}(x, y)}} \sqrt{\frac{B_{Rt}(x, y)}{B_{Lt}(x, y)}}$$

Expression 18

Third Embodiment

The following describes an embodiment employing a different parallax modulation scheme. In a third embodiment, as described with reference to FIGS. 17A and 17B, the opening of the no-parallax pixel has an area equal to the sum of the area of the opening of the parallax Lt pixel and the area of the opening of the parallax Rt pixel. In this case, the amount of blur of the no-parallax pixel is substantially the same as the sum of the amount of blur of the parallax Lt pixel and the amount of blur of the parallax Rt pixel. When parallax modulation is performed using an arithmetic average, the amount of blur of the left and right color images resulting from the parallax modulation can match the amount of blur of the parallax pixels.

The pixel value extracting unit 231 of the image processor 205 extracts a pixel value at a target pixel position from each of the pieces of plane data shown in FIGS. 9 to 11 as described in the first embodiment. For example, when calculating $G'_{Lt}(x_m, y_n)$ from $G_N(x_m, y_n)$, the calculating unit 233 of the image processor 205 calculates $G'_{Lt}(x_m, y_n)$ from $G_N(x_m, y_n)$ using an arithmetic average between the pixel value $R_{Rt}(x_m, y_n)$ and the pixel value $R_{Rt}(x_m, y_n)$, an arithmetic average between the pixel value $G_{Lt}(x_m, y_n)$ and the pixel value $G_{Rt}(x_m, y_n)$, and an arithmetic average between the pixel value $B_{Rt}(x_m, y_n)$ and the pixel value $B_{Rt}(x_m, y_n)$.

To be specific, the calculating unit 233 divides the pixel value $R_{Rt}(x_m, y_n)$ by the arithmetic average between the pixel value $R_{Rt}(x_m, y_n)$ and the pixel value $R_{Rt}(x_m, y_n)$. Likewise, the calculating unit 233 divides the pixel value $G_{Lt}(x_m, y_n)$ by the arithmetic average between the pixel value $G_{Lt}(x_m, y_n)$ and the pixel value $G_{Rt}(x_m, y_n)$. Likewise, the calculating unit 233 divides the pixel value $B_{Rt}(x_m, y_n)$ by the arithmetic average between the pixel value $B_{Rt}(x_m, y_n)$ and the pixel value $B_{Rt}(x_m, y_n)$. The calculating unit 233 then calculates the pixel value $G'_{Lt}(x_m, y_n)$ by multiplying the results of the divisions and multiplying $G_N(x_m, y_n)$ with the result of the multiplication. In other words, the calculating unit 233 calculates the pixel value $G'_{Lt}(x, y)$ in such a manner that the ratio between the pixel value $G'_{Lt}(x, y)$ and the extracted pixel value $G_N(x, y)$ maintains correlation with the value obtained by multiplying together the value obtained by dividing the pixel value $R_{Rt}(x_m, y_n)$ by the arithmetic average between the pixel value $R_{Rt}(x_m, y_n)$ and the pixel value $R_{Rt}(x_m, y_n)$, the value obtained by dividing the pixel value $G_{Lt}(x_m, y_n)$ by the arithmetic average between the pixel value $G_{Lt}(x_m, y_n)$ and the pixel value $G_{Rt}(x_m, y_n)$, and the value obtained by dividing the pixel value $B_{Rt}(x_m, y_n)$ by the arithmetic average between the pixel value $B_{Rt}(x_m, y_n)$ and the pixel value $B_{Rt}(x_m, y_n)$.

To be specific, the calculating unit 233 calculates the pixel value $G'_{Lt}(x, y)$ using the following Expression 19.

$$G'_{Lt}(x, y) = G_N(x, y) \frac{2R_{Lt}(x, y)}{R_{Lt}(x, y) + R_{Rt}(x, y)}$$
$$\frac{2G_{Lt}(x, y)}{G_{Lt}(x, y) + G_{Rt}(x, y)} \frac{2B_{Lt}(x, y)}{B_{Lt}(x, y) + B_{Rt}(x, y)}$$

Expression 19

The image processor 205 can produce $B'_{Lt}(x, y)$ and $R'_{Lt}(x, y)$ in a similar manner to $G'_{Lt}(x, y)$. To be specific, the image processor 205 calculates $B'_{Lt}(x, y)$ and $R'_{Lt}(x, y)$ using the following Expressions 20 and 21.

$$B'_{Lt}(x, y) = B_N(x, y) \frac{2R_{Lt}(x, y)}{R_{Lt}(x, y) + R_{Rt}(x, y)}$$
$$\frac{2G_{Lt}(x, y)}{G_{Lt}(x, y) + G_{Rt}(x, y)} \frac{2B_{Lt}(x, y)}{B_{Lt}(x, y) + B_{Rt}(x, y)}$$

Expression 20

$$R'_{Lt}(x, y) = R_N(x, y) \frac{2R_{Lt}(x, y)}{R_{Lt}(x, y) + R_{Rt}(x, y)}$$
$$\frac{2G_{Lt}(x, y)}{G_{Lt}(x, y) + G_{Rt}(x, y)} \frac{2B_{Lt}(x, y)}{B_{Lt}(x, y) + B_{Rt}(x, y)}$$

Expression 21

The image processor 205 can produce $G'_{Rt}(x, y)$, $B'_{Rt}(x, y)$ and $R'_{Rt}(x, y)$ in a similar manner. To be specific, the image processor 205 calculates $G'_{Rt}(x, y)$, $B'_{Rt}(x, y)$ and $R'_{Rt}(x, y)$ using the following Expressions 22, 23 and 24.

$$G'_{Rt}(x, y) = G_N(x, y) \frac{2R_{Rt}(x, y)}{R_{Lt}(x, y) + R_{Rt}(x, y)}$$
$$\frac{2G_{Rt}(x, y)}{G_{Lt}(x, y) + G_{Rt}(x, y)} \frac{2B_{Rt}(x, y)}{B_{Lt}(x, y) + B_{Rt}(x, y)}$$

Expression 22

$$B'_{Rt}(x, y) = B_N(x, y) \frac{2R_{Rt}(x, y)}{R_{Lt}(x, y) + R_{Rt}(x, y)}$$
$$\frac{2G_{Rt}(x, y)}{G_{Lt}(x, y) + G_{Rt}(x, y)} \frac{2B_{Rt}(x, y)}{B_{Lt}(x, y) + B_{Rt}(x, y)}$$

Expression 23

$$R'_{Rt}(x, y) = R_N(x, y) \frac{2R_{Rt}(x, y)}{R_{Lt}(x, y) + R_{Rt}(x, y)}$$
$$\frac{2G_{Rt}(x, y)}{G_{Lt}(x, y) + G_{Rt}(x, y)} \frac{2B_{Rt}(x, y)}{B_{Lt}(x, y) + B_{Rt}(x, y)}$$

Expression 24

In the above-described embodiments, the output values in the respective planes are linear gray level values in proportion to the amounts of light received by the photoelectric converter elements of the image sensor 100. This is appropriate when Expressions 7 to 24 are used. However, when Expressions 1 to 6 are used, the values obtained by performing gamma transformation, which is non-linear conversion, may be used. Similar parallax modulation effects can be produced by performing calculations to keep the differences constant according to Expressions 1 to 6 in the gamma space having arbitrary gray level characteristics. The transformation into the gamma space by gray level conversion can be done in the following manner, for example.

The gray level conversion is performed on the raw original image data to transform into the gamma space. Here, the raw original image data is represented as M(x, y) and the raw original image data after transformed into the gamma space is represented as $M^\Gamma$(x, y). Actually, non-linear conversion y=f(x) is performed to provide an output value y responsive to an input value x. The following lists various exemplary characteristics of the non-linear conversion. Here, note that the gray level of the input value and the gray level of the output value are both defined within the range of [0, 1]. The gray level curve (gamma curve) is defined so that the input and output characteristics go through (x,y)=(0,0) and (1,1). When the maximum value of the actually input gray level X is denoted by Xmax and the maximum value of the output gray level Y is denoted by Ymax, x=X/Xmax and y=Y/Ymax. The gray level conversion is performed as represented by the following Expression 25.

$$Y = Y_{max} \cdot f\left(\frac{X}{X_{max}}\right) \quad \text{Expression 25}$$

The following (a) to (c) show exemplary gray level characteristics. In the case of (a), parallax modulation is applied in a gray level space compatible with the human spectral sensitivity characteristics. In the case of (b), uniform noise space is provided in which noise fluctuation is uniform at all of the gray levels, and a stereoscopic image can be obtained that exhibits the smallest noise amplification responsive to the parallax modulation. In the case of (c), the processing performed in the first embodiment is substantially equivalent to the processing performed in the second embodiment. This is because taking the logs of Expressions 7 to 18 is equivalent to the calculations represented by Expressions 1 to 6. Accordingly, the logarithmic conversion makes it possible to perform multiplications and divisions by means of additions and subtractions. In this way, if the gray level characteristics are determined as logarithmic characteristics represented as y=log x instead of linear gray levels represented as y=x, the image processing effects can be between the image processing effects achieved by the first embodiment and the image processing effects achieved by the second or third embodiment employing linear gray levels.

(a) Cubic root gray level characteristics $y=1.16x^{1/3}-0.16$ if $x>0.008856$ \quad Expression 26

$y=1.16\times7.781x$ otherwise \quad Expression 27

(b) Square root gray level characteristics with offsets $$y = \frac{\sqrt{x+\varepsilon} - \sqrt{\varepsilon}}{\sqrt{1+\varepsilon} - \sqrt{\varepsilon}} \quad \text{Expression 28}$$

Here, $\varepsilon$ denotes a positive constant.
(c) Logarithmic characteristics $$y = \frac{\log(kx+1)}{\log(k+1)} \quad \text{Expression 29}$$

After the gamma transformation described above, the operations described with reference to FIG. 15 and the like are performed and inverse gamma transformation (inverse gray level conversion) is performed to restore the original color space. The inverse gray level conversion is performed using the following Expression 30.

$$X = X_{max} \cdot f^{-1}\left(\frac{Y}{Y_{max}}\right) \quad \text{Expression 30}$$

In the above-described embodiments, the repeating pattern 110 is constituted by 64 pixels, including four Bayer arrangements, each of which includes four pixels, respectively in the y-axis direction and in the x-axis direction. The repeating pattern 110 has more no-parallax pixels than parallax pixels. However, the repeating pattern 110 may include approximately equal numbers of no-parallax and parallax pixels, or may include more parallax pixels than no-parallax pixels. The following describes another repeating pattern in which more parallax pixels are arranged than no-parallax pixels.

Figure 18:
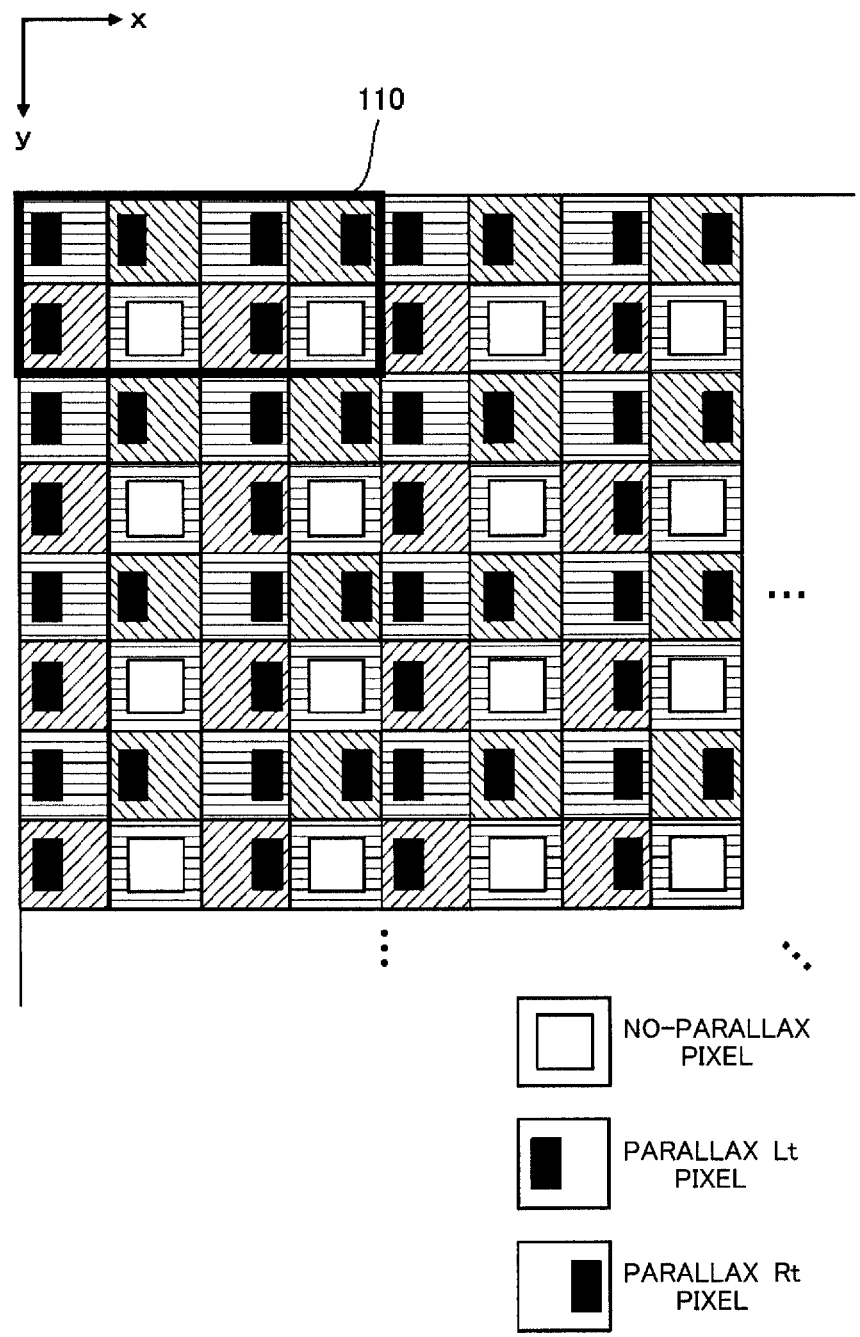
FIG. 18 illustrates an exemplary another variation of the repeating pattern 110.

FIG. 18 shows an exemplary variation of the repeating pattern. In the example shown in FIG. 18, the repeating pattern 110 is formed by eight pixels, including two Bayer arrangements, each of which includes four pixels, arranged side-by-side. In the eight pixels, a parallax Lt pixel is assigned to the Gb pixel in the left Bayer arrangement and a parallax Rt pixel is assigned to the Gb pixel in the right Bayer arrangement. In addition, a parallax Lt pixel is assigned to the R pixel in the left Bayer arrangement and a parallax Rt pixel is assigned to the R pixel in the right Bayer arrangement. Furthermore, a parallax Lt pixel is assigned to the B pixel in the left Bayer arrangement and a parallax Rt pixel is assigned to the B pixel in the right Bayer arrangement. No-parallax pixels are assigned to the two Gr pixels.

The parallax Lt and Rt pixels assigned to the two Gb pixels receive luminous flux emitted from a single micro region of a subject when the subject is at a focus position. The parallax Lt and Rt pixels assigned to the two R pixels receive luminous flux emitted from a single micro region, that is different from the micro region corresponding to the Gb pixels, and the parallax Lt and Rt pixels assigned to the two B pixels receive luminous flux emitted from a single micro region that is different from the micro regions corresponding to the Gb and R pixels. Thus, the vertical resolution is enhanced in a 3D image and the R, G and B or three color outputs are obtained. Consequently, the present embodiment can produce a high-quality 3D color image.

If there are two types of parallax pixels as described above, parallax images from two viewpoints are obtained. However, varying numbers of types of parallax pixels can be employed in accordance with the number of desired output parallax images. Various repeating patterns 110 can be formed irrespective of whether the number of viewpoints increases. Thus, the repeating pattern 110 can be selected depending on the specification, purposes and the like.

When the repeating pattern shown in FIG. 18 is employed to form a pixel arrangement, the $G_N$ plane data, $R_N$ plane data and $B_N$ plane data are produced by interpolation based on calculation of the $G_N$, $R_N$ and $B_N$ pixel values for each pixel position. When the repeating pattern 110 shown in FIG. 7 is employed, interpolation is performed using the pixel values of adjacent pixels with or without one pixel placed therebetween as shown in FIG. 9. Here, a pixel group including a to-be-interpolated pixel at the center thereof and also including surrounding pixels used for the interpolation is defined as a kernel. The interpolation is performed in such a manner that the pixel values of the pixels having the same type of the color filters within the kernel are weighted in accordance with their distances from the marked pixel and the resulting pixel values are added together. The following describes in detail the interpolation for the no-parallax pixels when the repeating pattern shown in FIG. 18 is employed.

Figure 19A:
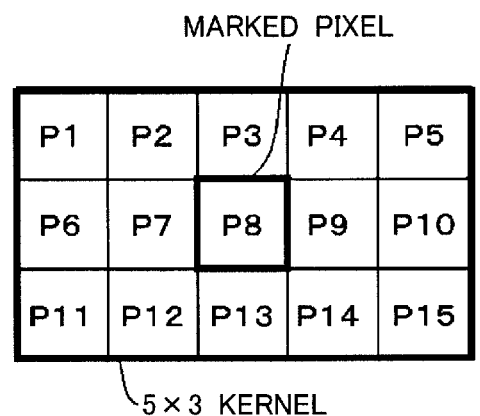
FIGS. 19A, 19B, 19C, 19D and 19E illustrate interpolation.

FIGS. 19A to 19E illustrate how to perform the interpolation. FIG. 19A shows a kernel formed by 5×3 pixels. The center of the kernel formed by 5×3 pixels is a marked pixel P8, and the pixel values of the 5×3 pixels in the kernel having the pixel P8 at its center are used to calculate the pixel values of the $R_N$, $G_N$ and $B_N$ pixels at the position of the marked pixel.

Figure 19B:
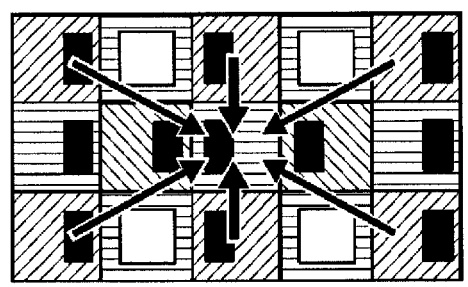

FIG. 19B shows the case where the marked pixel is a Gb pixel. The arrows in FIGS. 19B to 19E indicate the pixels used to calculate the pixel value $R_N$ and the large or small weights applied for the calculation. To be specific, as the width of the arrow increases, the weight value increases. The pixel value $R_N$ at the position of the Gb pixel is calculated after allocating weights to the pixel values of the R pixels in the kernel formed by 5×3 pixels according to their distances. To be specific, the pixel value $R_N$ can be calculated using the following Expression 31.

$$R_N = \frac{(P1 + P5 + P11 + P15)}{8} + \frac{(P3 + P13)}{4} \qquad \text{Expression 31}$$

In the same manner, the pixel values $G_N$ and $B_N$ at the position of the Gb pixel can be calculated using the following Expressions 32 and 33.

$$G_N = \frac{(P2 + P4 + P12 + P14)}{4} \qquad \text{Expression 32}$$

$$B_N = \frac{(P7 + P9)}{2} \qquad \text{Expression 33}$$

Figure 19C:
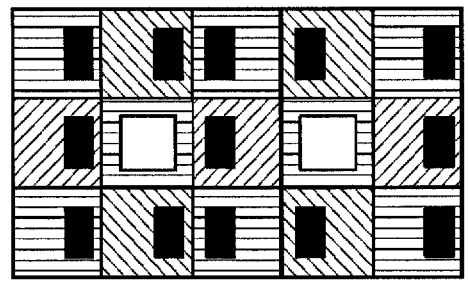

FIG. 19C shows the case where the marked pixel is an R pixel. In this case, the pixel values $R_N$, $G_N$ and $B_N$ at the position of the R pixel can be calculated using the following Expressions 34, 35 and 36.

$$R_N = \frac{(P6 + P10)}{4} + \frac{P8}{2} \qquad \text{Expression 34}$$

$$G_N = \frac{(P7 + P9)}{2} \qquad \text{Expression 35}$$

$$B_N = \frac{(P2 + P4 + P12 + P14)}{4} \qquad \text{Expression 36}$$

Figure 19D:
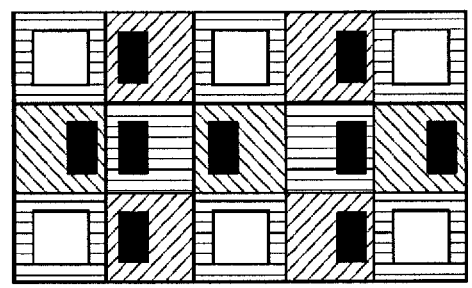

FIG. 19D shows the case where the marked pixel is a B pixel. In this case, the pixel values $R_N$, $G_N$ and $B_N$ at the position of the B pixel can be calculated using the following Expressions 37, 38 and 39.

$$R_N = \frac{(P2 + P4 + P12 + P14)}{4} \qquad \text{Expression 37}$$

$$G_N = \frac{(P1 + P3 + P5 + P11 + P13 + P15)}{6} \qquad \text{Expression 38}$$

$$B_N = \frac{(P6 + P10)}{4} + \frac{P8}{2} \qquad \text{Expression 39}$$

Figure 19E:
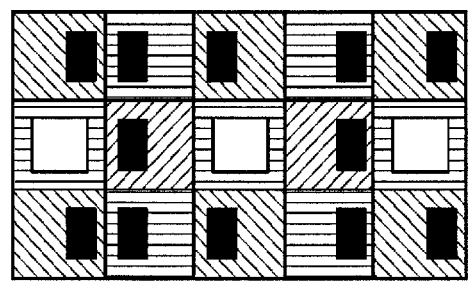
Figure 20A:
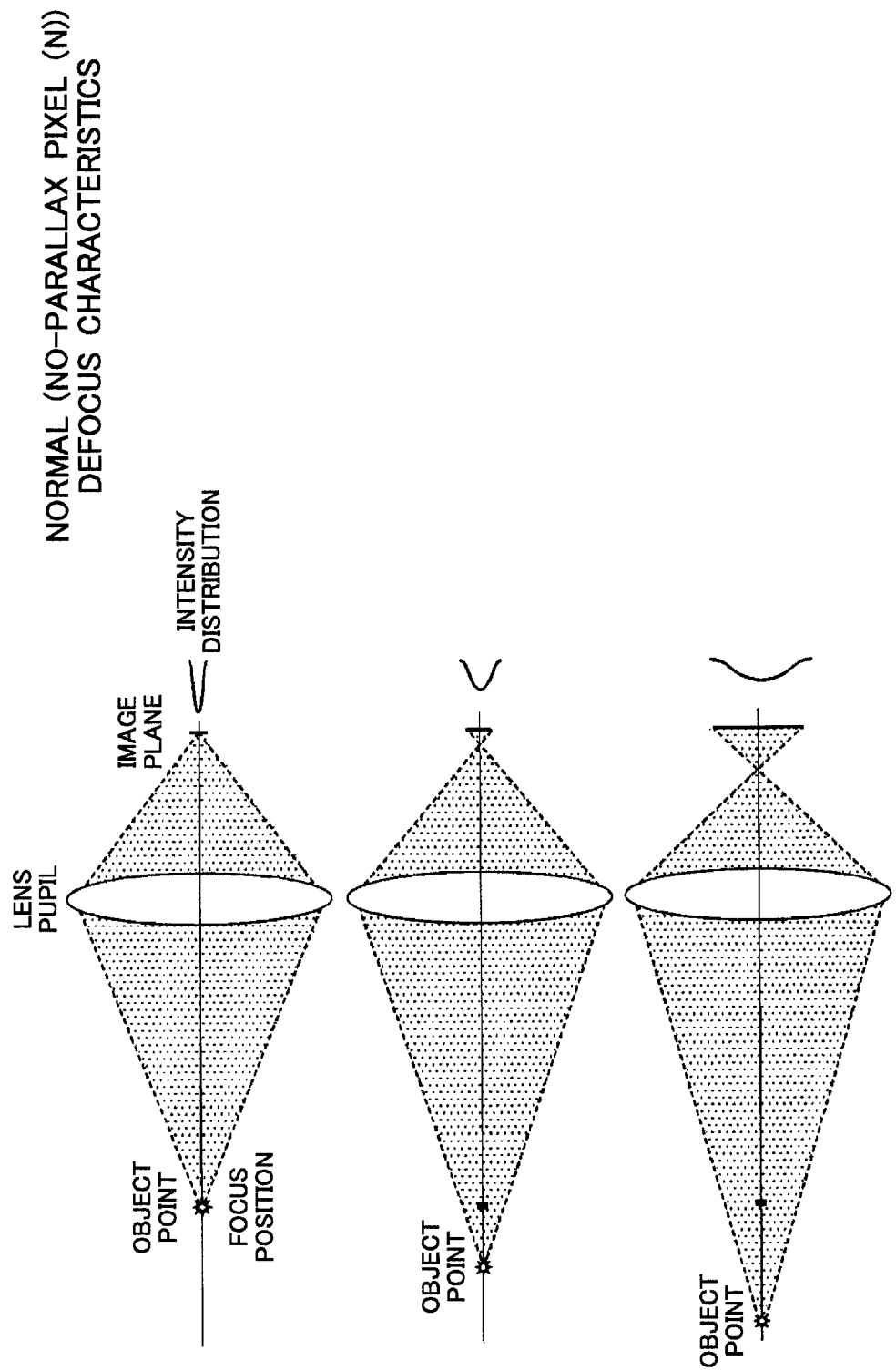
FIGS. 20A and 20B illustrate the concept of defocusing.
Figure 20B:
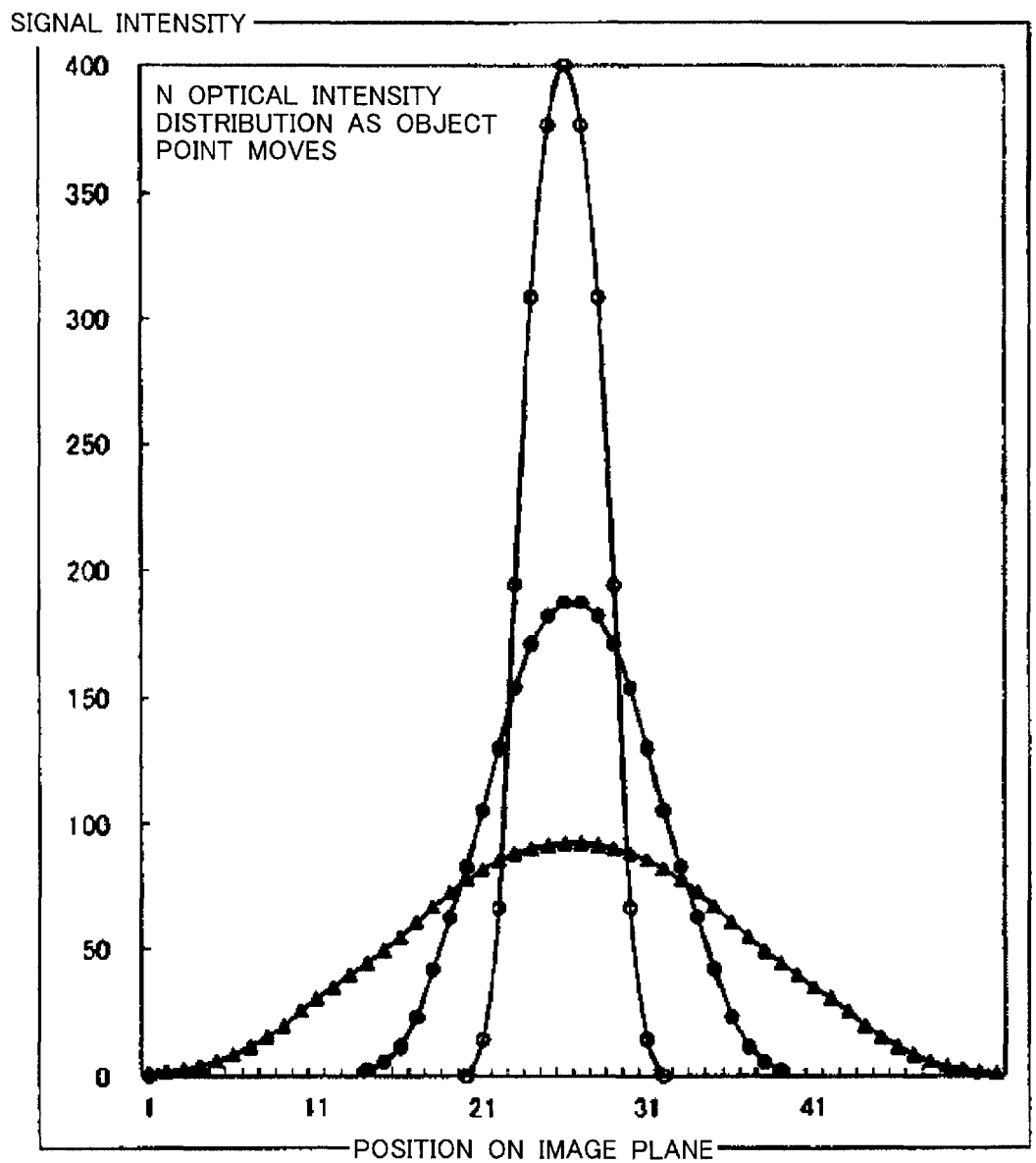
Figure 21A:
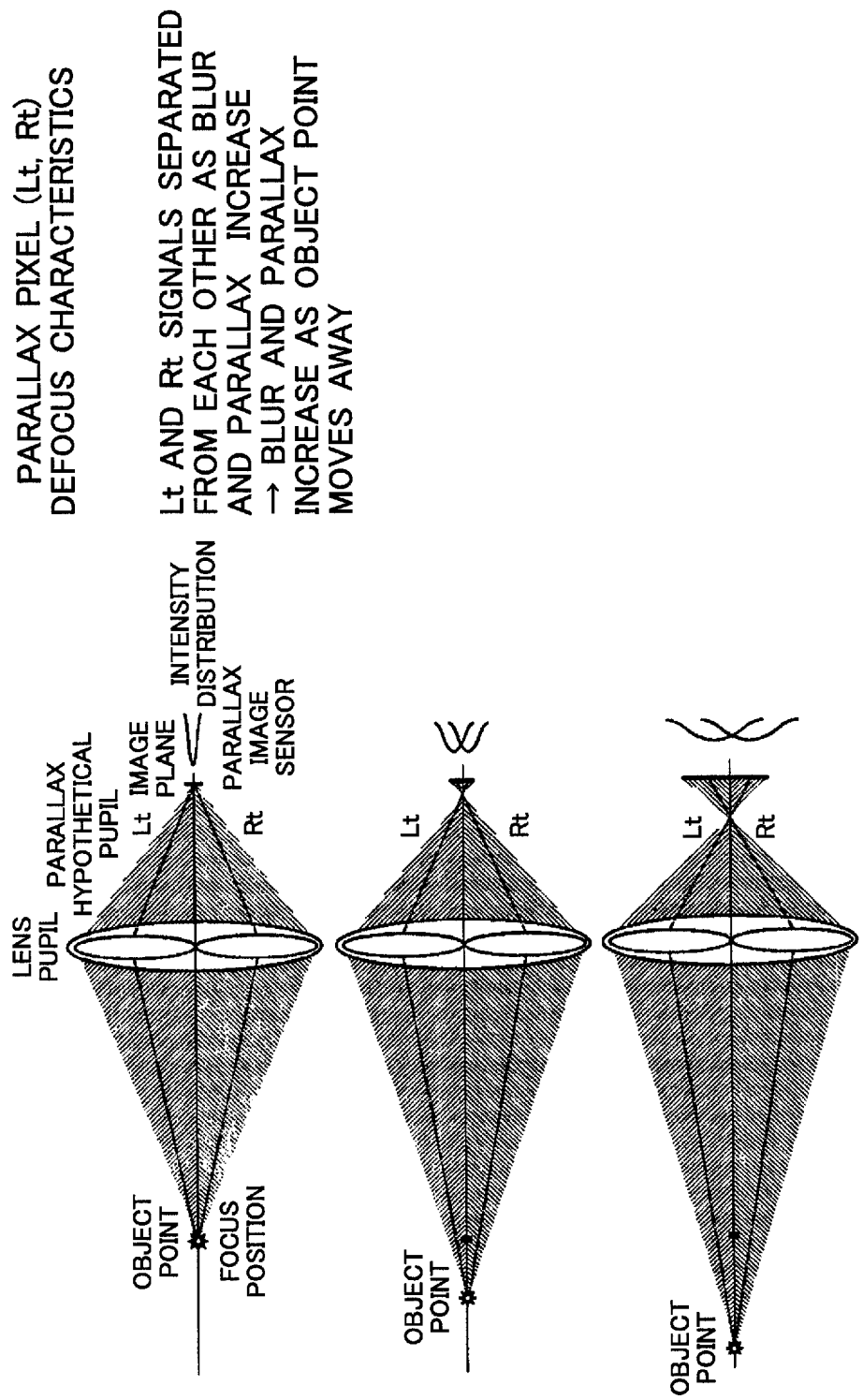
FIGS. 21A and 21B illustrate the concept of defocusing for a parallax pixel.
Figure 21B:
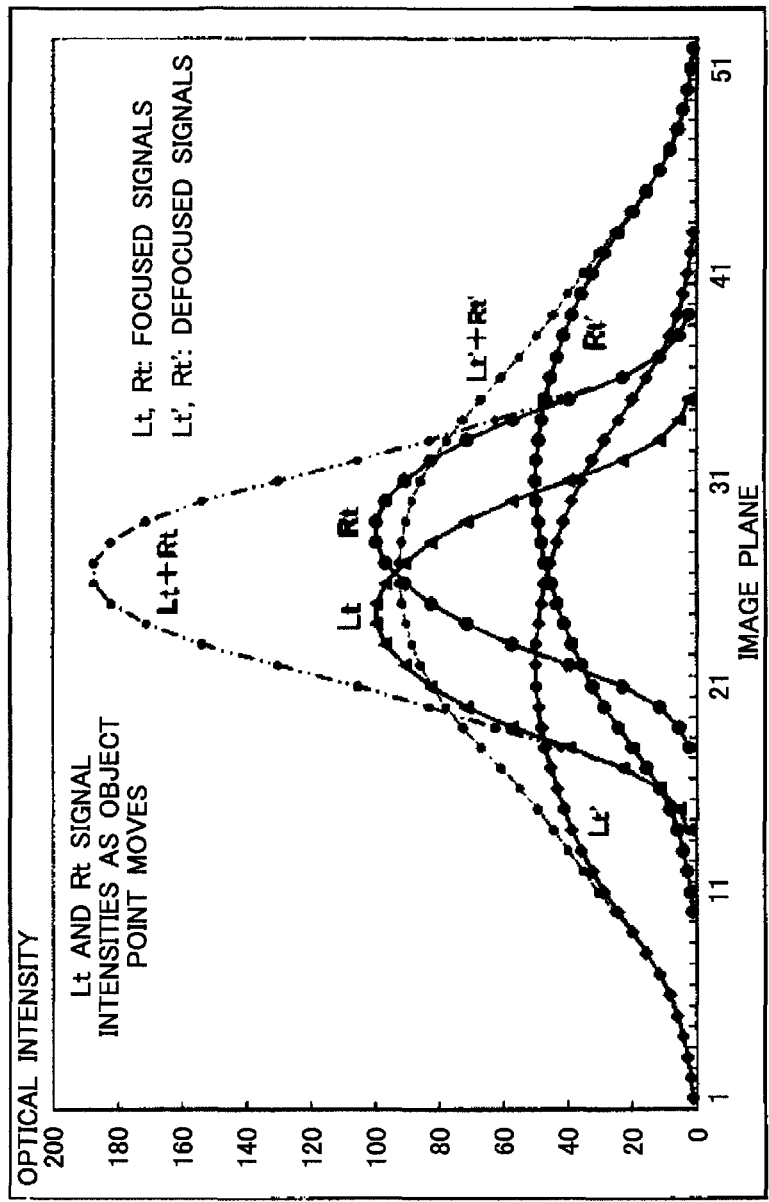

FIG. 19E shows the case where the marked pixel is a Gr pixel. In this case, the pixel values $R_N$, $G_N$ and $B_N$ at the position of the Gr pixel can be calculated using the following Expressions 40, 41 and 42.

$$R_N = \frac{(P7 + P9)}{2} \qquad \text{Expression 40}$$

$$G_N = \frac{(P6 + P8 + P10)}{3} \qquad \text{Expression 41}$$

$$B_N = \frac{(P1 + P5 + P11 + P15)}{8} + \frac{(P3 + P13)}{4} \qquad \text{Expression 42}$$

The above describes the cases where the marked pixel is the parallax Lt pixel. However, similar expressions can be used when the marked pixel is the parallax Rt pixel. By calculating the pixel values $G_N$, $R_N$ and $B_N$ at each of the pixel positions in the Bayer arrangement, the $G_N$ plane data, $R_N$ plane data and $B_N$ plane data can be produced. The $G_N$ plane data, $R_N$ plane data and $B_N$ plane data produced in this manner can undergo parallax modulation in the same manner as in the first to third embodiments.

In the above-described example, the Bayer arrangement is employed as the color filter arrangement. However, it goes without saying that other color filter arrangements can be used. Here, the parallax pixels forming a group of photoelectric converter elements may be provided with aperture masks 103 having openings 104 facing different partial regions from each other.

In the above description, the primary colors constituting a color subject image are three colors of red, green and blue. However, four or more primary colors may be used including emerald green. In addition, in place of red, green and blue, three complementary colors of yellow, magenta and cyan may be used as the three primary colors.

In the above description, for example, the operations of the pixel value extracting unit 231 and the calculating unit 233 of the image processor 205 are described as the functions of the components of the digital camera 10. The control program to cause the controller 201 and the image processor 205 to operate can cause the hardware components of the digital camera 10 to function as the components that perform the above-described operations. The above series of operations to produce color image data may not be performed by the digital camera 10 but by a device such as an external personal computer or the like. In this case, the device such as an external personal computer or the like functions as an image processing apparatus. The image processing apparatus acquires raw original image data and produces color image data, for example. The image processing apparatus performs the above-described plane separation, plane data interpolation when acquiring the raw original image data. Alternatively, the image processing apparatus may acquire plane data that has been subjected to interpolation by an image-capturing apparatus.

The following describes a modification example for the case where high-resolution left parallax images $R'L_{Lt}$, $G'L_{Lt}$ and $B'L_{Lt}$ and high-resolution right parallax images $R'_{Rt}$, $G'_{Rt}$ and $B'_{Rt}$ are produced by applying parallax modulation using low-resolution parallax images produced by parallax pixels that have a lower density than no-parallax pixels. For example, if the pixel values of the pixels are calculated to produce the high-resolution left parallax image $R'_{Lt}$ by simply adding together the amounts of parallax modulation for the R, G and B color components, the resulting values have exaggerated disparity levels compared to the actual disparity levels. To address this issue, since there are three or R, G and B color components, the weighting coefficients for the amounts of parallax modulation for the respective color components are set to ⅓ so that the sum of the weighting coefficients becomes equal to 1. Thus, the amounts of parallax modulation for the R, G and B color components are added together after they are multiplied by the corresponding weighting coefficients to obtain values matching the actual disparity levels. Furthermore, it is preferable to reflect the color distribution ratio among the parallax pixels shown in FIG. 22A in the weighting coefficients of the parallax modulation terms. Here, the parallax modulation terms indicate the term in which the difference in R pixel value between the left and right parallax images is multiplied by a proportionality factor, the term in which the difference in G pixel value between the left and right parallax images is multiplied by a proportionality factor and the term in which the difference in B pixel value between the left and right parallax images is multiplied by a proportionality factor. Since the color distribution ratio is R:G:B=1:2:1 in both of the left and right parallax pixels, the R parallax modulation term is multiplied by ¼, the G parallax modulation term is multiplied by ½, and the B parallax modulation term is multiplied by ¼. To be specific, the following expressions are used to calculate the high-resolution left parallax images $R'_{Lt}$, $G'_{Lt}$ and $B'_{Lt}$ and the high-resolution right parallax images $R'_{Rt}$, $G'_{Rt}$ and $B'_{Rt}$.

When the color distribution ratio in the parallax pixels shown in FIG. 22A is reflected in the weighting coefficients of the parallax modulation terms of the above-described Expressions 1 to 3, the following Expressions 43 to 45 are obtained.

$$G'_{Lt}(x, y) = G_N(x, y) + \frac{1}{4} \cdot \frac{R_{Lt}(x, y) - R_{Rt}(x, y)}{2} + \frac{1}{2} \cdot \frac{G_{Lt}(x, y) - G_{Rt}(x, y)}{2} + \frac{1}{4} \cdot \frac{B_{Lt}(x, y) - B_{Rt}(x, y)}{2}$$

Expression 43

$$B'_{Lt}(x, y) = B_N(x, y) + \frac{1}{4} \cdot \frac{R_{Lt}(x, y) - R_{Rt}(x, y)}{2} + \frac{1}{2} \cdot \frac{G_{Lt}(x, y) - G_{Rt}(x, y)}{2} + \frac{1}{4} \cdot \frac{B_{Lt}(x, y) - B_{Rt}(x, y)}{2}$$

Expression 44

$$R'_{Lt}(x, y) = R_N(x, y) + \frac{1}{4} \cdot \frac{R_{Lt}(x, y) - R_{Rt}(x, y)}{2} + \frac{1}{2} \cdot \frac{G_{Lt}(x, y) - G_{Rt}(x, y)}{2} + \frac{1}{4} \cdot \frac{B_{Lt}(x, y) - B_{Rt}(x, y)}{2}$$

Expression 45

Likewise, when the color distribution ratio in the parallax pixels shown in FIG. 22A is reflected in the weighting coefficients of the parallax modulation terms of the above-described Expressions 4 to 6, the following Expressions 46 to 48 are obtained.

$$G'_{Rt}(x, y) = G_N(x, y) + \frac{1}{4} \cdot \frac{R_{Rt}(x, y) - R_{Lt}(x, y)}{2} + \frac{1}{2} \cdot \frac{G_{Rt}(x, y) - G_{Lt}(x, y)}{2} + \frac{1}{4} \cdot \frac{B_{Rt}(x, y) - B_{Lt}(x, y)}{2}$$

Expression 46

$$B'_{Rt}(x, y) = B_N(x, y) + \frac{1}{4} \cdot \frac{R_{Rt}(x, y) - R_{Lt}(x, y)}{2} + \frac{1}{2} \cdot \frac{G_{Rt}(x, y) - G_{Lt}(x, y)}{2} + \frac{1}{4} \cdot \frac{B_{Rt}(x, y) - B_{Lt}(x, y)}{2}$$

Expression 47

$$R'_{Rt}(x, y) = R_N(x, y) + \frac{1}{4} \cdot \frac{R_{Rt}(x, y) - R_{Lt}(x, y)}{2} + \frac{1}{2} \cdot \frac{G_{Rt}(x, y) - G_{Lt}(x, y)}{2} + \frac{1}{4} \cdot \frac{B_{Rt}(x, y) - B_{Lt}(x, y)}{2}$$

Expression 48

When the color distribution ratio in the parallax pixels shown in FIG. 22A is reflected in the weighting coefficients of the parallax modulation terms of the above-described Expressions 7, 9 and 10, the following Expressions 49 to 51 are obtained. Here, the parallax modulation terms include the term indicating the fourth root of the ratio in R pixel value between the left and right parallax images, the term indicating the square root of the ratio in G pixel value between the left and right parallax images, and the term indicating the fourth root of the ratio in B pixel value between the left and right parallax images.

$$G'_{Lt}(x, y) = G_N(x, y) \sqrt[4]{\frac{R_{Lt}(x, y)}{\sqrt{R_{Lt}(x, y) \cdot R_{Rt}(x, y)}}} \sqrt{\frac{G_{Lt}(x, y)}{\sqrt{G_{Lt}(x, y) \cdot G_{Rt}(x, y)}}} \sqrt[4]{\frac{B_{Lt}(x, y)}{\sqrt{B_{Lt}(x, y) \cdot B_{Rt}(x, y)}}}$$

Expression 49

$$B'_{Lt}(x, y) = B_N(x, y) \sqrt[4]{\frac{R_{Lt}(x, y)}{\sqrt{R_{Lt}(x, y) \cdot R_{Rt}(x, y)}}} \sqrt{\frac{G_{Lt}(x, y)}{\sqrt{G_{Lt}(x, y) \cdot G_{Rt}(x, y)}}} \sqrt[4]{\frac{B_{Lt}(x, y)}{\sqrt{B_{Lt}(x, y) \cdot B_{Rt}(x, y)}}}$$

Expression 50

$$R'_{Lt}(x, y) = R_N(x, y) \sqrt[4]{\frac{R_{Lt}(x, y)}{\sqrt{R_{Lt}(x, y) \cdot R_{Rt}(x, y)}}} \sqrt{\frac{G_{Lt}(x, y)}{\sqrt{G_{Lt}(x, y) \cdot G_{Rt}(x, y)}}} \sqrt[4]{\frac{B_{Lt}(x, y)}{\sqrt{B_{Lt}(x, y) \cdot B_{Rt}(x, y)}}}$$

Expression 51

Expressions 49 to 51 are rewritten into the following Expressions 52 to 54.

$$G'_{Lt}(x, y) = G_N(x, y) \sqrt[4]{\sqrt{\frac{R_{Lt}(x, y)}{R_{Rt}(x, y)}}} \sqrt{\sqrt{\frac{G_{Lt}(x, y)}{G_{Rt}(x, y)}}} \sqrt[4]{\sqrt{\frac{B_{Lt}(x, y)}{B_{Rt}(x, y)}}}$$

Expression 52

$$B'_{Lt}(x, y) = B_N(x, y) \sqrt[4]{\sqrt{\frac{R_{Lt}(x, y)}{R_{Rt}(x, y)}}} \sqrt{\sqrt{\frac{G_{Lt}(x, y)}{G_{Rt}(x, y)}}} \sqrt[4]{\sqrt{\frac{B_{Lt}(x, y)}{B_{Rt}(x, y)}}}$$

Expression 53

$$R'_{Lt}(x, y) = R_N(x, y) \sqrt[4]{\sqrt{\frac{R_{Lt}(x, y)}{R_{Rt}(x, y)}}} \sqrt{\sqrt{\frac{G_{Lt}(x, y)}{G_{Rt}(x, y)}}} \sqrt[4]{\sqrt{\frac{B_{Lt}(x, y)}{B_{Rt}(x, y)}}}$$

Expression 54

Likewise, when the color distribution ratio in the parallax pixels shown in FIG. 22A is reflected in the weighting coefficients of the parallax modulation terms of the above-described Expressions 13 to 15, the following Expressions 55 to 57 are obtained.

$$G'_{Rt}(x, y) = G_N(x, y) \sqrt[4]{\frac{R_{Rt}(x, y)}{\sqrt{R_{Lt}(x, y) \cdot R_{Rt}(x, y)}}}$$ Expression 55

$$\sqrt{\sqrt{\frac{G_{Rt}(x, y)}{G_{Lt}(x, y) \cdot G_{Rt}(x, y)}}} \sqrt[4]{\sqrt{\frac{B_{Rt}(x, y)}{B_{Lt}(x, y) \cdot B_{Rt}(x, y)}}}$$

$$B'_{Rt}(x, y) = B_N(x, y) \sqrt[4]{\frac{R_{Rt}(x, y)}{\sqrt{R_{Lt}(x, y) \cdot R_{Rt}(x, y)}}}$$ Expression 56

$$\sqrt{\sqrt{\frac{G_{Rt}(x, y)}{G_{Lt}(x, y) \cdot G_{Rt}(x, y)}}} \sqrt[4]{\sqrt{\frac{B_{Rt}(x, y)}{B_{Lt}(x, y) \cdot B_{Rt}(x, y)}}}$$

$$R'_{Rt}(x, y) = R_N(x, y) \sqrt[4]{\frac{R_{Rt}(x, y)}{\sqrt{R_{Lt}(x, y) \cdot R_{Rt}(x, y)}}}$$ Expression 57

$$\sqrt{\sqrt{\frac{G_{Rt}(x, y)}{G_{Lt}(x, y) \cdot G_{Rt}(x, y)}}} \sqrt[4]{\sqrt{\frac{B_{Rt}(x, y)}{B_{Lt}(x, y) \cdot B_{Rt}(x, y)}}}$$

Expressions 55 to 57 are rewritten into the following Expressions 58 to 60.

$$G'_{Rt}(x, y) = G_N(x, y) \sqrt[4]{\sqrt{\frac{R_{Rt}(x, y)}{R_{Lt}(x, y)}}}$$ Expression 58

$$\sqrt{\sqrt{\frac{G_{Rt}(x, y)}{G_{Lt}(x, y)}}} \sqrt[4]{\sqrt{\frac{B_{Rt}(x, y)}{B_{Lt}(x, y)}}}$$

$$B'_{Rt}(x, y) = B_N(x, y) \sqrt[4]{\sqrt{\frac{R_{Rt}(x, y)}{R_{Lt}(x, y)}}}$$ Expression 59

$$\sqrt{\sqrt{\frac{G_{Rt}(x, y)}{G_{Lt}(x, y)}}} \sqrt[4]{\sqrt{\frac{B_{Rt}(x, y)}{B_{Lt}(x, y)}}}$$

$$R'_{Rt}(x, y) = R_N(x, y) \sqrt[4]{\sqrt{\frac{R_{Rt}(x, y)}{R_{Lt}(x, y)}}}$$ Expression 60

$$\sqrt{\sqrt{\frac{G_{Rt}(x, y)}{G_{Lt}(x, y)}}} \sqrt[4]{\sqrt{\frac{B_{Rt}(x, y)}{B_{Lt}(x, y)}}}$$

Likewise, when the color distribution ratio in the parallax pixels shown in FIG. 22A is reflected in the weighting coefficients of the parallax modulation terms of the above-described Expressions 19 to 24, the following Expressions 61 to 66 are obtained. Here, the parallax modulation terms include the term in which the R pixel value in the left or right parallax pixel is divided by the arithmetic average between the R pixel value in the left parallax pixel and the R pixel value in the right parallax pixel, the term in which the G pixel value in the left or right parallax pixel is divided by the arithmetic average between the G pixel value in the left parallax pixel and the G pixel value in the right parallax pixel, and the term in which the B pixel value in the left or right parallax pixel is divided by the arithmetic average between the B pixel value in the left parallax pixel and the B pixel value in the right parallax pixel.

$$G'_{Lt}(x, y) = G_N(x, y) \sqrt[4]{\frac{2R_{Lt}(x, y)}{R_{Lt}(x, y) \cdot R_{Rt}(x, y)}}$$ Expression 61

$$\sqrt{\frac{2G_{Lt}(x, y)}{G_{Lt}(x, y) \cdot G_{Rt}(x, y)}} \sqrt[4]{\frac{2B_{Lt}(x, y)}{B_{Lt}(x, y) \cdot B_{Rt}(x, y)}}$$

$$B'_{Lt}(x, y) = B_N(x, y) \sqrt[4]{\frac{2R_{Lt}(x, y)}{R_{Lt}(x, y) \cdot R_{Rt}(x, y)}}$$ Expression 62

$$\sqrt{\frac{2G_{Lt}(x, y)}{G_{Lt}(x, y) \cdot G_{Rt}(x, y)}} \sqrt[4]{\frac{2B_{Lt}(x, y)}{B_{Lt}(x, y) \cdot B_{Rt}(x, y)}}$$

$$R'_{Lt}(x, y) = R_N(x, y) \sqrt[4]{\frac{2R_{Lt}(x, y)}{R_{Lt}(x, y) \cdot R_{Rt}(x, y)}}$$ Expression 63

$$\sqrt{\frac{2G_{Lt}(x, y)}{G_{Lt}(x, y) \cdot G_{Rt}(x, y)}} \sqrt[4]{\frac{2B_{Lt}(x, y)}{B_{Lt}(x, y) \cdot B_{Rt}(x, y)}}$$

$$G'_{Rt} = G_N(x, y) \sqrt[4]{\frac{2R_{Rt}(x, y)}{R_{Lt}(x, y) + R_{Rt}(x, y)}}$$ Expression 64

$$\sqrt{\frac{2G_{Rt}(x, y)}{G_{Lt}(x, y) + G_{Rt}(x, y)}} \sqrt[4]{\frac{2B_{Rt}(x, y)}{B_{Lt}(x, y) \cdot B_{Rt}(x, y)}}$$

$$B'_{Rt} = B_N(x, y) \sqrt[4]{\frac{2R_{Rt}(x, y)}{R_{Lt}(x, y) + R_{Rt}(x, y)}}$$ Expression 65

$$\sqrt{\frac{2G_{Rt}(x, y)}{G_{Lt}(x, y) + G_{Rt}(x, y)}} \sqrt[4]{\frac{2B_{Rt}(x, y)}{B_{Lt}(x, y) \cdot B_{Rt}(x, y)}}$$

$$R'_{Rt} = R_N(x, y) \sqrt[4]{\frac{2R_{Rt}(x, y)}{R_{Lt}(x, y) + R_{Rt}(x, y)}}$$ Expression 66

$$\sqrt{\frac{2G_{Rt}(x, y)}{G_{Lt}(x, y) + G_{Rt}(x, y)}} \sqrt[4]{\frac{2B_{Rt}(x, y)}{B_{Lt}(x, y) \cdot B_{Rt}(x, y)}}$$

In the above description of the first to third embodiments, an example is described in which multicolor parallax modulation is applied without transforming the RGB color space. However, the application of the multicolor parallax modulation is still effective when the RGB color space is transformed into a different color system. The following describes such an example. For example, the parallax modulation is applied in the YCbCr space. In this case, the image processor 205 includes a transformation unit configured to transform, into the YCbCr space, the 2D color images $R_N$, $G_N$ and $B_N$, the low-resolution left parallax images $R_{Lt}$, $G_{Lt}$ and $B_{Lt}$ produced from the parallax Lt pixels having a low density, and the low-resolution right parallax images $R_{Rt}$, $G_{Rt}$ and $B_{Rt}$ produced from the parallax Rt pixels having a low density. The transformation unit then produces, for example, 2D color images $Y_N$, $Cb_N$ and $Cr_N$, low-resolution left parallax images $Y_{Lt}$, $Cb_{Lt}$ and $Cr_{Lt}$, and low-resolution right parallax images $Y_{Rt}$, $Cb_{Rt}$ and $Cr_{Rt}$. This processing is described in detail in the following with reference to, for example, the parallax modulation described in the first embodiment where the differences are kept constant. Note that the parallax modulation in the YCbCr space can be applied in the same manner in the second and third embodiments.

The calculating unit 233 multiplies, with a proportionality factor, the difference between the luminance value $Y_{Lt}(x_m, y_n)$ and the luminance value $Y_{Rt}(x_m, y_n)$, the difference between the color difference $Cb_{Lt}(x_m, y_n)$ and the color difference $Cb_{Rt}(x_m, y_n)$, and the difference between the color difference $Cr_{Lt}(x_m, y_n)$ and the color difference $Cr_{Rt}(x_m, y_n)$ and adds together the results of the multiplications. The resulting value is added to $Y_N(x_m, y_n)$, or parallax modulation is performed, so that the luminance value $Y'_{Lt}(x_m, y_n)$ is calculated. In other words, the calculating unit 233 calculates the luminance value $Y'_{Lt}(x_m, y_n)$ in such a manner that the difference between the luminance value $Y'_{Lt}(x_m, y_n)$ and the luminance value $Y_N(x_m, y_n)$ maintains correlation with the value obtained by multiplying, with the proportionality factor, the differences between the left and right parallax images for the Y, Cb and Cr components and adding together the results of the multiplications. The calculating unit 233 calculates the color difference $Cb'_{Rt}(x_m, y_n)$ and the color difference $Cr'_{Lt}(x_m, y_n)$ in the same manner. The calculating unit 233 calculates the luminance value for the right viewpoint $Y'_{Rt}(x_m, y_n)$, the color difference for the right viewpoint $Cb'_{Rt}(x_m, y_n)$, and the color difference for the right viewpoint $Cr'_{Rt}(x_m, y_n)$ in the same manner. To be specific, the calculating unit 233 uses the following expressions for the calculations.

Left Parallax Modulation $$Y'_{Lt}(x, y) = Y_N(x, y) + \alpha_Y \cdot \frac{Y_{Lt}(x, y) - Y_{Rt}(x, y)}{2} +$$
$$\beta_Y \cdot \frac{Cb_{Lt}(x, y) - Cb_{Rt}(x, y)}{2} + \gamma_Y \cdot \frac{Cr_{Lt}(x, y) - Cr_{Rt}(x, y)}{2}$$

$$Cb'_{Lt}(x, y) = Cb_N(x, y) + \alpha_{Cb} \cdot \frac{Y_{Lt}(x, y) - Y_{Rt}(x, y)}{2} +$$
$$\beta_{Cb} \cdot \frac{Cb_{Lt}(x, y) - Cb_{Rt}(x, y)}{2} + \gamma_{Cb} \cdot \frac{Cr_{Lt}(x, y) - Cr_{Rt}(x, y)}{2}$$

$$Cr'_{Lt}(x, y) = Cr_N(x, y) + \alpha_{Cr} \cdot \frac{Y_{Lt}(x, y) - Y_{Rt}(x, y)}{2} +$$
$$\beta_{Cr} \cdot \frac{Cb_{Lt}(x, y) - Cb_{Rt}(x, y)}{2} + \gamma_{Cr} \cdot \frac{Cr_{Lt}(x, y) - Cr_{Rt}(x, y)}{2}$$

Right Parallax Modulation $$Y'_{Rt}(x, y) = Y_N(x, y) + \alpha_Y \cdot \frac{Y_{Rt}(x, y) - Y_{Lt}(x, y)}{2} +$$
$$\beta_Y \cdot \frac{Cb_{Rt}(x, y) - Cb_{Lt}(x, y)}{2} + \gamma_Y \cdot \frac{Cr_{Rt}(x, y) - Cr_{Lt}(x, y)}{2}$$

$$Cb'_{Rt}(x, y) = Cb_N(x, y) + \alpha_{Cb} \cdot \frac{Y_{Rt}(x, y) - Y_{Lt}(x, y)}{2} +$$
$$\beta_{Cb} \cdot \frac{Cb_{Rt}(x, y) - Cb_{Lt}(x, y)}{2} + \gamma_{Cb} \cdot \frac{Cr_{Rt}(x, y) - Cr_{Lt}(x, y)}{2}$$

$$Cr'_{Rt}(x, y) = Cr_N(x, y) + \alpha_{Cr} \cdot \frac{Y_{Rt}(x, y) - Y_{Lt}(x, y)}{2} +$$
$$\beta_{Cr} \cdot \frac{Cb_{Rt}(x, y) - Cb_{Lt}(x, y)}{2} + \gamma_{Cr} \cdot \frac{Cr_{Rt}(x, y) - Cr_{Lt}(x, y)}{2}$$

It should be noted that the following relations are true.

$\alpha_Y + \beta_Y + \gamma_Y = 1$, $\alpha_Y, \beta_Y, \gamma_Y \geq 0$ $\alpha_{Cb} + \beta_{Cb} + \gamma_{Cb} = 1$, $\alpha_{Cb}, \beta_{Cb}, \gamma_{Cb} \geq 0$ $\alpha_{Cr} + \beta_{Cr} + \gamma_{Cr} = 1$, $\alpha_{Cr}, \beta_{Cr}, \gamma_{Cr} \geq 0$ The variables $\alpha_Y, \beta_Y, \gamma_Y, \alpha_{Cb}, \beta_{Cb}, Y_{Cb}, \alpha_{Cr}, \beta_{Cr}$ and $y_{Cr}$ can be represented by a 3×3 matrix as shown below.

| αY | βY | γY |
|---|---|---|
| αCb | βCb | γCb |
| αCr | βCr | γCr |

When the sampling ratio between the luminance value Y, the color difference Cb and the color difference Cr is 4:4:4, every pixel has the luminance value Y, the color difference Cb and the color difference Cr. Therefore, the variables $\alpha_Y$, $\beta_Y$, $Y_Y$, $\alpha_{Cb}$, $\beta_{Cb}$, $\gamma_{Cb}$, $\alpha_{Cr}$, $\beta_{Cr}$ and $\gamma_{Cr}$ may be all set to ⅓ as shown below.

| ⅓ | ⅓ | ⅓ |
|---|---|---|
| ⅓ | ⅓ | ⅓ |
| ⅓ | ⅓ | 1/3 |

Alternatively, as shown below, the variables $\alpha_Y$, $\beta_{Cb}$, and $\gamma_{Cr}$ are set to 1 and the other variables may be set to 0. In this case, for example, the luminance value $Y'_{Lt}(x_m, y_n)$ is calculated without using the color difference Cb and the color difference Cr but using the difference between the luminance value $Y_{Lt}(x_m, y_n)$ and the luminance value $Y_{Rt}(x_m, y_n)$ and $Y_N(x_m, y_n)$.

| 1 | 0 | 0 |
|---|---|---|
| 0 | 1 | 0 |
| 0 | 0 | 1 |

When the sampling ratio between the luminance value Y, the color difference Cb and the color difference Cr is 4:2:2 or 4:2:0, the density ratio between the luminance value Y, the color difference Cb and the color difference Cr may be additionally considered. Specifically speaking, as the color differences Cb and Cr are discarded, the ratio of the luminance value Y increases.

The following states the effects of the multicolor parallax modulation on the image quality with reference to the facts proved by experiments. A case is assumed where the parallax modulation is performed using a single color component only, instead of all of the three color components. If such is the case, it has been found that parallax cannot be successfully caused in subject images having color boundaries and that excessively large or small parallax displacement may cause color floating or color sinking in stereoscopic images. In particular, a red floating phenomenon is extremely significantly observed in which a red subject appears to be floating. Furthermore, it has been found that a similar phenomenon may occur when single-color parallax modulation is performed on an image captured by using an optical system including a lens of significant axial chromatic aberration during stereoscopic image producing process. On the other hand, the multicolor parallax modulation can almost completely prevent these phenomena and thus can produce extremely significant effects on image quality improvement. This is because, when the multicolor parallax modulation is employed, excessively large parallax displacement caused by a particular color component at color boundaries may be often offset by excessively small parallax displacement caused by a different color component. In other words, the multicolor parallax modulation actually has a mechanism to achieve appropriate parallax displacement by the offsetting. Referring to the axial chromatic aberration, when the three color components are used, large-blur and small-blur color components are mixed and the blur amounts of the three different color components are averaged during the parallax modulation. Since there is a relation between the amount of blur and the disparity in the monocular stereoscopic image-capturing scheme, the axial chromatic aberration of the lens normally causes color floating and color sinking By employing the multicolor parallax modulation, however, the different degrees of blur for the respective color components are averaged out, which effectively also removes color floating or color sinking.

The relation between the above-described problems posed by the single-color parallax modulation and the above-described solutions provided by the multicolor parallax modulation in the monocular stereoscopic image-capturing scheme can be similar to the relation between, for example, the problems posed by the single-color extrapolation to perform color interpolation for the Bayer arrangement and the solutions provided by the multicolor extrapolation in the 2D image-capturing scheme. The single-color extrapolation calculates an interpolation value to interpolate a G component pixel value at the R component pixel position of the Bayer arrangement by correcting the average value of the pixel values of the surrounding G pixels with an extrapolation term including the difference between the pixel value of the center R pixel and the average value of the pixel values of the surrounding R pixels, as disclosed in, for example, U.S. Pat. No. 5,541,653. Such single-color extrapolation may cause overshoots due to excessive correction at color boundaries and causes blocking phenomena when magnification chromatic aberration is manifested as described in detail in U.S. Pat. No. 7,236,628 invented by the same inventor as the present application. This patent document discloses that these problems are all solved by multicolor extrapolation correction. Accordingly, the multicolor extrapolation correction for the 2D image demosaicking is equivalent to the multicolor parallax modulation for the 3D stereo image production. Thus, the multicolor extrapolation correction and the multicolor parallax modulation both effectively produce complementary and offsetting effects at color boundaries, and the effect of reducing the influences of the magnification chromatic aberration during the 2D image production appears as the effects of reducing the influences of the axial chromatic aberration during the 3D image production. In the above, the term "multicolor" means that a plurality of color components are used.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An image processing apparatus comprising:
a processor configured to:
from first-viewpoint color image data corresponding to a first viewpoint, extract a pixel value of a particular color at a target pixel position of the first-viewpoint color image data, the particular color corresponding to one of n (n≥2) color components forming a color of a subject image, the first viewpoint being one of a plurality of viewpoints from which the subject image is captured,
from second-viewpoint color image data corresponding to a second viewpoint different from the first viewpoint and third-viewpoint color image data corresponding to a third viewpoint different from the first viewpoint, extract pixel values of at least first and second color components at the target pixel position of the second-viewpoint color image data and extract pixel values of at least the first and second color components at the target pixel position of the third-viewpoint color image data, and
calculate a new pixel value of the particular color of the second-viewpoint color image data in such a manner that a difference between the new pixel value of the particular color of the second viewpoint and the pixel value of the particular color of the first-viewpoint color image data maintains correlation with a sum of at least (i) a difference between the pixel value of the first color component of the second-viewpoint color image data and the pixel value of the first color component of the third-viewpoint color image data and (ii) a difference between the pixel value of the second color component of the second-viewpoint color image data and the pixel value of the second color component of the third-viewpoint color image data.

2. The image processing apparatus as set forth in claim 1, wherein the processor is further configured to
calculate the new pixel value of the particular color of the second-viewpoint color image data in such a manner that the difference between the new pixel value of the particular color of the second viewpoint and the pixel value of the particular color of the first-viewpoint color image data is in proportion to a sum of at least (i) the difference between the pixel value of the first color component of the second-viewpoint color image data and the pixel value of the first color component of the third-viewpoint color image data and (ii) the difference between the pixel value of the second color component of the second-viewpoint color image data and the pixel value of the second color component of the third-viewpoint color image data.

3. The image processing apparatus as set forth in claim 1, wherein
the first viewpoint is a viewpoint between the second viewpoint and the third viewpoint.

4. The image processing apparatus as set forth in claim 1, wherein
each of the pixel values of the first-, second- and third-viewpoint color image data is a value resulting from gamma transformation.

5. The image processing apparatus as set forth in claim 1, wherein the processor is further configured to
produce new color image data of the second viewpoint while sequentially changing the particular color so that the new color image data of the second viewpoint is prepared for all of the n color components.

6. An image processing apparatus comprising:
a processor configured to:
from first-viewpoint color image data corresponding to a first viewpoint, extract a pixel value of a particular color at a target pixel position of the first-viewpoint color image data, the particular color corresponding to one of n (n≥2) color components forming a color of a subject image, the first viewpoint being one of a plurality of viewpoints from which the subject image is captured;

from second-viewpoint color image data corresponding to a second viewpoint different from the first viewpoint and third-viewpoint color image data corresponding to a third viewpoint different from the first viewpoint, extract pixel values of at least first and second color components at the target pixel position of the second-viewpoint color image data and extract pixel values of at least the first and second color components at the target pixel position of the third-viewpoint color image data; and calculate a new pixel value of the particular color of the second-viewpoint color image data in such a manner that a ratio between the new pixel value of the particular color of the second viewpoint and the pixel value of the particular color of the first-viewpoint color image data maintains correlation with a product of at least two ratios of (i) a ratio defined by the pixel value of the first color component of the second-viewpoint color image data and the pixel value of the first color component of the third-viewpoint color image data and (ii) a ratio defined by the pixel value of the second color component of the second-viewpoint color image data and the pixel value of the second color component of the third-viewpoint color image data.

7. The image processing apparatus as set forth in claim 6, wherein the processor is further configured to calculate the new pixel value of the particular color of the second-viewpoint color image data in such a manner that the ratio between the new pixel value of the particular color of the second viewpoint and the pixel value of the particular color of the first-viewpoint color image data is in proportion to a product of at least (i) a square root of the ratio between the pixel value of the first color component of the second-viewpoint color image data and the pixel value of the first color component of the third-viewpoint color image data and (ii) a square root of the ratio between the pixel value of the second color component of the second-viewpoint color image data and the pixel value of the second color component of the third-viewpoint color image data.

8. The image processing apparatus as set forth in claim 6, wherein the processor is further configured to calculate the new pixel value of the particular color of the second-viewpoint color image data in such a manner that the ratio between the new pixel value of the particular color of the second viewpoint and the pixel value of the particular color of the first-viewpoint color image data is in proportion to a product of at least (i) a ratio between the pixel value of the first color component of the second-viewpoint color image data and a sum of the pixel value of the first color component of the third-viewpoint color image data and a pixel value of the first color component of the second-viewpoint color image data and (ii) a ratio between the pixel value of the second color component of the second-viewpoint color image data and a sum of the pixel value of the second color component of the third-viewpoint color image data and the pixel value of the second color component of the second-viewpoint color image data.

9. The image processing apparatus as set forth in claim 6, wherein each of the pixel values of the first-, second- and third-viewpoint color image data is a linear gray level value in proportion to an amount of received light.

10. An image-capturing apparatus comprising:
an image sensor configured to capture a subject image; and
the image processing apparatus as set forth in claim 1,
wherein the processor is further configured to:
extract a pixel value of the particular color from color image data that is output from the image sensor and has a pixel value of the particular color corresponding to the first viewpoint, and
extract pixel values of the first color component and pixel values of the second color component from color image data that is output from the image sensor and has pixel values of the first color component and pixel values of the second color component corresponding to the second viewpoint and the third viewpoint.

11. A non-transitory storage medium having an image processing program stored thereon, the image processing program causing a computer to perform procedures of:

from first-viewpoint color image data corresponding to a first viewpoint, extracting a pixel value of a particular color at a target pixel position of the first-viewpoint color image data, the particular color corresponding to one of n (n≥2) color components forming a color of a subject image, the first viewpoint being one of a plurality of viewpoints from which the subject image is captured;

from second-viewpoint color image data corresponding to a second viewpoint different from the first viewpoint and third-viewpoint color image data corresponding to a third viewpoint different from the first viewpoint, extracting pixel values of at least first and second color components at the target pixel position of the second-viewpoint color image data and extracting pixel values of at least the first and second color components at the target pixel position of the third-viewpoint color image data; and calculating a new pixel value of the particular color of the second-viewpoint color image data in such a manner that a difference between the new pixel value of the particular color of the second viewpoint and the pixel value of the particular color of the first-viewpoint color image data maintains correlation with a sum of at least (i) a difference between the pixel value of the first color component of the second-viewpoint color image data and the pixel value of the first color component of the third-viewpoint color image data and (ii) a difference between the pixel value of the second color component of the second-viewpoint color image data and the pixel value of the second color component of the third-viewpoint color image data.

12. A non-transitory storage medium having an image processing program stored thereon, the image processing program causing a computer to perform procedures of:

from first-viewpoint color image data corresponding to a first viewpoint, extracting a pixel value of a particular color at a target pixel position of the first-viewpoint color image data, the particular color corresponding to one of n (n≥2) color components forming a color of a subject image, the first viewpoint being one of a plurality of viewpoints from which the subject image is captured;

from second-viewpoint color image data corresponding to a second viewpoint different from the first viewpoint and third-viewpoint color image data corresponding to a third viewpoint different from the first viewpoint, extracting pixel values of at least first and second color components at the target pixel position of the second-viewpoint color image data and extracting pixel values of at least the first and second color components at the target pixel position of the third-viewpoint color image data; and calculating a new pixel value of the particular color of the second-viewpoint color image data in such a manner that a ratio between the new pixel value of the particular color of the second viewpoint and the pixel value of the particular color of the first-viewpoint color image data maintains correlation with a product of at least two ratios of (i) a ratio defined by the pixel value of the first color component of the second-viewpoint color image data and the pixel value of the first color component of the third-viewpoint color image data and (ii) a ratio defined by the pixel value of the second color component of the second-viewpoint color image data and the pixel value of the second color component of the third-viewpoint color image data.

13. An image processing apparatus comprising:
a processor configured to:
    extract, from color image data having a 1X pixel value corresponding to a first viewpoint for a X component color, the 1X pixel value at a target pixel position, the X component color being one of a plurality of color components forming a color of a subject image, the first viewpoint being one of a plurality of viewpoints from which the subject image is captured,
    extract, from color image data having a 2A pixel value corresponding to a second viewpoint and color image data having a 3A pixel value corresponding to a third viewpoint for a A component color, the 2A pixel value and the 3A pixel value at the target pixel position, the A component color being one of the plurality of color components, and the second and third viewpoints being different from the first viewpoint,
    extract, from color image data having a 2B pixel value corresponding to the second viewpoint and color image data having a 3B pixel value corresponding to the third viewpoint for a B component color, the 2B pixel value and the 3B pixel value at the target pixel position, the B component color being one of the plurality of color components and different from the A component color, and
    calculate at least one of a 2X pixel value of the second viewpoint for the X component color and a 3X pixel value of the third viewpoint for the X component color in such a manner that a difference between the 2X pixel value or the 3X pixel value and the 1X pixel value maintains correlation with a value obtained by adding together a difference between the 2A pixel value and the 3A pixel value and a difference between the 2B pixel value and the 3B pixel value.

14. The image processing apparatus as set forth in claim 13, wherein the processor is further configured to
calculate at least one of the 2X pixel value and the 3X pixel value in such a manner that the difference between the 2X pixel value or the 3X pixel value and the 1X pixel value is in proportion to the value obtained by adding together the difference between the 2A pixel value and the 3A pixel value and the difference between the 2B pixel value and the 3B pixel value.

15. The image processing apparatus as set forth in claim 13, wherein the first viewpoint is a viewpoint between the second viewpoint and the third viewpoint.

16. The image processing apparatus as set forth in claim 13, wherein
each of the pixel values of the color image data is a value resulting from gamma transformation.

17. The image processing apparatus as set forth in claim 13, wherein the processor is further configured to
produce the color image data of the X component color corresponding to at least one of the second viewpoint and the third viewpoint by sequentially moving the target pixel position in an image region in the color image data and using a plurality of pixel values calculated by the processor.

18. The image processing apparatus as set forth in claim 17, wherein the processor is further configured to
produce the color image data by changing the X component color among the plurality of color components so that the color image data of the second viewpoint and the color image data of the third viewpoint are prepared for all of the plurality of color components.

19. The image processing apparatus as set forth in claim 13, wherein
the X component color is the same as the A component color.

20. An image processing apparatus comprising:
a processor configured to:
    extract, from color image data having a 1X pixel value corresponding to a first viewpoint for a X component color, the 1X pixel value at a target pixel position, the X component color being one of a plurality of color components forming a color of a subject image, the first viewpoint being one of a plurality of viewpoints from which the subject image is captured,
    extract, from color image data having a 2A pixel value corresponding to a second viewpoint and color image data having a 3A pixel value corresponding to a third viewpoint for a A component color, the 2A pixel value and the 3A pixel value at the target pixel position, the A component color being one of the plurality of color components, and the second and third viewpoints being different from the first viewpoint,
    extract, from color image data having a 2B pixel value corresponding to the second viewpoint and color image data having a 3B pixel value corresponding to the third viewpoint for a B component color, the 2B pixel value and the 3B pixel value at the target pixel position, the B component color being one of the plurality of color components and different from the A component color, and
    calculate at least one of a 2X pixel value of the second viewpoint for the X component color and a 3X pixel value of the third viewpoint for the X component color in such a manner that a ratio between the 2X pixel value or the 3X pixel value and the 1X pixel value maintains correlation with a value obtained by multiplying together a ratio defined by the 2A pixel value and the 3A pixel value and a ratio defined by the 2B pixel value and the 3B pixel value.

21. The image processing apparatus as set forth in claim 20, wherein the processor is further configured to
calculate at least one of the 2X pixel value and the 3X pixel value in such a manner that the ratio between the 2X pixel value or the 3X pixel value and the 1X pixel value is in proportion to a value obtained by multiplying together a geometric average between the 2A pixel value and the 3A pixel value and a geometric averages between the 2B pixel value and the 3B pixel value.

22. The image processing apparatus as set forth in claim 20, wherein the processor is further configured to
calculate at least one of the 2X pixel value and the 3X pixel value in such a manner that the ratio between the 2X pixel value or the 3X pixel value and the 1X pixel value is in proportion to a value obtained by multiplying together an arithmetic average between the 2A pixel value and the 3A pixel value and an arithmetic average between the 2B pixel value and the 3B pixel value.

23. An image-capturing apparatus comprising:
an image sensor configured to capture a subject image; and
the image processing apparatus as set forth in claim 13, wherein the processor is further configured to
extract the 1X pixel value that is output from the image sensor, from the color image data that has the 1X pixel value corresponding to the first viewpoint, and extracts the 2A pixel value and the 3A pixel value that are output from the image sensor, from the color image data that has the 2A pixel value corresponding to the second viewpoint and the color image data that has the 3A pixel value corresponding to the third viewpoint.

24. A non-transitory storage medium having an image processing program stored thereon, the image processing program causing a computer to perform procedures of:
extracting, from color image data having a 1X pixel value corresponding to a first viewpoint for a X component color, the 1X pixel value at a target pixel position, the X component color being one of a plurality of color components forming a color of a subject image, the first viewpoint being one of a plurality of viewpoints from which the subject image is captured;
extracting, from color image data having a 2A pixel value corresponding to a second viewpoint and color image data having a 3A pixel value corresponding to a third viewpoint for a A component color, the 2A pixel value at the target pixel position and the 3A pixel value at the target pixel position, the A component color being one of the plurality of color components, and the second and third viewpoints being different from the first viewpoint, and extracting, from color image data having a 2B pixel value corresponding to the second viewpoint for a B component color and color image data having a 3B pixel value corresponding to the third viewpoint for the B component color, the 2B pixel value at the target pixel position and the 3B pixel value at the target pixel position, the B component color being one of the plurality of color components and different from the A component color; and
calculating at least one of a 2X pixel value of the second viewpoint for the X component color and a 3X pixel value of the third viewpoint for the X component color in such a manner that a difference between the 2X pixel value or the 3X pixel value and the 1X pixel value maintains correlation with a value obtained by adding together a difference between the 2A pixel value and the 3A pixel value and a difference between the 2B pixel value and the 3B pixel value.

25. A non-transitory storage medium having an image processing program stored thereon, the image processing program causing a computer to perform procedures of:
extracting, from color image data having a 1X pixel value corresponding to a first viewpoint for a X component color, the 1X pixel value at a target pixel position, the X component color being one of a plurality of color components forming a color of a subject image, the first viewpoint being one of a plurality of viewpoints from which the subject image is captured;
extracting, from color image data having a 2A pixel value corresponding to a second viewpoint and color image data having a 3A pixel value corresponding to a third viewpoint for a A component color, the 2A pixel value and the 3A pixel value at the target pixel position, the A component color being one of the plurality of color components, and the second and third viewpoints being different from the first viewpoint, and extracting, from color image data having a 2B pixel value corresponding to the second viewpoint and color image data having a 3B pixel value corresponding to the third viewpoint for a B component color, the 2B pixel value and the 3B pixel value at the target pixel position, the B component color being one of the plurality of color components and different from the A component color; and
calculating at least one of a 2X pixel value of the second viewpoint for the X component color and a 3X pixel value of the third viewpoint for the X component color in such a manner that a ratio between the 2X pixel value or the 3X pixel value and the 1X pixel value maintains correlation with a value obtained by multiplying together a ratio defined by the 2A pixel value and the 3A pixel value and a ratio defined by the 2B pixel value and the 3B pixel value.

26. An image processing apparatus comprising:
a processor configured to:
extract, from color image data having a 1X pixel value corresponding to a first viewpoint for a X component color, the 1X pixel value at a target pixel position, the X component color being one of a plurality of color components forming a color of a subject image, the first viewpoint being one of a plurality of viewpoints from which the subject image is captured,
extract, from color image data having a 2A pixel value corresponding to a second viewpoint and color image data having a 3A pixel value corresponding to a third viewpoint for a A component color, the 2A pixel value and the 3A pixel value at the target pixel position, the A component color being one of the plurality of color components, and the second and third viewpoints being different from the first viewpoint,
extract, from color image data having a 2B pixel value corresponding to the second viewpoint and color image data having a 3B pixel value corresponding to the third viewpoint for a B component color, the 2B pixel value and the 3B pixel value at the target pixel position, the B component color being one of the plurality of color components and different from the A component color,
convert a color space represented by a combination of the X component color, the A component color and the B component color into a YCbCr space, and
calculate at least one of a luminance value Y of the second viewpoint and a luminance value Y of the third viewpoint in such a manner that a difference between the luminance value Y of the second viewpoint or the luminance value Y of the third viewpoint and a luminance value Y of the first viewpoint maintains correlation with a value obtained by adding together a difference between a color difference Cb of the second viewpoint and a color difference Cb of the third viewpoint and a difference between a color difference Cr of the second viewpoint and a color difference Cr of the third viewpoint.

* * * * *